United States Patent [19]
Nakagawa et al.

[11] Patent Number: 5,985,708
[45] Date of Patent: *Nov. 16, 1999

[54] METHOD OF MANUFACTURING VERTICAL POWER DEVICE

[75] Inventors: Akio Nakagawa, Hiratsuka; Naoharu Sugiyama, Yokohama; Tomoko Matsudai, Tokyo; Norio Yasuhara, Kawasaki; Atsusi Kurobe, Yamato; Hideyuki Funaki, Tokyo; Yusuke Kawaguchi, Kanagawa-ken; Yoshihiro Yamaguchi, Urawa, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/816,596

[22] Filed: Mar. 13, 1997

[30] Foreign Application Priority Data

| Mar. 13, 1996 | [JP] | Japan | 8-055990 |
| Mar. 28, 1996 | [JP] | Japan | 8-073397 |
| Mar. 29, 1996 | [JP] | Japan | 8-076076 |
| Sep. 18, 1996 | [JP] | Japan | 8-246437 |
| Sep. 18, 1996 | [JP] | Japan | 8-246709 |
| Sep. 18, 1996 | [JP] | Japan | 8-246722 |
| Mar. 10, 1997 | [JP] | Japan | 9-054722 |
| Mar. 10, 1997 | [JP] | Japan | 9-054733 |
| Mar. 12, 1997 | [JP] | Japan | 9-057804 |
| Mar. 13, 1997 | [JP] | Japan | 9-058726 |

[51] Int. Cl.⁶ .......................... H01L 21/8249
[52] U.S. Cl. ........................ 438/206; 438/268
[58] Field of Search .................. 257/341, 350; 438/138, 206, 209, 212, 268

[56] References Cited

U.S. PATENT DOCUMENTS

| 4,325,180 | 4/1982 | Curran | 438/206 |
| 4,814,288 | 3/1989 | Kimura et al. | 438/206 |
| 4,893,158 | 1/1990 | Mihara et al. | 357/12.13 |
| 5,171,699 | 12/1992 | Hutter et al. | 438/268 |
| 5,348,895 | 9/1994 | Smayling et al. | 438/268 |
| 5,406,141 | 4/1995 | Yero et al. | 326/68 |

OTHER PUBLICATIONS

Keiji Tanaka et al., "Characteristics of Field–Induced–Drain (FID) Poly–Si TFT's with High On/Off Current Ratio", IEEE Transactions On Electron Devices, vol. 39, No. 4, Apr. 1992, pp. 916–919.

G.M. Dolny et al., "Polycrystalline–Silicon Thin–Film Transistor Technology for Low Cost, High–Power Integrated Circuits", IEEE IEDM Technical Digest, Apr. 1992, pp. 233–236.

*Primary Examiner*—Chandra Chaudhari
*Attorney, Agent, or Firm*—Oblon, Spivak, McClelland, Maier & Neustadt, P.C.

[57] ABSTRACT

A semiconductor apparatus comprising a vertical type semiconductor device having a first conducting type semiconductor substrate, a drain layer formed on the surface of the semiconductor substrate, a drain electrode formed on the surface of the drain layer, a second conducting type base layer selectively formed on the surface of the semiconductor substrate opposite to the drain layer, a first conducting type source layer selectively formed on the surface of the second conducting type base layer, a source electrode formed on the first conducting type source layer and the second conducting type base layer, and a gate electrode formed in contact with the first conducting type source layer, the second conducting type base layer and the semiconductor substrate through a gate insulating film and a lateral semiconductor device having an insulating layer formed in a region of the surface of the semiconductor substrate different from the second conducting type base layer, and a polycrystalline semiconductor layer formed on the insulating layer and having a first conducting type region and a second conducting type region, wherein the first conducting type source layer of the vertical semiconductor device and the first conducting type region of the polycrystalline semiconductor layer are simultaneously formed.

6 Claims, 53 Drawing Sheets

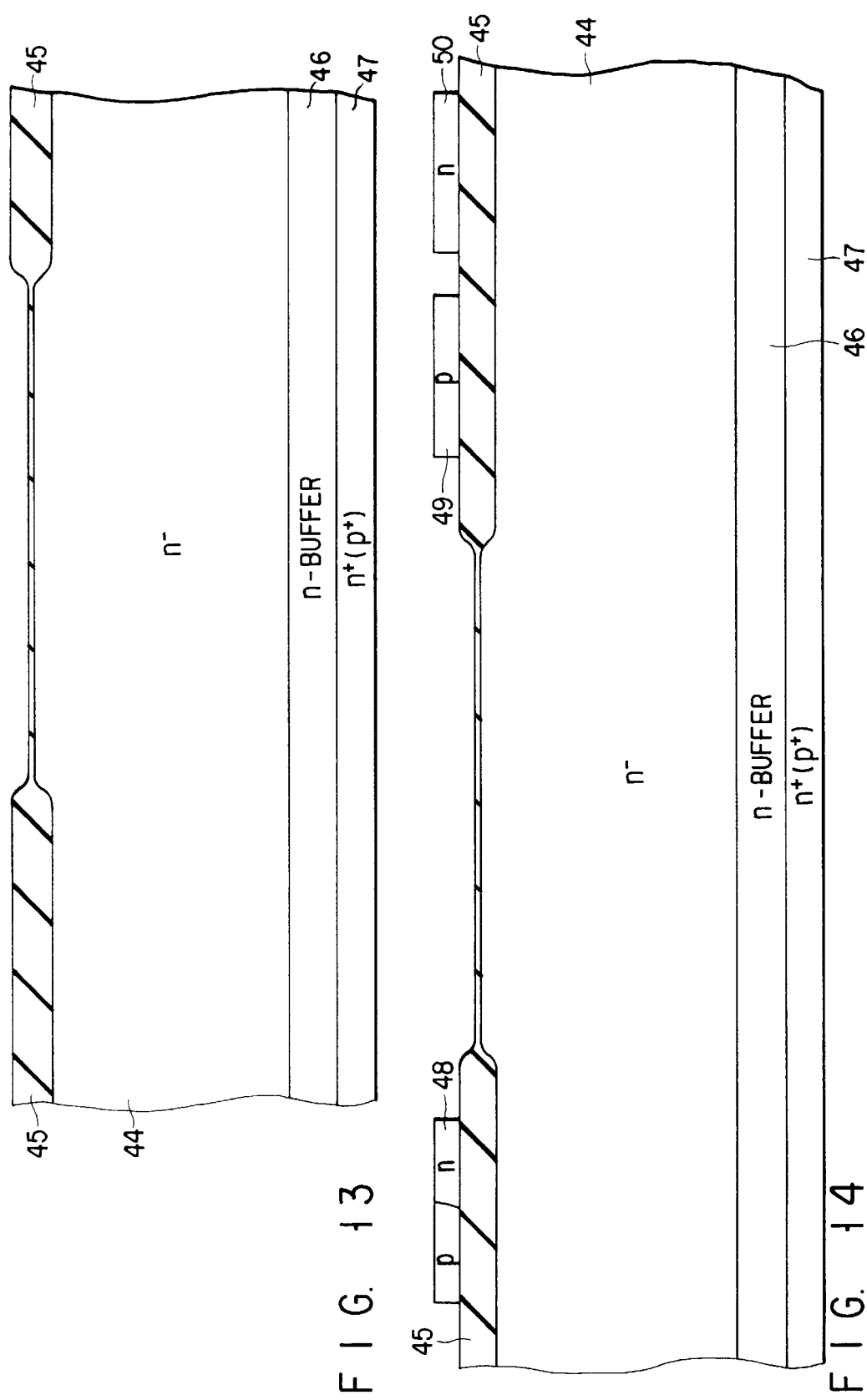

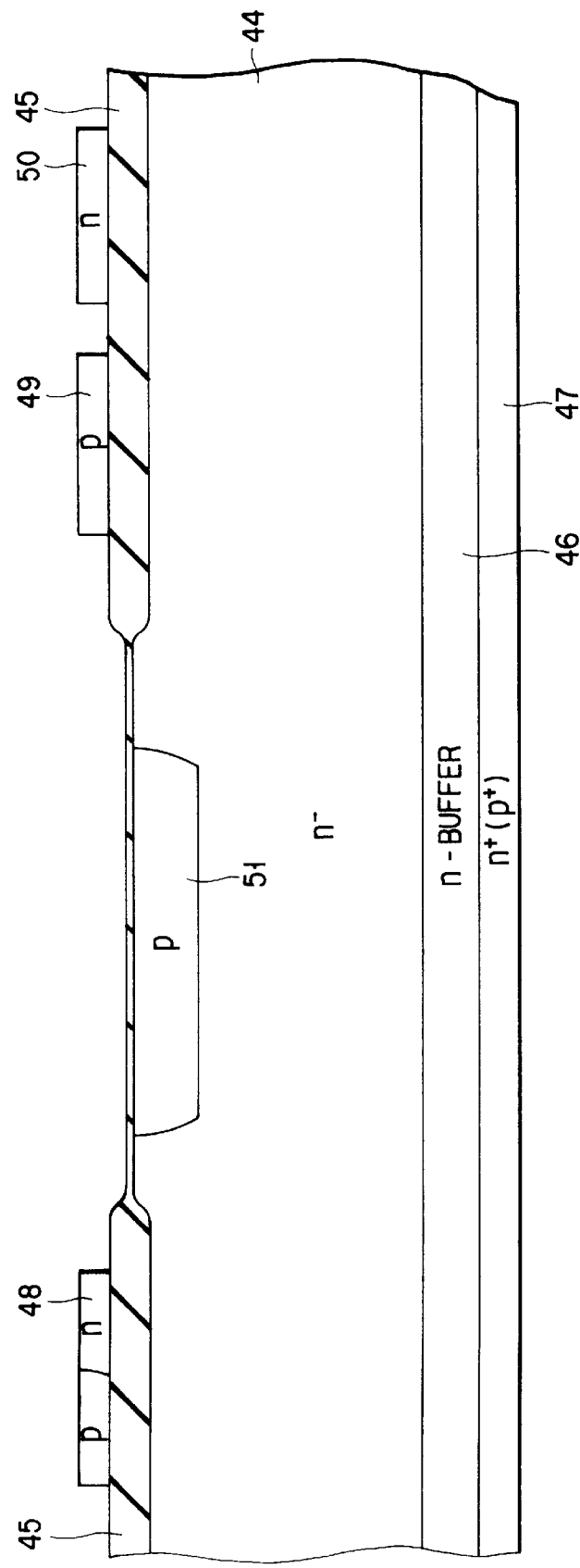
F I G. 15

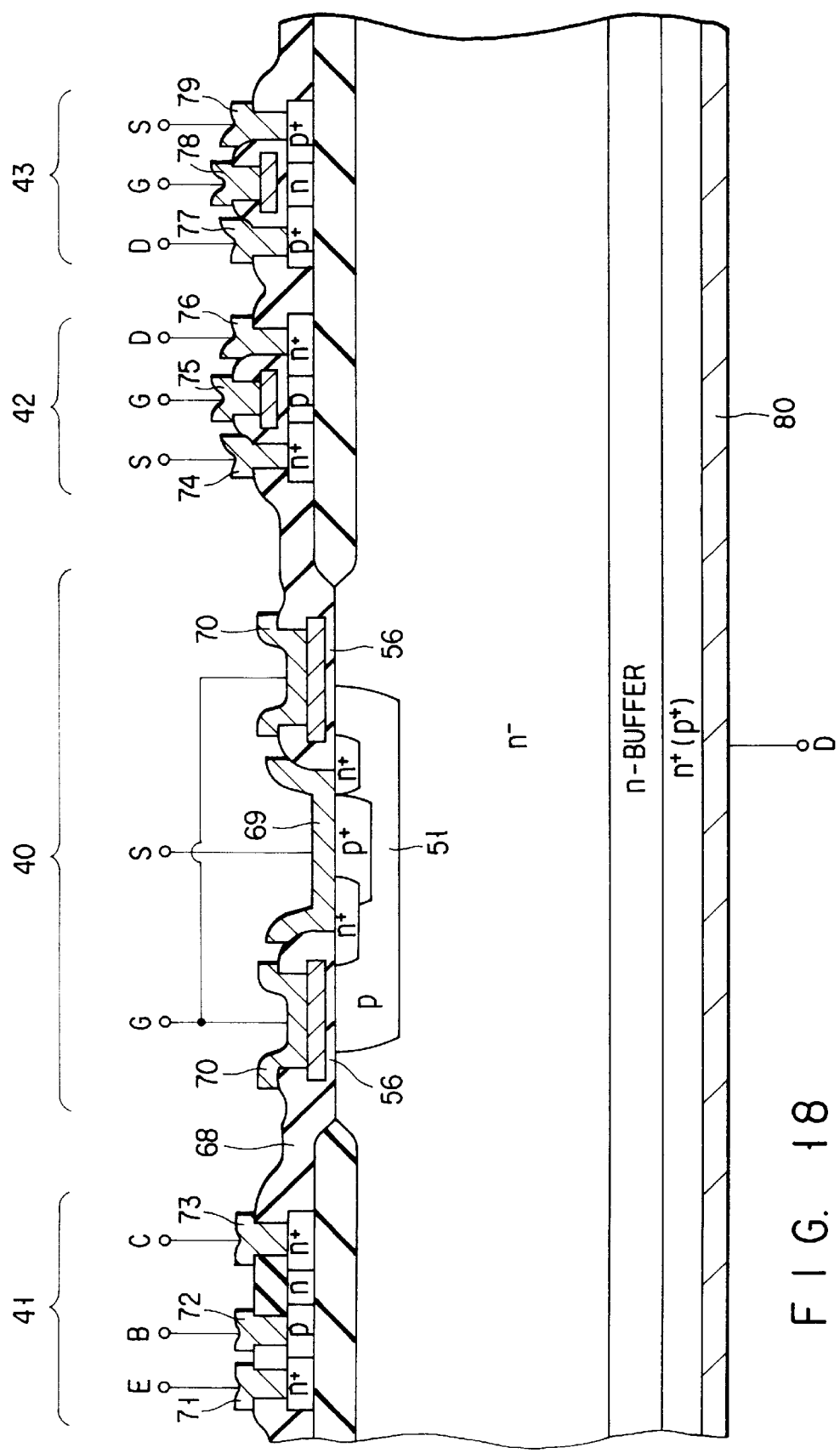
F I G. 18

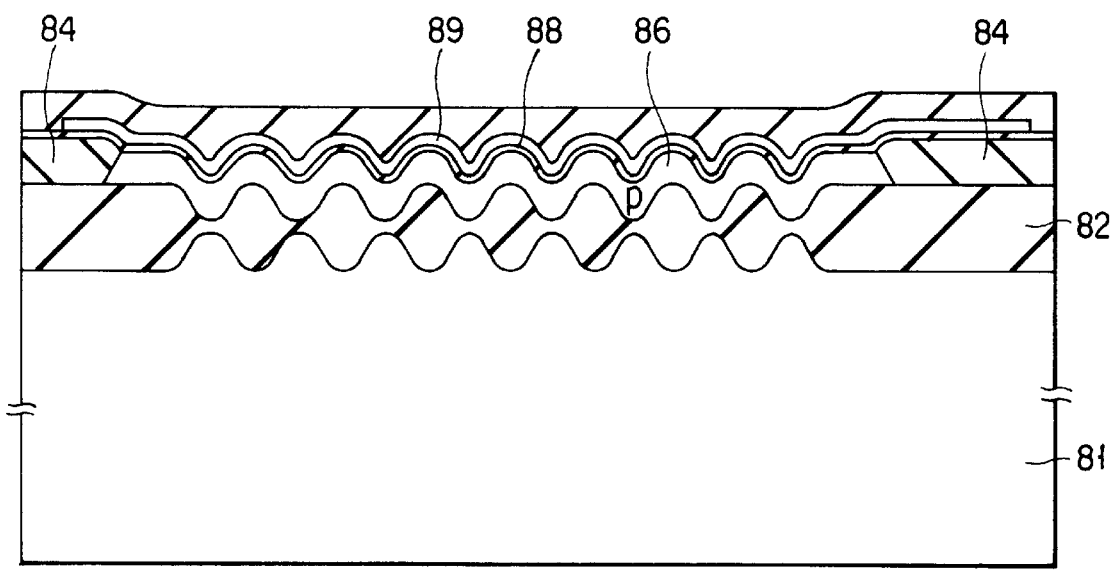
F I G. 21

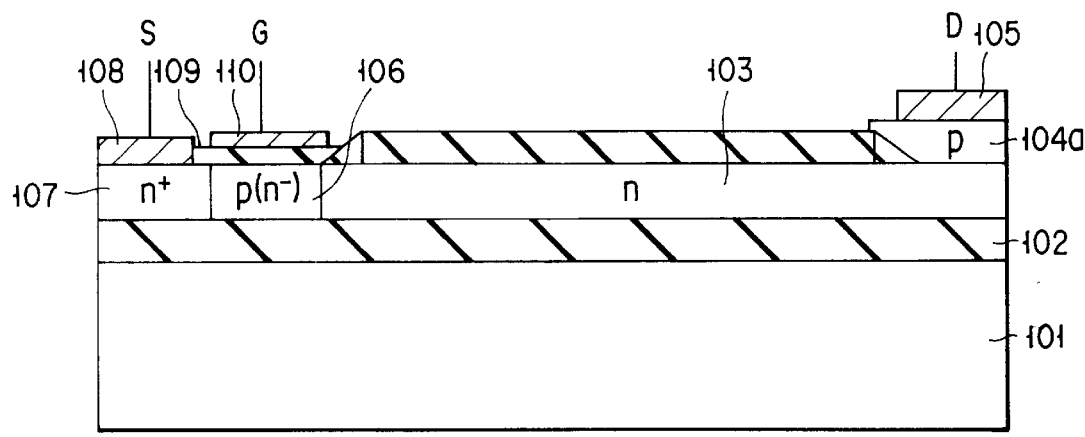
F I G. 26
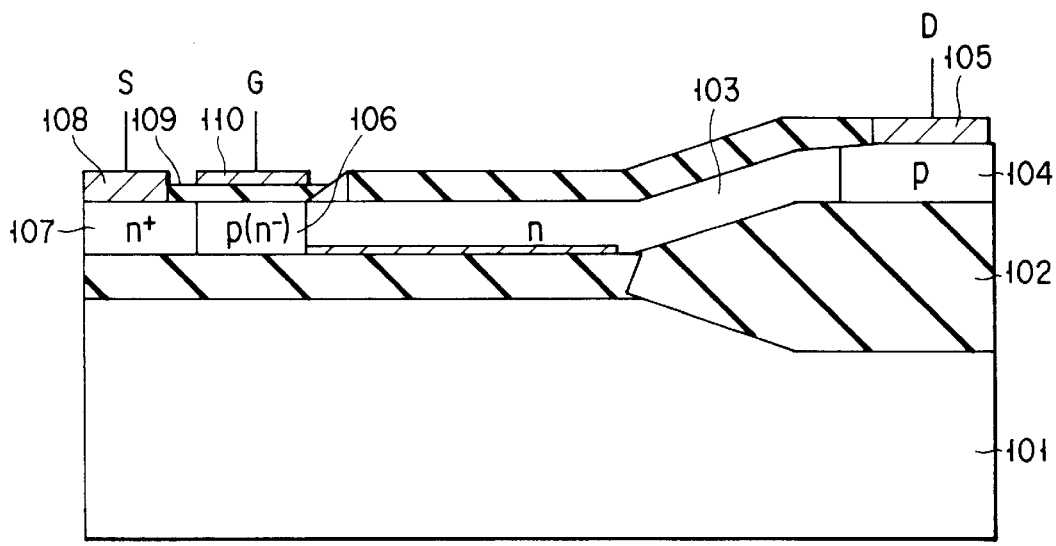
F I G. 27

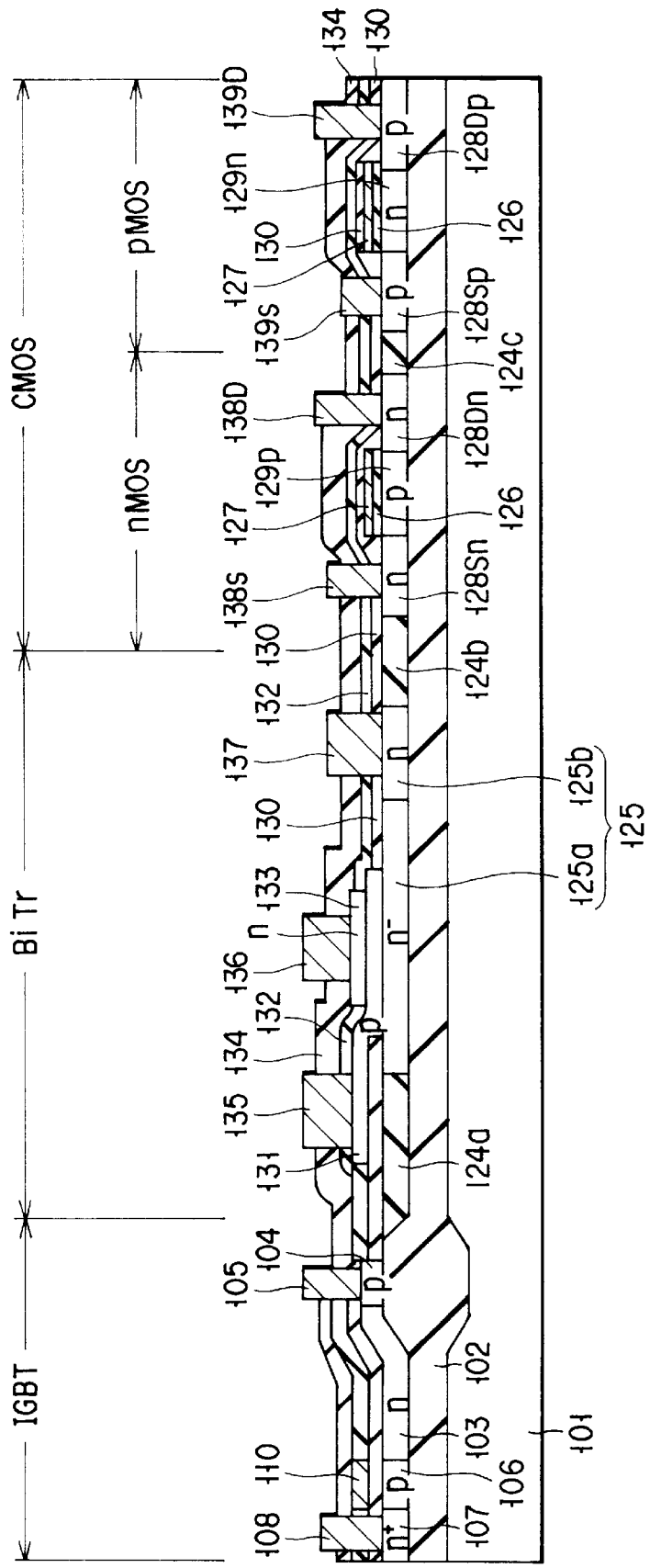
F I G. 34

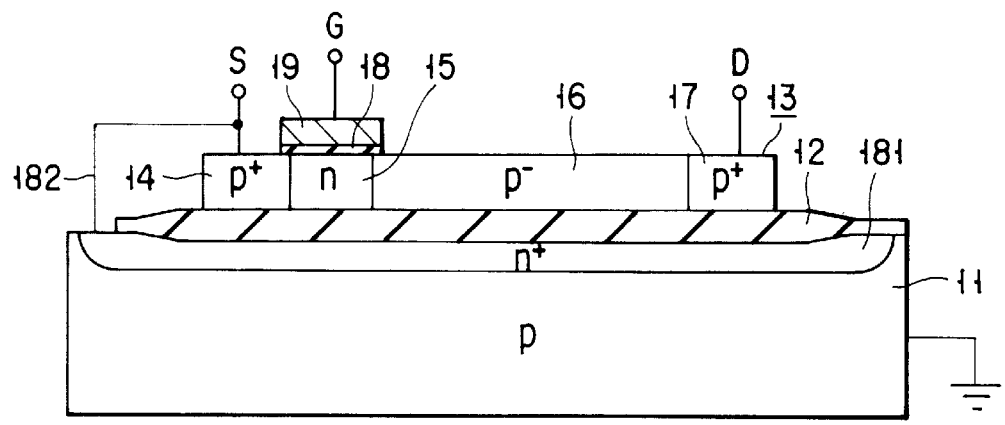
F I G. 37
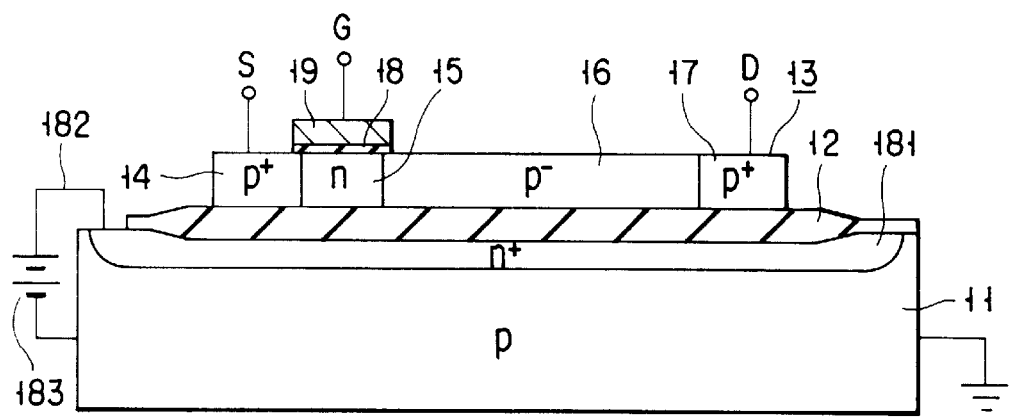
F I G. 38
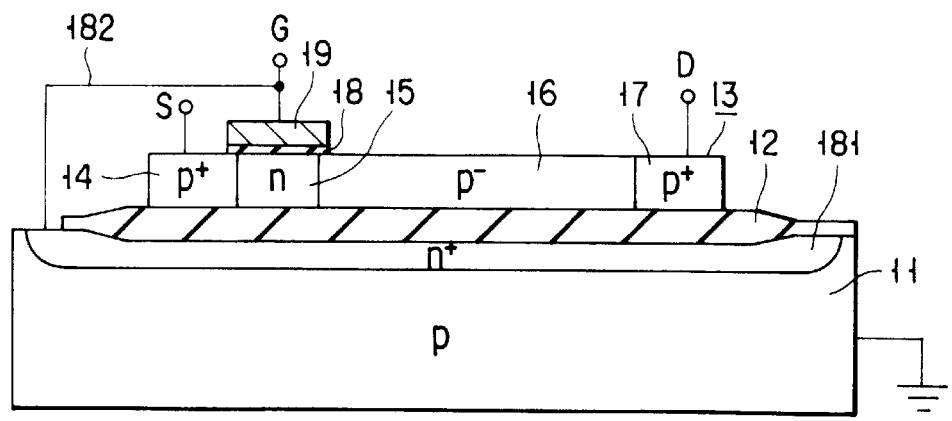
F I G. 39

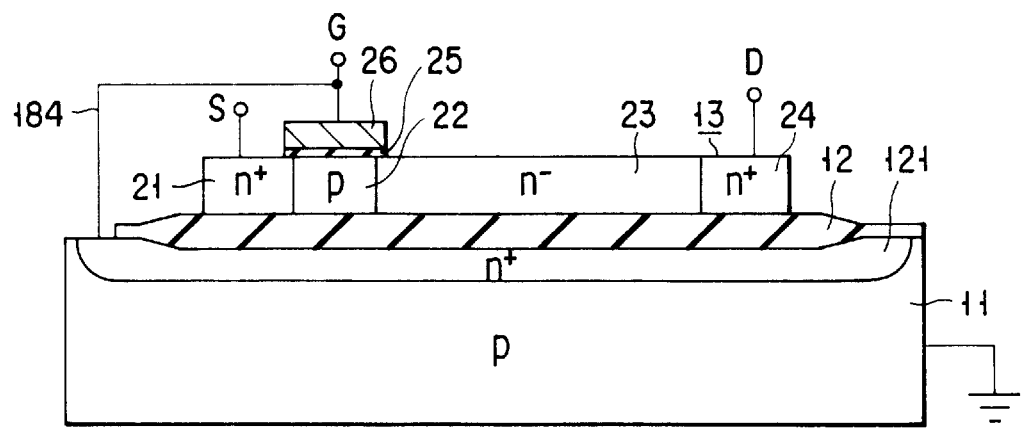
F I G. 40
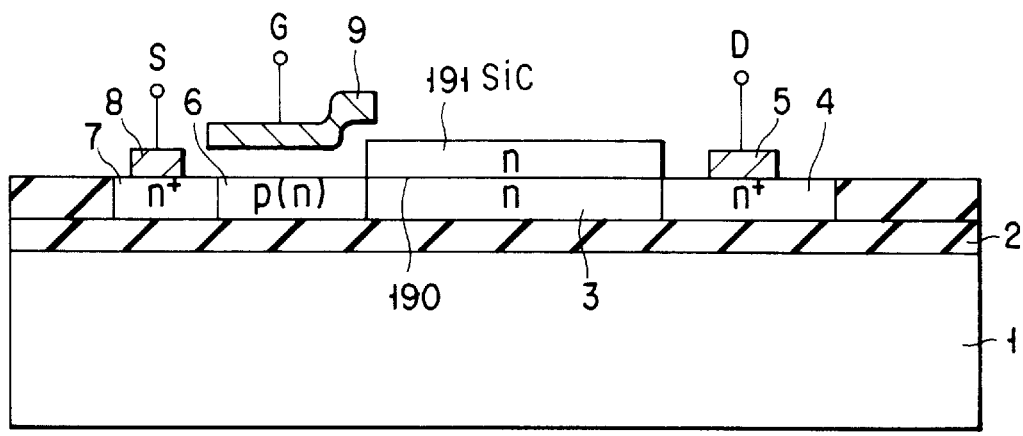
F I G. 41
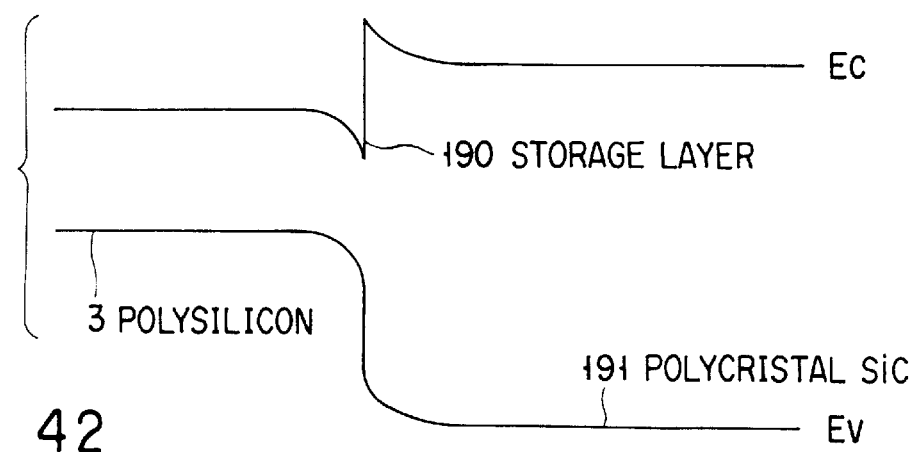
F I G. 42

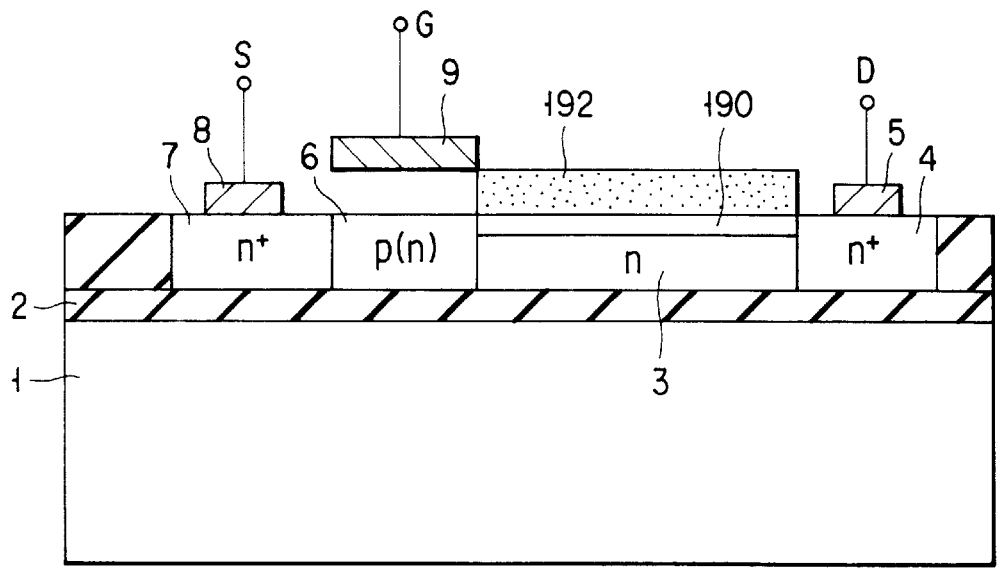
F I G. 43
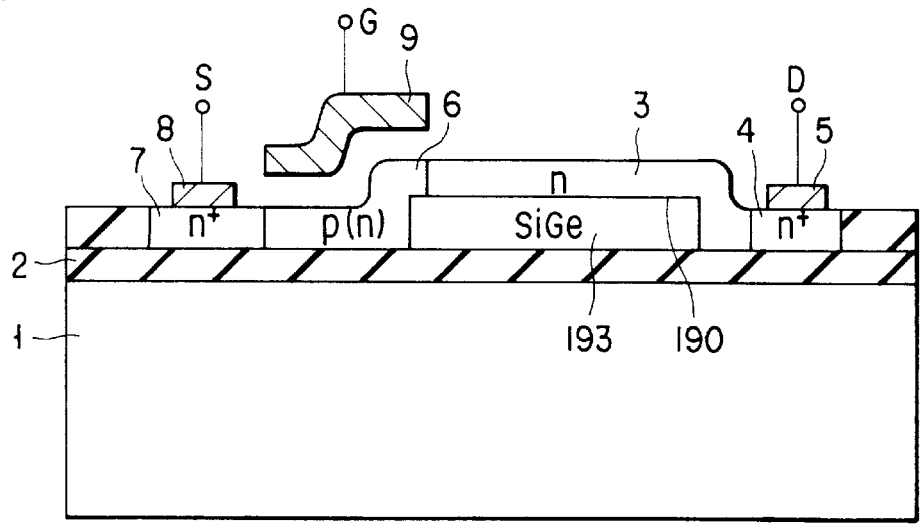
F I G. 44
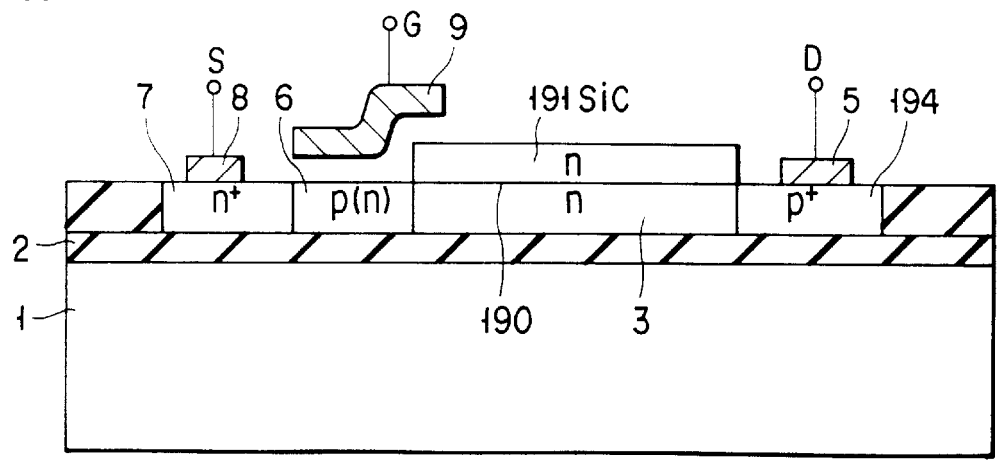
F I G. 45

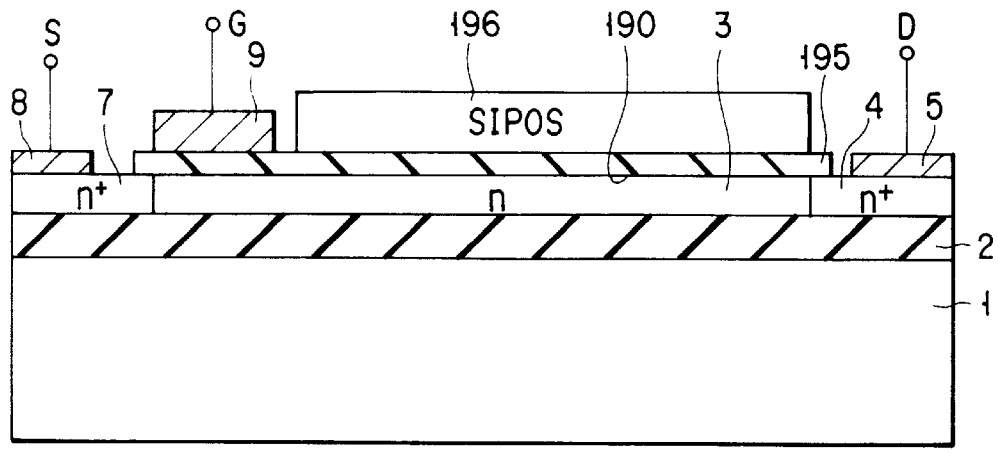
F I G. 46
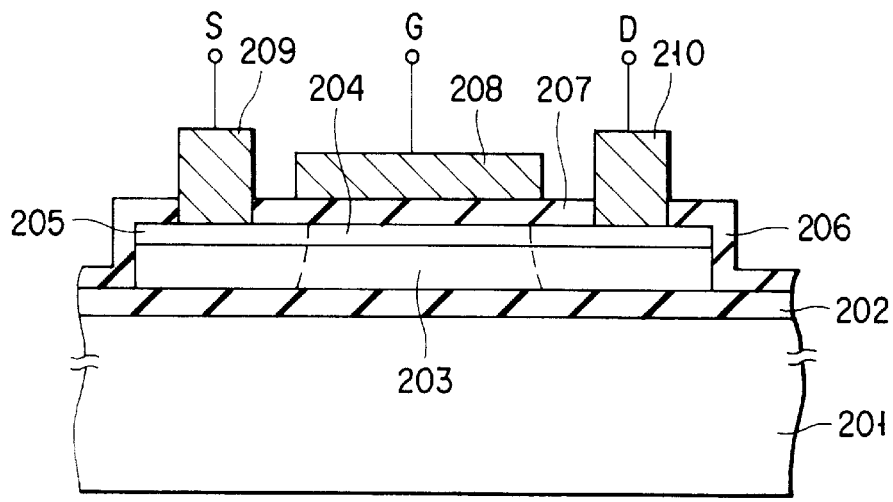
F I G. 47
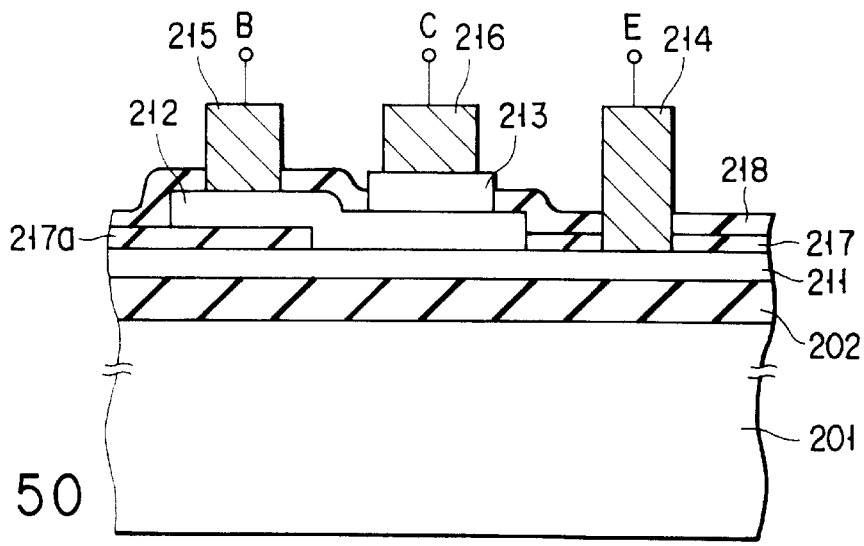
F I G. 50

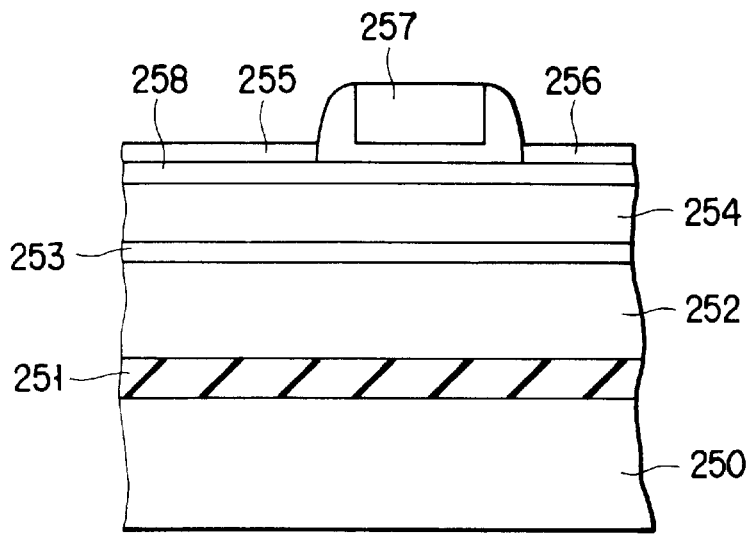
F I G. 57
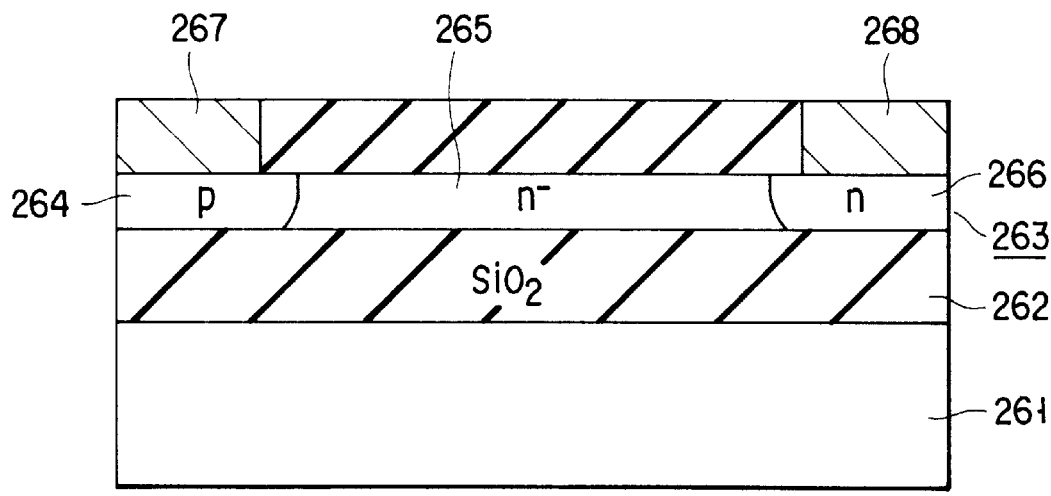
F I G. 58
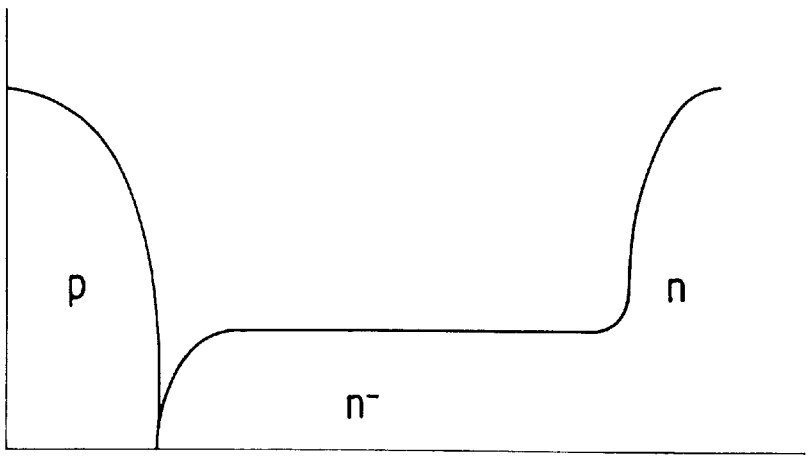
F I G. 59

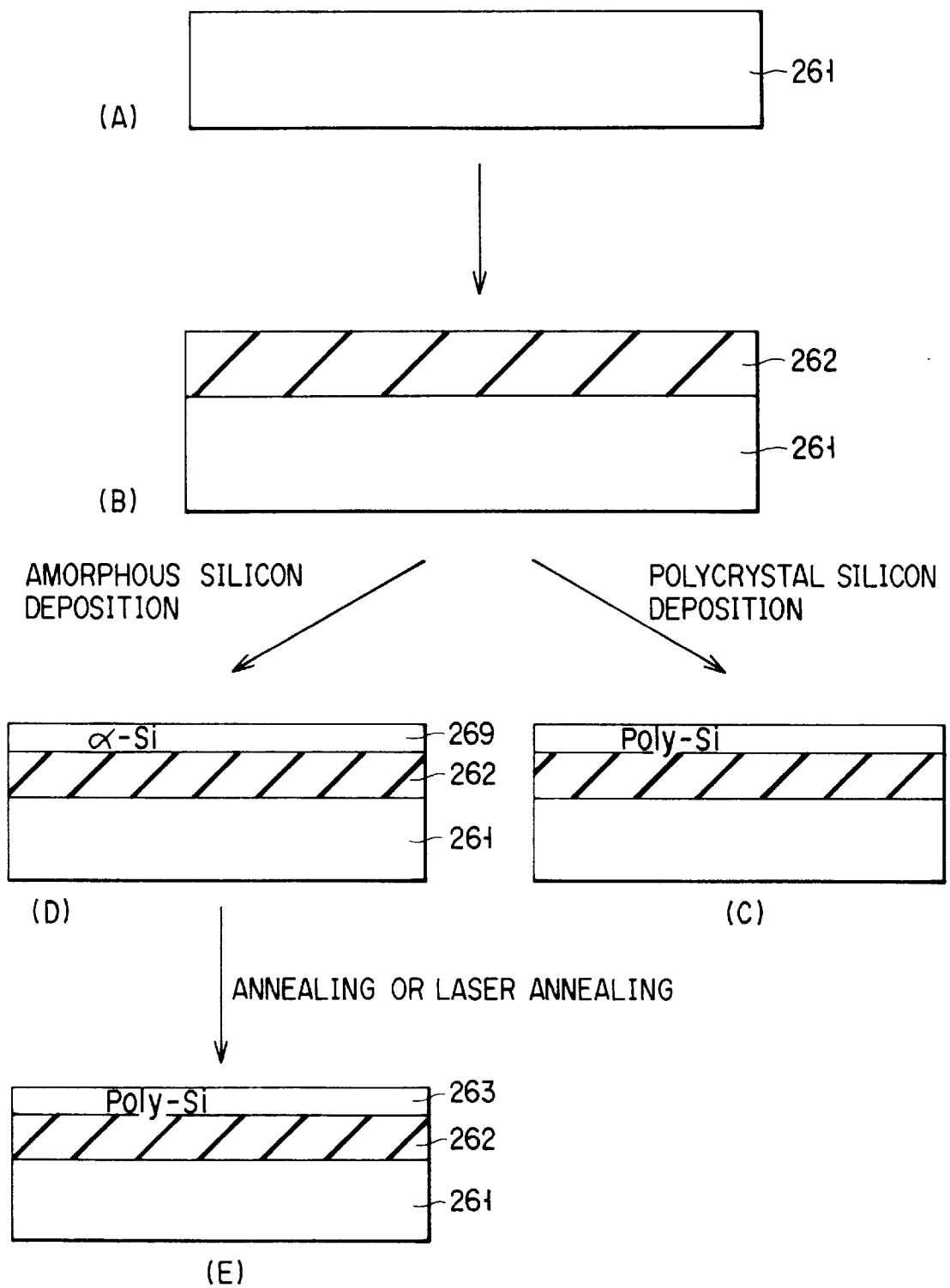
F I G. 60

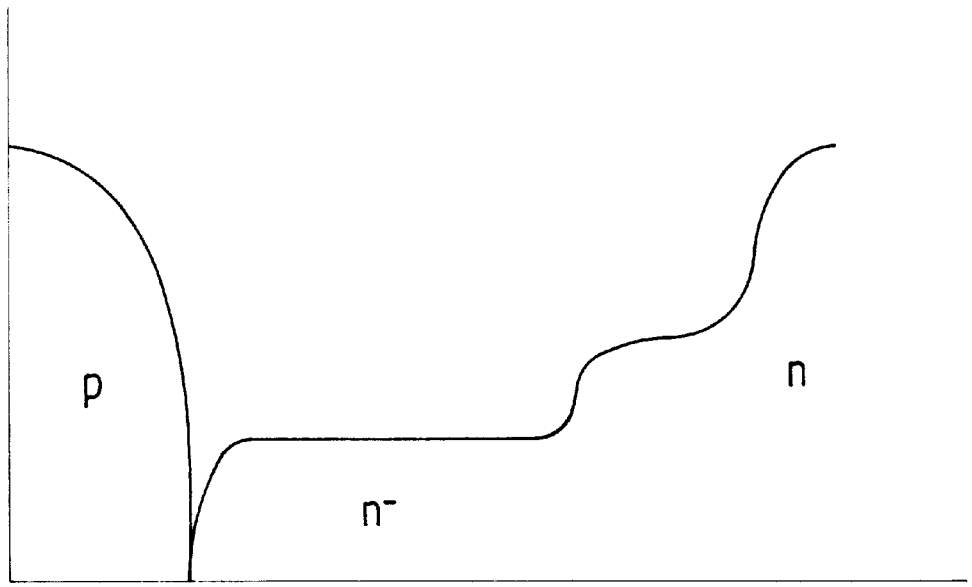
F I G. 63
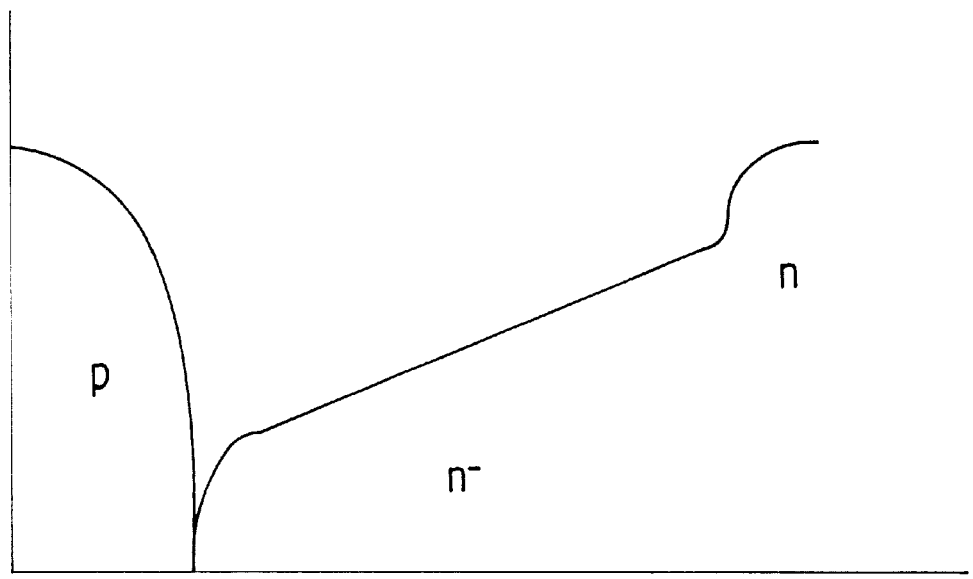
F I G. 64

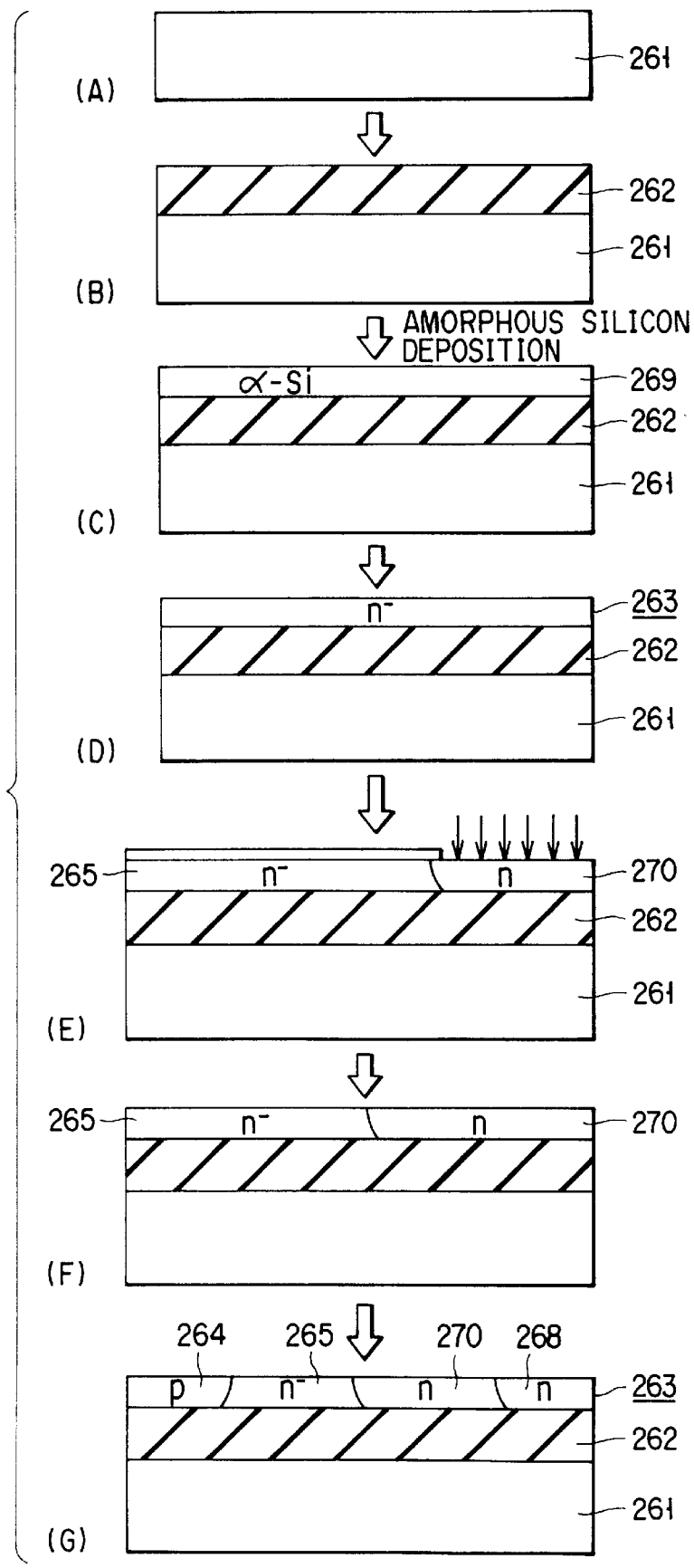
F I G. 65

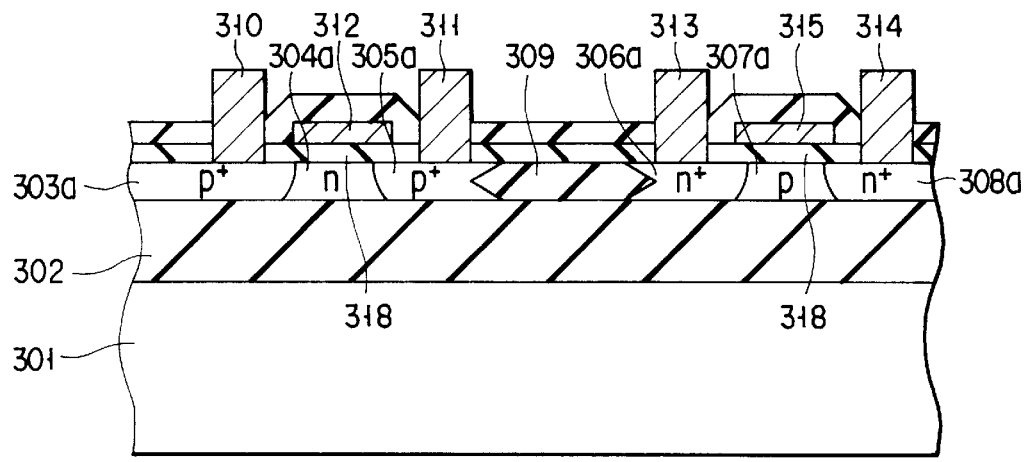
F I G. 76
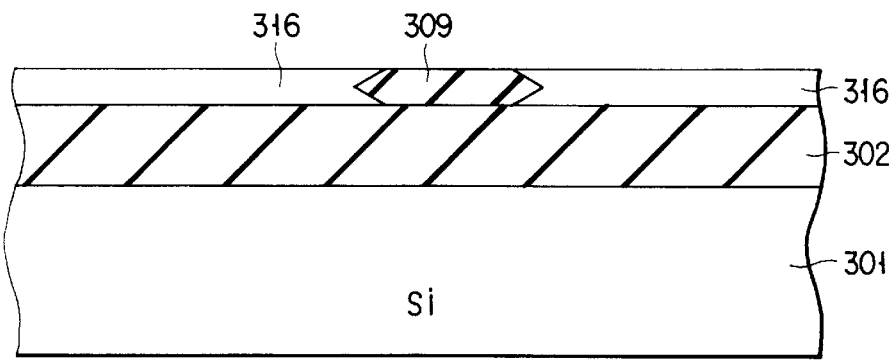
F I G. 77A
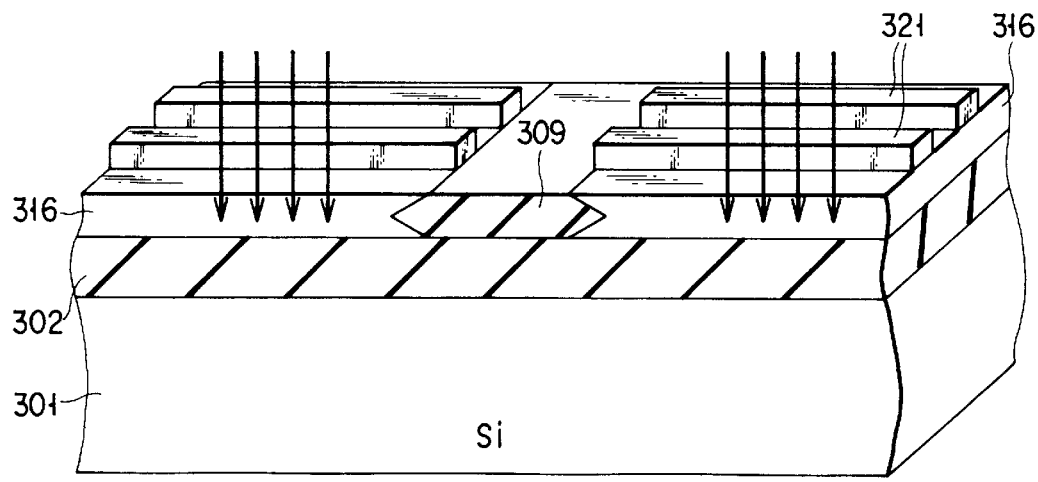
F I G. 77B

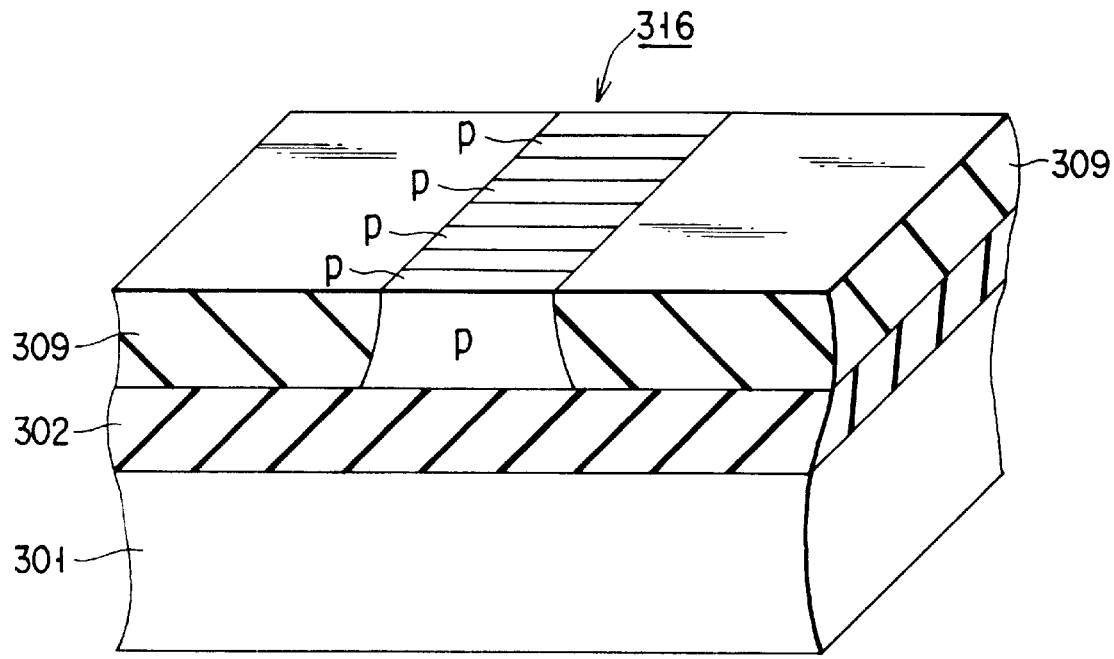
F I G. 78
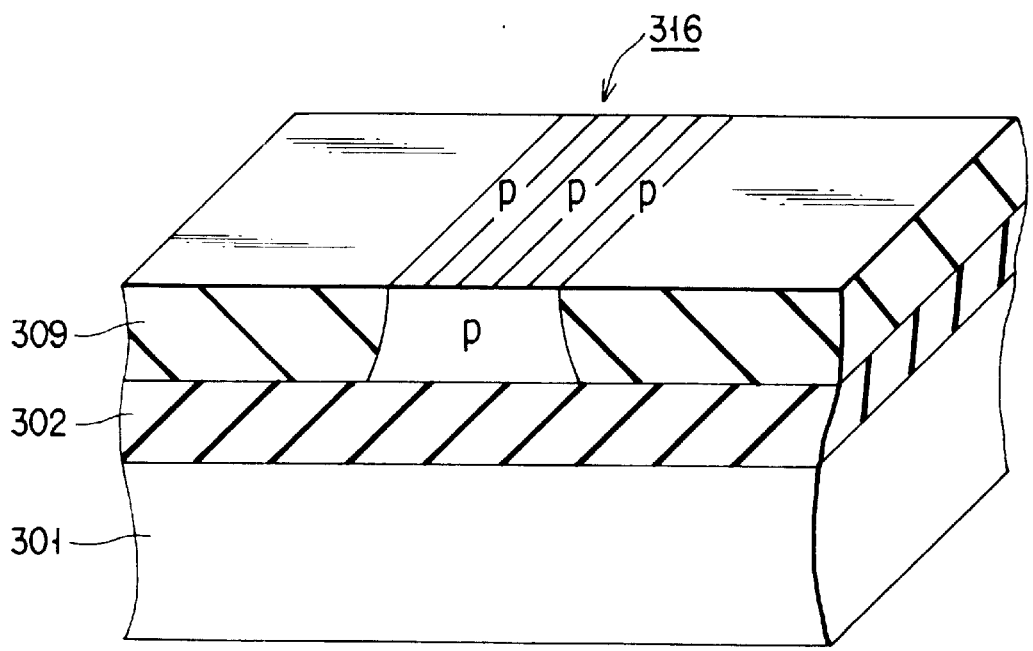
F I G. 79

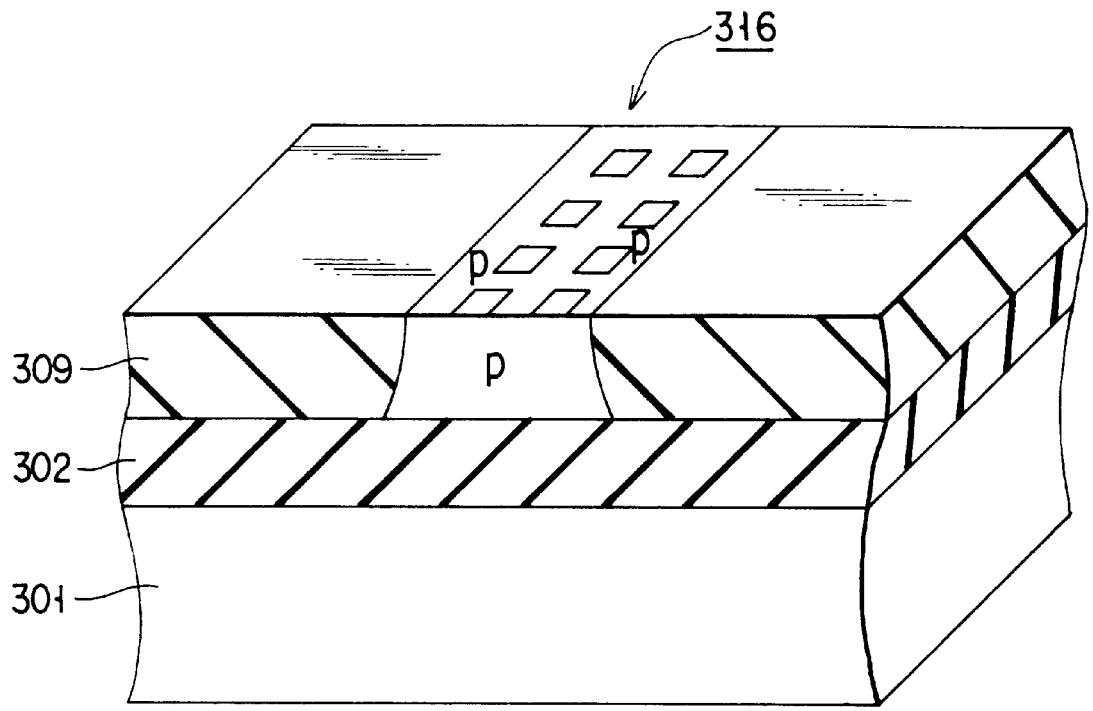
F I G. 80
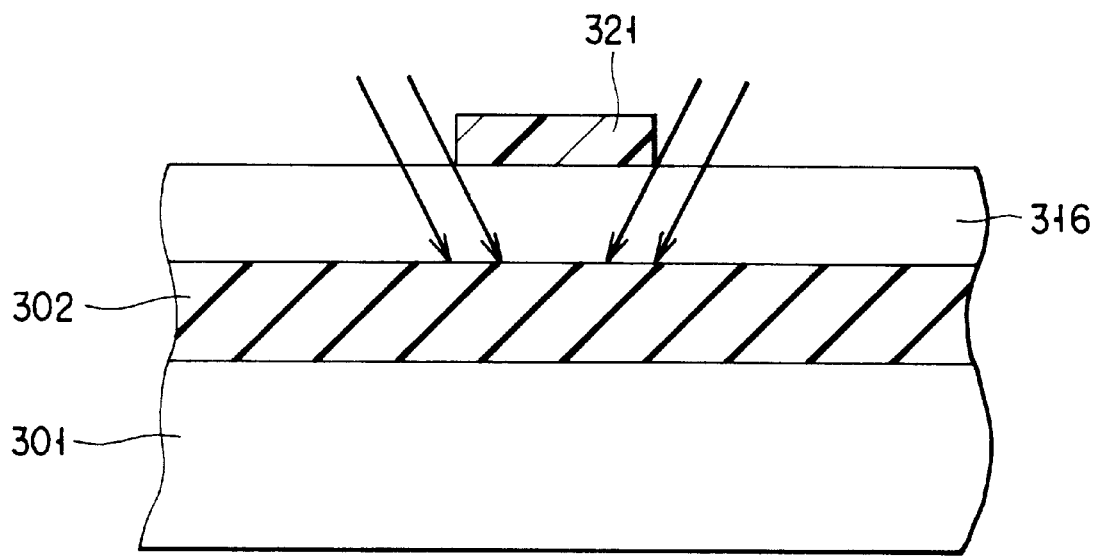
F I G. 81

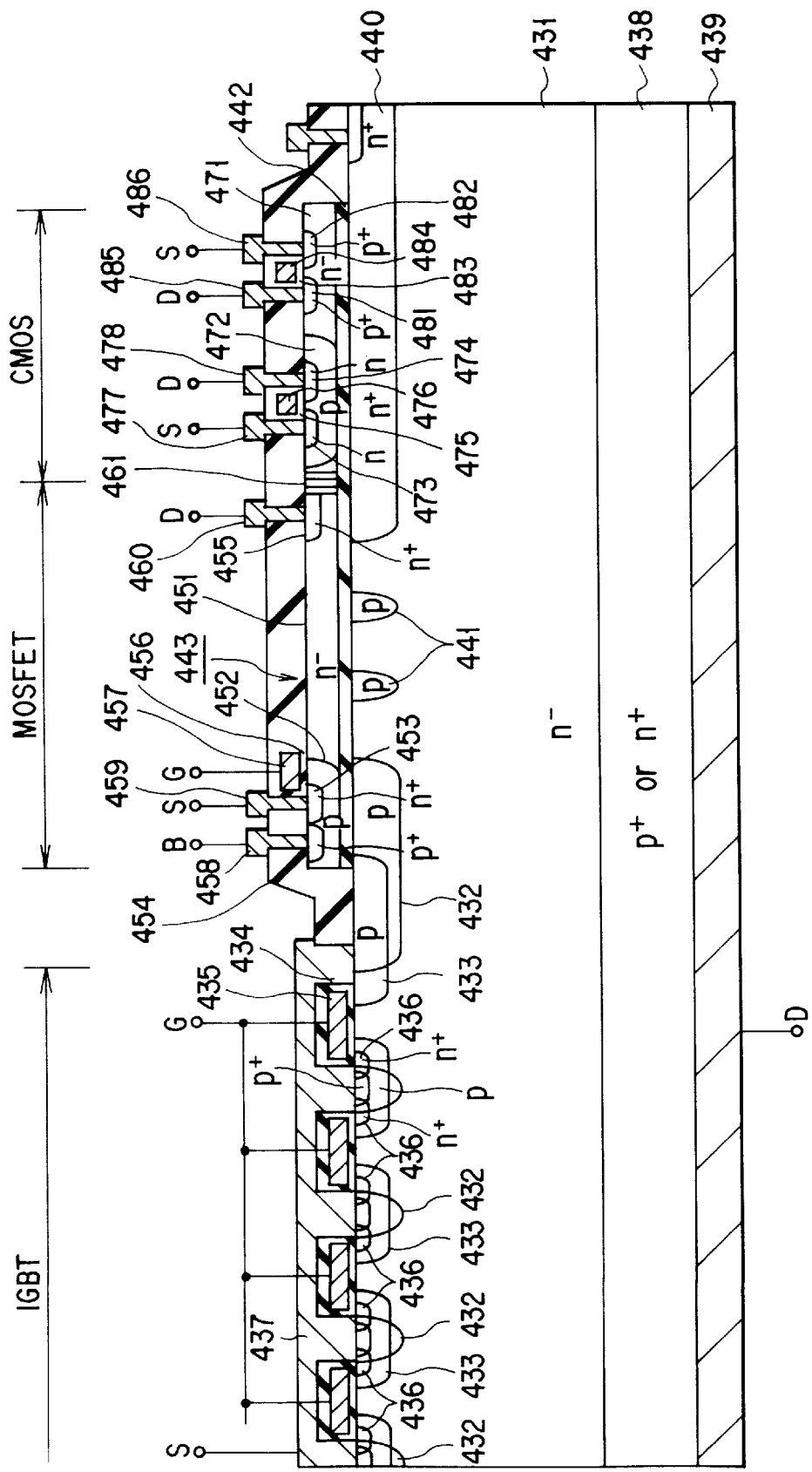
F I G. 87

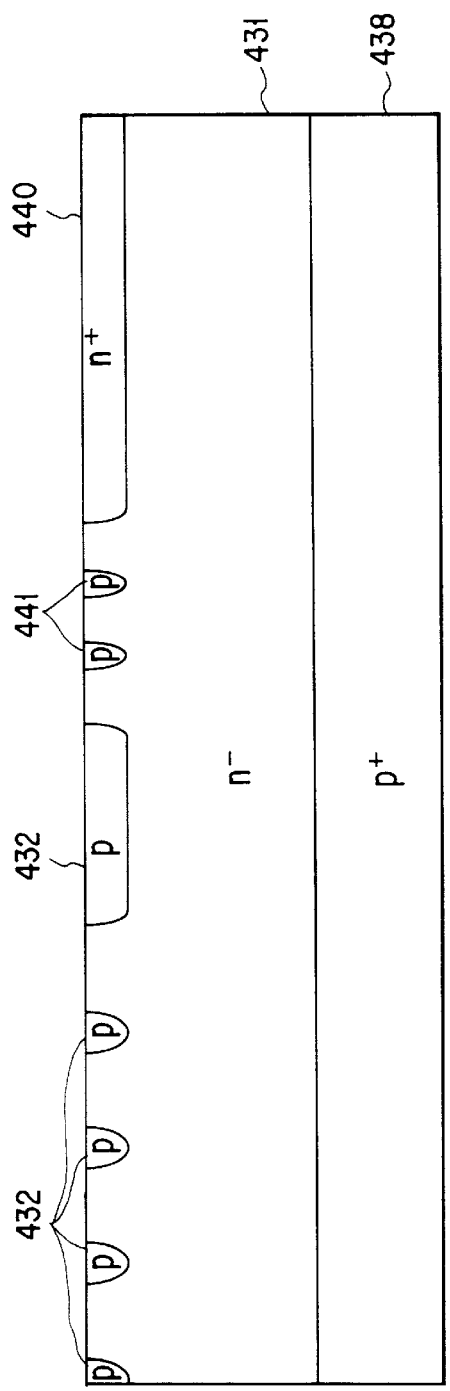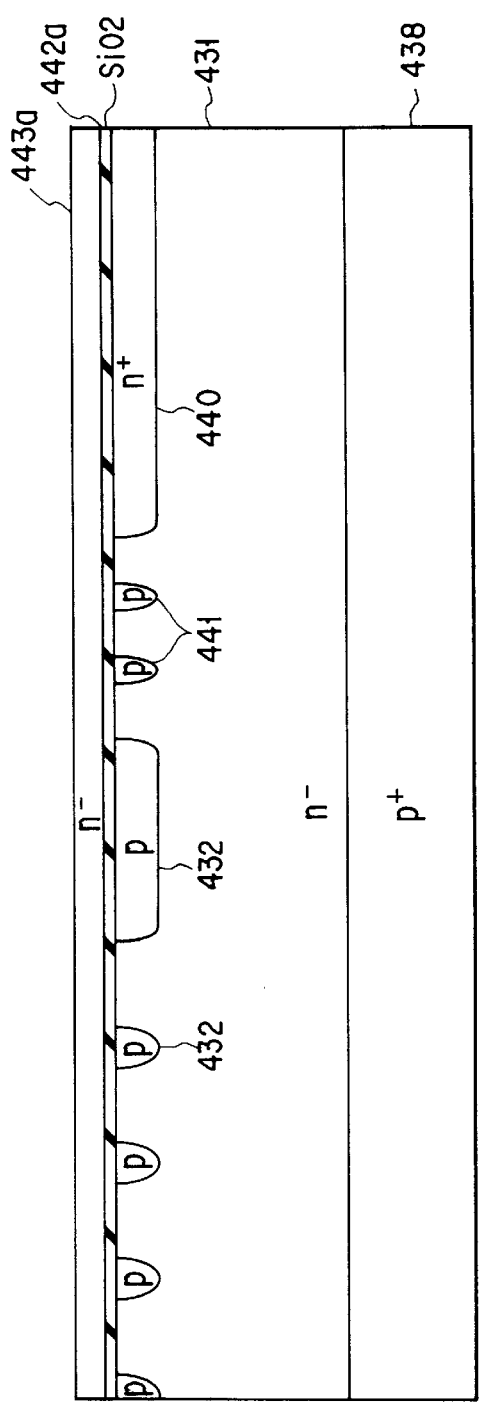
FIG. 89A
FIG. 89B

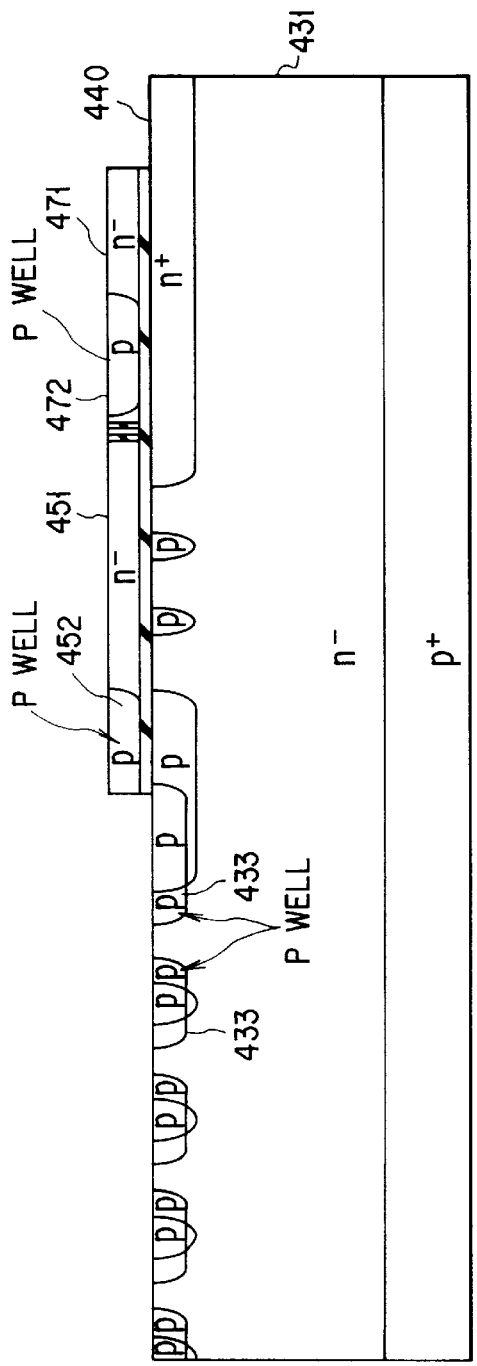
F I G. 89E
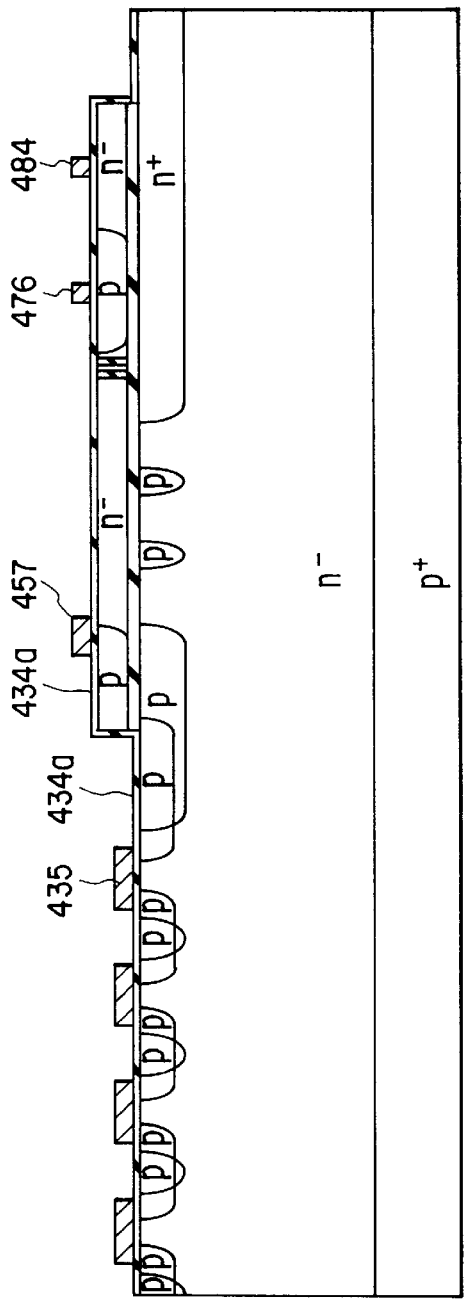
F I G. 89F

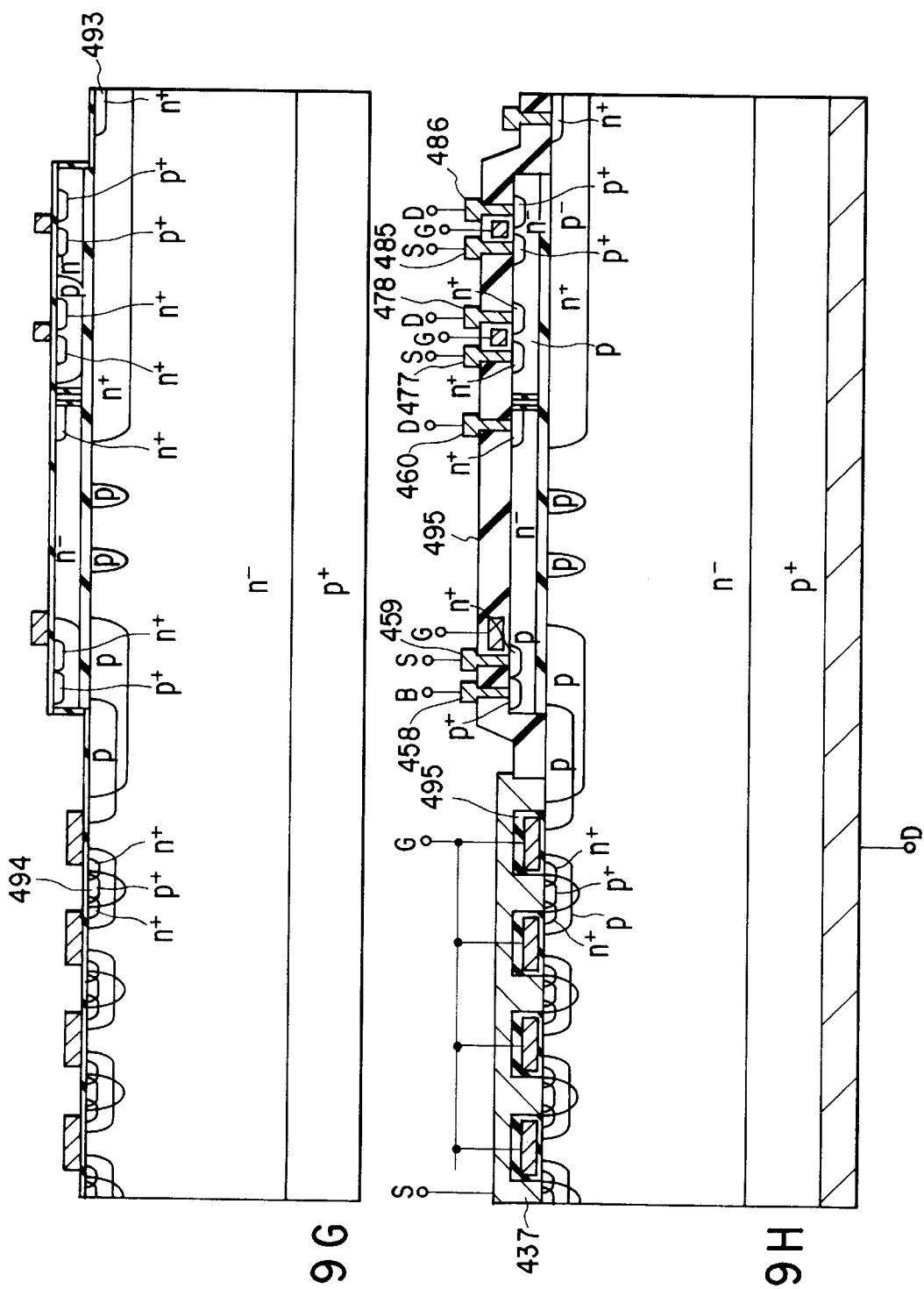

METHOD OF MANUFACTURING VERTICAL POWER DEVICE

BACKGROUND OF THE INVENTION

The present invention relates to a semiconductor apparatus, and more particularly to a semiconductor apparatus which is capable of preferably manufacturing an integrated circuit having a lateral polycrystalline silicon device formed on an insulating film on a vertical power device and which can be manufactured by a simple manufacturing process.

Hitherto, integrated circuits have been manufactured by using single-crystalline silicon. In recent years, development in a technique for precisely forming a device has realized large scale integration. Thus, a trend of integrating various circuits and integrating a system on one chip has been made apparent. Under the circumstance above, there has been required to integrally form circuits of different types, such as high voltage devices, power devices, analog circuits and digital circuits.

In general, a structure in which a control circuit for a vertical power device is formed on the vertical power device satisfactorily improves the characteristic of the device.

FIGS. 1 and 2 are structural views of an inverter apparatus for rotating a DC motor. The apparatus has power devices each comprising an IGBT. The inverter apparatus has six IGBTs 401 to 406 forming a three-phase inverter, six diodes 411D to 416D respectively connected to the IGBTs 401 to 406 in parallel and a drive circuit IC 420 for operating the IGBTs 401 to 406. However, the foregoing inverter apparatus composed of the IGBTs 401 to 406, diodes 411D to 416D and the drive circuit 420, which are disposed individually, involves an excessively large number of elements. Thus, the cost of the apparatus cannot be reduced.

Referring to FIG. 2, a portion of the drive circuit 420 surrounded by a dashed line is an upper drive circuit 420a for operating the upper IGBTs 401 to 403. The structure of the upper drive circuit 420a will now be described. When an ON-state signal has been supplied to a high voltage MOS-FET 421, which is a level shifter, constant currents flow to operate the upper CMOS drive circuit 422 comprising a CMOS inverter and the like so that the upper IGBTs 401 to 406 are operated.

As the power source for the upper drive circuit, a capacitor 424 electrically charged by a high voltage diode 423 are employed. However, if a control circuit, such as the drive circuit 420, is fabricated on a high voltage and high-current device (the IGBT), noise generated by the high-current device arises a risk that the control circuit encounters a malfunction. To prevent the malfunction, it is preferable that the control circuit and the power device be completely be isolated from each other by, for example, an oxide film.

As pn junction isolation technique is insufficient to satisfactorily electrically isolate the power device and its appendix circuit from each other, dielectric isolation or a SOI (Silicon On insulator) substrate as shown in FIG. 3 have been usually employed. Since the dielectric isolation process of the foregoing type includes a step of joining two substrates and a step of forming an embedded isolation region, a structure having a voltage resistance exceeding 600 V excessively raises the cost. However, an alternative low cost technique has not been available at present. Moreover, the cost of the single crystalline silicon for forming the substrate, as well as the cost of the dielectric isolation technique, enlarges the cost of the semiconductor device.

If the lattices are not aligned to the film allowed to grow on the single crystalline substrate, displacement takes place in the grown film and, thus, there arises a problem in that leak current are generated and the characteristic of the device deteriorates. Since the single crystalline substrate must satisfy the requirement of the lattice alignment as described above, combinations of various materials are limited. Therefore, selection of materials cannot freely be performed.

In order to reduce the cost of a transistor, which is the basic device for the semiconductor circuit, the following attempts (1) to (3) have been made such that various transistors are manufactured by using polycrystalline silicon formed on the insulating film in an amorphous state in place of the conventional and expensive single crystalline silicon. The transistor of the foregoing type has a characteristic that the polycrystalline silicon on the insulating film can easily be insulated and isolated from each other by a trench (a groove).

(1) Since a MOS transistor using the amorphous silicon can easily be formed at relatively low temperatures, it has been widely used as TFT (Thin Film Transistor) in a liquid crystalline display apparatus using a glass substrate or the like. However, the polycrystalline silicon MOS transistor has an original problem of non-uniform characteristics.

(2) A technique using a polycrystalline silicon bipolar transistor has been disclosed by, for example, K. Throngnumchai ("An Intelligent Discrete Power MOS-FET with Shorted Load Protection Using Thin-Film Bipolar Transistor", Proceedings of 1992 International Symposium on Power Semiconductor Devices & ICs, Tokyo. pp. 144 to 149). According to the thesis above, a lateral thin film bipolar transistor made of polycrystalline silicon formed by a double diffusion self-alignment technique has been reported.

The above-mentioned thesis discloses a contrivance using the lateral bipolar transistor to serve as a protective circuit. In order to apply the foregoing structure to an accurate analog circuit, a high-performance polycrystalline silicon bipolar transistor equivalent to the single crystalline bipolar transistor has been required. If a vertical polycrystalline silicon bipolar transistor is realized, combination with a polycrystalline silicon CMOS (Complementary Metal Oxide Semiconductor) circuit is expected to realize an accurate BiCMOS circuit. Thus, an intelligent power device can be manufactured with a low cost.

(3) As another device required to be manufactured by using the polycrystalline silicon, an IGBT (Insulated Gate Bipolar Transistor) for controlling electric power can be available. However, the IGBT is a device requiring storage of carriers and conductivity modulation and the polycrystalline silicon having a small life time is considered that carriers cannot easily be stored. Therefore, the IGBT cannot easily be formed. Moreover, since the polycrystalline silicon having a multiplicity of grains has a great resistance and a low mobility, the ON-state resistance is enlarged unintentionally. Therefore, the polycrystalline silicon is considered to be not suitable to manufacture the IGBT which is a high voltage and high current device. Furthermore, the polycrystalline silicon having great ON-state resistance is considered to be not suitable to manufacture another transistor except the IGBT.

If a low cost and high performance MOS transistor, bipolar transistor or an IGBT can be manufactured by using the above-mentioned polycrystalline silicon, it might be considered to manufacture a CMOS transistor, a bipolar transistor or a lateral IGBT by forming a polycrystalline layer on a power device, such as the vertical MOSFET or the vertical IGBT. The above-mentioned method is able to considerably reduce the manufacturing cost as compared with the method for manufacturing a device by the dielectric isolation or the SOI. The foregoing method has an advantage that an active layer of transistors forming the appendix circuit can be formed by a polycrystalline silicon on the vertical MOSFET.

The appendix circuit of the foregoing type will now be described.

CMOS

In recent years, excellent polycrystalline silicon can be manufactured by annealing amorphous silicon or by laser-annealing polycrystalline silicon. However, if ion implantation is performed as shown in FIG. 4A after the polycrystalline silicon layer has been formed, the crystallinity of the polycrystalline silicon layer is ruptured and it is formed into amorphous state when impurities are doped to form channels. Thus, the characteristic deteriorates.

If the thickness of the active layer is large, the crystallinity can be recovered in the following thermal process by using the polycrystalline portion left in the bottom of the active layer. However, since the characteristics of the device can be improved in inverse proportion to the thickness of the active layer, the thickness is required to be reduced as much as possible.

If ions are implanted to form the channels in the amorphous silicon film before the amorphous silicon is formed into a polycrystalline state by the solid-phase growth, polycrystalline silicon exhibits excellent crystallinity.

However, the method in which the amorphous is allowed to grow to the polycrystalline silicon and which involves the n-channel and the p-channel being formed adjacently as shown in FIG. 4B encounters a problem in that the diffusion of impurities cannot be controlled in the solid-phase growth step in a case where, for example, a CMOS consisting of nMOS (n-channel MOS) and pMOS (p-channel MOS) is formed.

Hetero Junction Transistor

In a case where a thin film transistor is manufactured by using the polycrystalline silicon, there arises a problem in that the mobility of the channel is unsatisfactorily low. To overcome the foregoing problem, a method for raising the mobility may be employed in which, for example, a thin polycrystalline silicon layer is deposited on a polycrystalline silicon germanium layer followed by distorting the polycrystalline silicon layer.

An energy band of a p-channel thin film transistor is as shown in FIG. 5A. As can be understood from FIG. 5A, a two-dimensional electron gas layer is generated in the interface between the polycrystalline silicon layer and the polycrystalline silicon germanium layer, thus causing the mobility of the channel to be raised.

In a case of an n-channel, the energy band becomes as shown in FIG. 5B.

As can be understood from FIG. 5B, no 2DEG (Two Dimensional Electron Gas) layer is generated in the interface between the polycrystalline silicon layer and the polycrystalline silicon germanium layer. In this case, the mobility of the channel cannot be improved considerably.

In order to improve the mobility in the n-channel thin film transistor, the polycrystalline silicon germanium layer is distorted in place of the polycrystalline silicon layer. Although the mobility of the n-channel can be improved in this case, the mobility of the p-channel cannot be improved satisfactorily.

Therefore, three or more polycrystalline semiconductor layers are required for the CMOS to simultaneously improve the mobility of the p-channel and that of the n-channel. Thus, the manufacturing process and manufacturing system becomes too complicated.

Lateral MOSFET

FIG. 6 is a cross sectional view showing the structure of a high voltage MOSFET. The high voltage MOSFET has an n-type drift region 3 formed on an oxide film 2 formed on a polysilicon substrate 1, the n-type drift region 3 being made of polysilicon. In the n type drift region 3, an n-type drain region is selectively formed to have a depth to reach the oxide film 2. A drain electrode 5 is formed on the n-type drain region 4.

Similarly, p-type (or n⁻) base region 6 is selectively formed from the surface of the n-drift region 4 to the oxide film 2. An n⁺ source region 7 is selectively formed from the surface of the p-type base region 6 to the oxide film 2.

A source electrode 8 is formed on the n⁺ source region 7.

A gate insulating film (not shown) is formed on a portion of the p-type base region 6, a portion of the n-type source region 7 and a portion of the n-type drift region 3. A gate electrode 9 is formed on the gate insulating film.

Since the foregoing regions 3, 4, 6 and 7 of the foregoing high voltage MOSFET are made of polysilicon, a potential barrier exists in each grain boundaries. The barrier is, just below the gate, lowered attributable to the application of the gate voltage so that the passage of electrons through the grain boundary is permitted. However, the drift region having no gate results in the mobility of the bulk. That is, the drift region 3 must be applied with voltage when an electric current flows through the grain boundary in order to pass the barrier existing in the grain boundary. Therefore, a method of lowering the barrier of the grain boundary is an essential fact.

As a technique for lowering the barrier of the grain boundary, a method using a MOS gate to form a channel is available as described above. However, a channel cannot easily be formed by the MOS gate in the drift region because a great electric field is applied.

Thus, the high voltage polysilicon MOSFET has a problem in that voltage of a certain level must be applied between the source and the drain to cause an electric current to flow. Since a high voltage level of about 10 V is usually required, a critical problem arises when a high voltage IC is manufactured by using the polysilicon. As a result, there arises a problem in that the ON-state voltage is raised unintentionally. Lateral MOSFET.

FIG. 7 is a schematic view showing the structure of the lateral MOSFET. The MOSFET shown in FIG. 7 has a field oxide film 12 formed on a p-type high voltage silicon substrate 11. A polycrystalline silicon layer 13 serving as a p-channel MOSFET and an n-channel MOSFET is selectively formed on the field oxide film 12. In the polycrystalline silicon layer 13 of the p-channel MOSFET, there are sequentially formed a p-type source region 14, an n-type base region 15, a p-offset region 16 and a p-type drain region 17. On the p-type source region 14, there is formed a source electrode (not shown). On the n-type drain region 17, there is formed a drain electrode (not shown).

A gate electrode 19 is, on a gate oxide film 18, formed on a region from an end of the p-type source region 14 to the p-offset region 16 through the n-type base region 15.

Similarly, the polycrystalline silicon layer 13 of the n-channel MOSFET has an n-type source layer 21, a p-type base region 22, an n⁻ offset region 23 and an n-type drain region 24 formed in parallel in this sequential order. On the n-type source layer 21, there is formed a source electrode (not shown). On the n-type drain region 24, there is formed a drain electrode (not shown).

A gate electrode 26 is, on a gate oxide film 25, formed on a region from an end of the n-type source layer 21 to the n⁻ offset region 23 through the p-type base region 22.

Since the MOSFET of the foregoing type has an offset region, the voltage resistance can be improved. In the case of the N channel MOSFET, the n⁻ offset region 23 has a high potential and the silicon substrate 11 has a low potential. Therefore, the n⁻ offset region 23 is, from the oxide film 12, depleted when the gate is turned off. Therefore, even if impurities by a quantity of about $2 \times 10^{12}$ cm$^{-2}$ are doped into the n⁻ offset region 23, high voltage resistance can be realized. Moreover, a required voltage resistance can be obtained by adequately determining the length of the offset region.

However, the p-channel MOSFET having the silicon substrate 11, which is a low potential, and the active layer side which is a high potential, involves the depletion layer being not expanded toward the p-offset region 16. The depletion layer expands from the n-type base region 15. If voltage resistance of, for example, 60 V is obtained in this case, the impurity density in the p-offset region 16 must be lowered. This results in high-resistance in the p-offset region 16 when the gate is turned on, thus causing a problem to arise in that the ON-state resistance is enlarged excessively. In the case of the P channel MOSFET in which the silicon substrate 11 is the low potential and the n-type base region 15 is the high potential, there arises a problem of leakage because the bottom surface of the n-type base region 15 is inverted also when the gate is turned off. Since each of the n-channel and p-channel MOSFETs has a restrained mobility of carriers as compared with a MOSFET on a single crystalline silicon, there arises a problem that the MOSFET of the foregoing type has greater ON-state resistance as compared with the MOSFET on the single crystalline silicon.

In addition to the above-mentioned structures, some lateral MOSFETs have structures as shown in FIGS. 8 to 10. FIG. 8 is a plane view showing the structure of the MOSFET of this type. FIG. 9 is a cross sectional view taken along line 9—9 shown in FIG. 8. FIG. 10 is a cross sectional view taken along line 10—10 shown in FIG. 8. The MOSFET has, as shown in FIGS. 8 to 10, an n-channel structure in which a polycrystalline silicon layer is formed on the oxide film 12.

Lateral High Voltage Diode

FIG. 11 is a cross sectional view showing a lateral and high voltage diode manufactured by using dielectric isolation. An n silicon layer (an active layer) 33 is formed on a semiconductor substrate 31 through an isolation insulating film 32. A dense n⁺ layer 34 is formed in the bottom portion of the active layer 33. In the active layer 33, a p-type anode layer 35 and an n-type cathode layer 36 apart from the p-type anode layer 35 are formed. Each of the p-type anode layer 35 and the n-type cathode layer 36 has an anode electrode 37 and a cathode electrode 38.

With the lateral diode having the above-mentioned structure, an inverted bias state is considered in which, for example, the anode electrode 37 and the semiconductor substrate 31 are grounded and positive voltage is applied to the cathode electrode 38. At this time, the voltage applied to the cathode electrode 38 is applied to a depletion layer formed in the active layer below the n-type cathode layer 36.

Therefore, if the thickness of the active layer portion of the n-type cathode layer 36 is large or if the active layer is too thin and thus the n-type cathode layer 36 does not reach the isolation insulating film 32, a required voltage resistance cannot be realized.

The appendix circuit has the above-mentioned structure.

However, it is considered that the thickness of the polycrystalline silicon for forming the gate is required to be 0.5 $\mu$m or greater to satisfactorily lower the gate resistance of the vertical MOSFET. When a transistor is manufactured from a polycrystalline silicon, the thickness of the polycrystalline layer is required to be reduced as much as possible because the characteristic of the device can be improved in a case where the polycrystalline layer has a small thickness. Therefore, when the polycrystalline silicon gate used for the vertical MOSFET and the polycrystalline silicon transistor are integrally formed, excellent characteristics cannot be realized from the two elements. Thus, an integrated circuit in which the vertical MOSFET and the appendix circuit are integrated has not been realized yet.

Thickness

If the active layer has a large thickness, a structure, for example, V-shape groove, for isolating devices in the lateral direction must be formed. Therefore, the area of the isolating groove region is enlarged. Thus, the machining process cannot easily be performed and the effective area of the device is reduced. As a result, the cost of the integrated circuit of the high voltage device is enlarged.

If directly bonded substrates are employed to obtain a substrate comprising an active layer having a small thickness, the isolating oxide film can be thickened because it is formed by heat oxidation. Since a wafer portion, which is formed into the active layer, is formed by polishing, the thickness of the wafer cannot easily be uniformed in a case where a thin film wafer is required. Although SIMOX (Separation by Implanted Oxygen) enables a thin active layer to be obtained, the thickness of an isolating oxide film cannot be enlarged in the case where the voltage resistance is strengthened.

Note that SIMOX is a method of forming an oxide film in, for example, a silicon substrate to perform complete dielectric isolation. Specifically, oxygen ions are implanted with a density of $10^{18}$ ions/cm$^2$ or denser into a silicon substrate so that oxygen atoms are distributed into a predetermined depth. Groups of oxygen atoms in the island configuration are allowed to grow into a layer shape in a process for restoring the crystallinity of the surface of the substrate by a predetermined heat treatment. As a result, an oxide film having a thickness of about 200 nm is formed in the substrate.

Since SIMOX has the process for allowing the groups of oxygen atoms from the island configuration into the layer shape to form the oxide film as described above, SIMOX suffers from a problem in that the thickness of the oxide film cannot be reduced to be smaller than a certain thickness. That is, although a satisfactory voltage resistance can be realized if the internal oxide film has a large thickness, the oxide film distorts the upper polycrystalline silicon layer. Thus, the polycrystalline silicon layer is formed into fine crystalline grains, thus there arises a problem of crystalline defects. As a result, the mobility of, for example, the nMOS channel is lowered to about 100 cm$^2$/Vs and dispersion becomes excessive as compared with the CMOS formed on a bulk.

Difference in Manufacturing Process

The vertical power devices, such as the vertical MOSFET, are mainly manufactured by a method having the steps of forming a polycrystalline silicon gate electrode; and using an end of the gate electrode as a mask to form the channel region and the source region by the double diffusion self-alignment method. It is preferable for a lateral MOS transistor using the polycrystalline silicon that predetermined impurities be introduced into the channel region before the gate electrode is formed. Therefore, when an appendix circuit comprising the polycrystalline silicon is formed on the vertical power device, manufacturing processes cannot easily be shared. Thus, there arises a problem in that the manufacturing cost cannot satisfactorily be reduced.

As described above, a low-cost semiconductor apparatus having excellent performance cannot easily be realized by using the polycrystalline semiconductor.

If the vertical power device and an appendix circuit are integrally formed, there arises a problem in that the characteristic of the power device or that of the appendix circuit deteriorates excessively.

BRIEF SUMMARY OF THE INVENTION

An object of the present invention is to provide a low-cost semiconductor apparatus comprising a polycrystalline semiconductor layer.

In particular, an object of the present invention is to provide a semiconductor apparatus having a vertical power device and an appendix circuit formed integrally which are respectively have satisfactory characteristics.

Another object of the present invention is to provide a semiconductor apparatus which is capable of reducing electric power consumption and the device area because the ON-state resistance can be reduced even if single crystalline silicon is employed as well as the polycrystalline silicon.

In order to achieve the above-mentioned objects, according to a first aspect of the present invention, there is provided a semiconductor apparatus comprising: a vertical type semiconductor device having a first conducting type semiconductor substrate, a drain layer formed on the surface of the semiconductor substrate, a drain electrode formed on the surface of the drain layer, a second conducting type base layer selectively formed on the surface of the semiconductor substrate opposite to the drain layer, a first conducting type source layer selectively formed on the surface of the second conducting type base layer, a source electrode formed on the first conducting type source layer and the second conducting type base layer, and a gate electrode formed in contact with the first conducting type source layer, the second conducting type base layer and the semiconductor substrate through a gate insulating film; and a lateral semiconductor device having an insulating layer selectively formed on the surface of the semiconductor substrate, and a polycrystalline semiconductor layer formed on the insulating layer and having a first conducting type region and a second conducting type region, wherein the first conducting type source layer of the vertical semiconductor device and the first conducting type region of the polycrystalline semiconductor layer are simultaneously formed.

That is, the first conducting type source layer of the vertical semiconductor device and the first conducting type region of the lateral semiconductor device are formed simultaneously so that the manufacturing process is simplified while maintaining the characteristic of the device.

The semiconductor apparatus according to the present invention may have a structure such that the thickness of the gate insulating film is 600 Å or smaller. It is preferable that the thickness be 300 Å or smaller. If the thickness of the gate insulating film is 300 Å or smaller, the vertical semiconductor device can be operated with low voltage levels. Therefore, the vertical semiconductor power device and a layer semiconductor logic device, which can originally be operated with low voltage levels, can be operated by the same power source system.

The layer semiconductor device may have an arbitrary layer structure. Any one of various device, for example, an IGBT, a MOSFET, a bipolar transistor, CMOS transistor and a diode, may be formed.

For example, the lateral semiconductor device may have a first conducting type base region formed on the insulating layer, a second conducting type drain region selectively formed in the first conducting type base region, a drain electrode formed in the second conducting type drain region, a second conducting type base region selectively formed in the first conducting type base region, a first conducting type source region selectively formed in the second conducting type base region in such a manner that the first conducting type source region is not in contact with the first conducting type base region, a source electrode provided for the first conducting type source region and the second conducting type base region and a gate electrode, through a gate insulating film, formed on the second conducting type base region interposed between the first conducting type source region and the first conducting type base region, wherein the first conducting type base region, the second conducting type drain region, the second conducting type base region and the first conducting type source region are formed on the same polycrystalline semiconductor layer.

In this case, a low-cost semiconductor apparatus having the polycrystalline semiconductor layer can be realized.

The polycrystalline semiconductor layer of the lateral semiconductor device has a wavy shape formed in a direction perpendicular to a diode connecting the drain electrode and the source electrode to each other.

In this case, the wavy shape enables the width of the channel to be elongated so that the ON-state resistance is reduced.

The insulating layer may have a thickness larger than that of another region in a region below the second conducting type drain region.

In this case, a channel cannot easily be formed in the interface between the insulating layer and the first conducting type base region. Thus, the voltage resistance of the device can be improved.

As the polycrystalline semiconductor layer, a polycrystalline silicon layer is employed. The polycrystalline silicon layer is employed because of excellent crystallinity of polycrystalline silicon of a type having a thickness of 150 nm or smaller. When a CMOS is formed, it is preferable that the thickness be 100 nm or smaller, more preferably not larger than 50 nm nor smaller than 5 nm.

A polycrystalline silicon layer of the foregoing type can be formed such that an amorphous silicon layer is deposited on the insulating layer by, for example, a CVD method, followed by performing annealing at 600° C. for 20 hours to form the amorphous silicon layer into the polycrystalline form.

In general, the polycrystalline silicon layer has greater grain size in inverse proportion to the thickness thereof so that the mobility is enhanced. Therefore, the polycrystalline silicon layer may be employed to form a device, such as the IGBT requiring storage of carriers.

For example, the IGBT may be formed into a very thin polycrystalline silicon layer having a thickness of 100 nm or smaller. In this case, excellent characteristics can be realized as compared with a MOSFET. Since the carrier life time in the surface layer of the polycrystalline silicon layer deteriorates if the thickness is too small, a somewhat large thickness is required when an IGBT requiring storage of carriers is formed. Specifically, if a polycrystalline silicon layer having a large thickness of about 1 $\mu$m to 200 nm is formed, more excellent characteristics can be realized.

Therefore, it is preferable that the CMOS be formed into a polycrystalline silicon layer having a thickness of 100 nm or smaller. It is preferable that the IGBT be formed into a polycrystalline silicon layer having a thickness of 200 nm or greater.

The insulating layer below the polycrystalline semiconductor layer is usually an oxide film. It is preferable that the thickness of the oxide film be 0.5 μm or greater to obtain satisfactory voltage resistance, more preferably 1 μm or greater.

Specifically, a source region, a region in which a channel is formed and a drain region are formed in the polycrystalline semiconductor layer as portions of the CMOS transistor.

Specifically, the first conducting type source region, the second conducting type base region, the first conducting type base region and the second conducting type drain region are formed in the polycrystalline semiconductor layer as portions of the IGBT.

An a portion of an emitter region is formed in the polycrystalline semiconductor layer as a portion of the bipolar transistor.

The lateral semiconductor device may have a second conducting type low-resistance layer selectively formed between the semiconductor substrate and the insulating layer, and a wiring portion for fixing, to the same potential, the second conducting type low-resistance layer and the first conducting type source region.

The lateral semiconductor device having a junction structure for materials of different types will now be described.

The lateral semiconductor device of the foregoing type has a structure having an insulating member having a different hetero junction surface or a different work function and formed in the drift region so as to form a carrier storage layer acting similarly to a channel for electrons in the interface with the drift region in order to improve the mobility.

As a material for forming the storage layer, for example, SiC may be employed. A polycrystalline semiconductor having a band gap larger than that of polysilicon and doped into n-type can preferably be employed. Although SiGe, having a small band gap, involves a storage layer being formed therein, SiGe can be employed because electrons are able to pass through the storage layer.

Insulating materials of a type having a work function smaller than that of polysilicon is able to form a storage layer in the polysilicon layer. By performing doping a large-resistance layer, such as SIPOS (Semi-Insulating Polycrystalline Silicon) layer into the n-type portion, an electron storage layer can be formed in the polysilicon portion. SIPOS doped into the n-type may be deposited on the drift region through a thin insulating film. When it is formed through the thin insulating film, diffusion of impurities doped into the SIPOS portion into the drift region can easily be prevented.

The n-channel structure is formed as described above. When a p-channel structure is formed, it is preferable that polycrystalline layer doped into the p-type and having a wide band gap be employed. It is preferable that the insulating material be a material having a work function larger than that of polysilicon.

When the foregoing structure is employed, it is preferable that the thickness of the polysilicon layer be 200 nm or smaller. It is preferable that the thickness of the polysilicon layer below the MOS gate channel be 150 nm or smaller, more preferably 100 nm or smaller. Since the drift layer has a storage layer, the thickness is not limited as described above. A thick drift layer may be employed.

The lateral semiconductor device of the foregoing type has the following structures.

That is, a lateral semiconductor device of the foregoing type may have a first conducting type drift region formed on the insulating layer, a drain region formed on the first conducting type drift region, a drain electrode provided for the drain region, a second conducting type base region formed in the first conducting type drift region apart from the drain region, a first conducting type source region formed adjacent to the second conducting type base region, a source electrode formed in the first conducting type source region, a gate electrode, through a gate insulating film, formed on the second conducting type base region interposed by the first conducting type source region and the first conducting type drift region, and an offset channel layer having large resistance and formed on the first conducting type drift region to form a carrier storage layer in an interface with the first conducting type drift region.

In the above description, the base region is formed of the second conducting type semiconductor, but it can formed of a first conducting type semiconductor with a low carrier density.

The offset channel layer forms the carrier storage layer in the interface with the first conducting type drift region in accordance with the difference in a work function.

The lateral semiconductor device may have a first polycrystalline semiconductor layer, a second polycrystalline semiconductor layer formed in contact with the first polycrystalline semiconductor layer, having a forbidden band width which is wider than that of the first polycrystalline semiconductor layer and having substantially the same lattice constant, a source region selectively formed in the second polycrystalline semiconductor layer, a drain region formed in the second polycrystalline semiconductor layer apart from the source region, and a gate electrode formed, through a gate insulating film, in contact with the second polycrystalline semiconductor layer interposed by the source region and the drain region.

The lateral semiconductor device may have a third polycrystalline semiconductor layer selectively formed on the insulating layer, a fourth polycrystalline semiconductor layer formed on the third polycrystalline semiconductor layer, and a fifth polycrystalline semiconductor layer interposed between the third and fourth polycrystalline semiconductor layers, having a forbidden band width which is narrower than those of the third and fourth polycrystalline semiconductor layers and having substantially the same lattice constant.

The lateral semiconductor device may have a first polycrystalline semiconductor layer, a second polycrystalline semiconductor layer formed in contact with the first polycrystalline semiconductor layer, having a forbidden band width wider than that of the first polycrystalline semiconductor layer and having substantially the same lattice constant, source and drain regions formed apart from the second polycrystalline semiconductor layer for a predetermined distance, a gate electrode formed through a gate insulating film formed in contact with the second polycrystalline semiconductor layer interposed by the source and drain regions, a third polycrystalline semiconductor layer formed at a position different from those of the first and second polycrystalline semiconductor layers, a fourth polycrystalline semiconductor layer formed on the third polycrystalline semiconductor layer, and a fifth polycrystalline semiconductor layer formed between the third and fourth polycrystalline semiconductor layers, having a forbidden band width narrower than those of the third and fourth polycrystalline semiconductor layers and having substantially the same lattice constant.

The lateral semiconductor device having the specified lattice constant and forbidden band width will be supplemented. A lateral semiconductor device of the foregoing type is characterized by a polycrystalline semiconductor layer, such as silicon carbide germanium, having a forbidden band width narrower than that of the polycrystalline silicon layer and substantially the same lattice constant and employed in place of the conventional polycrystalline silicon germanium layer. Since the lattice constant is substantially the same, the lattice constant is not distorted. Since the forbidden band width is narrow, the valence layer is higher than that of the silicon layer. Moreover, the conducting layer is lowered. Therefore, when a CMOS is formed, the mobility of both p-channel and the n-channel can be improved. As a result, an excellent and special CMOS can be realized.

When it is employed as the base region of a bipolar transistor, a hetero junction transistor is realized. Therefore, superior characteristics to those of a usual bipolar transistor can be obtained.

When a CMOS and a bipolar transistor are combined to form a biCMOS transistor, the characteristics of both CMOS and the bipolar transistor can be improved. Therefore, also the characteristics of the BiCMOS can be improved.

When a silicon layer and a silicon carbide germanium layer are employed, the lattice constants can be substantially the same under conditions that the ratio of carbon is 3% to 4% with respect to 20% to 30% germanium in the silicon carbide germanium.

If the second, third and fourth polycrystalline semiconductor layers are not silicon layers, the second and fifth polycrystalline semiconductor layers are required to have a forbidden band width narrower than those of the second and third and fourth polycrystalline semiconductor layers and substantially the same lattice constant as those of the same.

The third and fifth polycrystalline semiconductor layers are employed as an emitter region and a collector region, respectively. As a matter of course, the order of the emitter region and the collector region may be inverted.

The various lateral semiconductor devices can be formed into the transistors as described above. The lateral semiconductor device is not limited to the various transistor above. It may be formed into a diode.

For example, the lateral semiconductor device may have the polycrystalline semiconductor layer having great resistance, the first conducting type region selectively formed to have a depth from the surface of the polycrystalline semiconductor layer to reach the insulating layer and having low resistance, and the second conducting type region provided for the polycrystalline semiconductor layer apart from the first conducting type region and having small resistance.

The lateral semiconductor device may contain impurities, the distribution of which has a gradient from the first conducting type region to the second conducting type region.

It is preferable that all of the above-mentioned polycrystalline semiconductor layers of the lateral semiconductor devices be subjected to a process having the steps of implanting ions with a density corresponding to the base region after amorphous silicon has been deposited and annealing is performed to form the amorphous silicon into a polycrystalline silicon layer in order to obtain satisfactory characteristic of the device.

However, the inventors of the present invention found a method with which ion implantation is permitted even after the polycrystalline silicon layer has been formed by annealing.

For example, the polycrystalline semiconductor layer of the lateral semiconductor device has a thickness larger than that of a region which is damaged when ions are implanted. Then, the polycrystalline semiconductor layer is polycrystallized after ion implantation and the annealing process.

The polycrystalline semiconductor layer of the lateral semiconductor device has a thickness not larger than the thickness of a region, which is damaged when ions are implanted, and formed by selective ion implantation using a mask and by annealing.

In either case, a portion of the crystalline region of the polycrystalline semiconductor layer is not ruptured and thus the same is able to exist after ions have been implanted. Therefore, the crystallinity can be restored by using the residual portion of the crystalline region as the core when the annealing process is performed.

When the selective ion implantation is performed by using the mask, the ion injection may be performed by setting an injection angle in order to prevent damage.

A semiconductor apparatus according to a second aspect of the present invention may have a structure having no vertical semiconductor device and composed of only the foregoing lateral semiconductor device.

For example, it is preferable that the semiconductor apparatus comprises: a silicon substrate; an oxide film formed on the silicon substrate; and a polycrystalline silicon layer formed on the oxide film, made of amorphous silicon film and by annealing performed at 1300° C. or higher. That is, amorphous silicon is allowed to grow to polycrystalline silicon by a usual annealing process at 600° C. for about 20 hours. Then, annealing is performed at 1300° C. or higher (and arbitrary temperature lower than the softening point for silicon). Thus, fine crystalline defects can be prevented. The annealing temperature is about 1300° C. to 1350° C. The annealing operation is performed for 10 minutes or longer in order to uniform heat the subject. Since high temperatures are required, the operation is performed for one hour or shorter.

By reducing the thickness of the oxide film on the silicon substrate, the stress can be reduced and the crystallinity of the polycrystalline silicon layer can be improved. The most preferably thickness of the oxide film is 5 nm or smaller to align the lower silicon substrate and the upper polycrystalline layer so as to considerably improve the crystallinity.

Other objects, features and advantages of the invention will be evident from the following detailed description of the preferred embodiments described in conjunction with the attached drawings. Note that the same reference numerals in the attached drawings represent similar elements in the same.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 13 to 18 are diagrams showing a process for manufacturing the integrated circuit according to the first embodiment;

FIG. 21 is a cross sectional view taken along line 21—21 shown in FIG. 19;

FIG. 26 is a cross sectional view taken along line 26—26 shown in FIG. 24;

FIG. 27 is a cross sectional view taken along line 27—27 shown in FIG. 24;

FIG. 34 is a cross sectional view showing a semiconductor apparatus according to a twelfth embodiment of the present invention;

FIG. 37 is a cross sectional view showing a MOSFET according to a fifteenth embodiment of the present invention;

FIG. 38 is a cross sectional view showing a MOSFET according to a sixteenth embodiment of the present invention;

FIG. 39 is a cross sectional view showing a MOSFET according to a seventeenth embodiment of the present invention;

FIG. 40 is a cross sectional view showing a MOSFET according to an eighteenth embodiment of the present invention;

FIG. 41 is cross sectional view showing a high voltage MOSFET according to a nineteenth embodiment of the present invention;

FIG. 42 is a diagram showing the structure of a band in the interface on a drift region according to the nineteenth embodiment:

FIG. 43 is a cross sectional view showing a high voltage MOSFET according to a twentieth embodiment of the present invention;

FIG. 44 is a cross sectional view showing a high voltage MOSFET according to a twenty-first embodiment of the present invention;

FIG. 45 is a cross sectional view showing a high voltage IGBT according to a twenty-second embodiment of the present invention;

FIG. 46 is a cross sectional view showing a high voltage MOSFET according to a twenty-third embodiment of the present invention;

FIG. 47 is a cross sectional view showing a thin film transistor according to a twenty-fourth embodiment of the present invention;

FIG. 50 is a cross sectional view showing a hetero junction bipolar transistor according to a twenty-fifth embodiment of the present invention;

FIG. 57 is a cross sectional view showing a semiconductor apparatus according to a thirtieth embodiment of the present invention;

FIG. 58 is a cross sectional view showing a high voltage diode according to a thirty-first embodiment of the present invention;

FIG. 59 is a graph showing distribution of densities of impurities in the high voltage diode according to the thirty-first embodiment;

FIG. 60 is a diagram showing a process for manufacturing the high voltage diode according to the thirty-first embodiment;

FIG. 63 is a graph showing distribution of densities of impurities in the high voltage diode according to the thirty-second embodiment:

FIG. 64 is a graph showing a modification of the distribution of the densities of impurities according to the thirty-second embodiment;

FIG. 65 is a diagram showing a manufacturing process for realizing the impurity density distribution shown in FIG. 63 or FIG. 64;

FIG. 76 is a cross sectional view showing a CMOS according to a thirty-eighth embodiment of the present invention;

FIGS. 77A and 77B are diagrams showing a process for manufacturing the CMOS according to the thirty-eighth embodiment;

FIG. 78 is a diagram showing a process for forming the CMOS according to the thirty-eighth embodiment;

FIG. 79 is a diagram showing a process for forming a CMOS according to a thirty-ninth embodiment of the present invention;

FIG. 80 is a diagram showing a process for forming a CMOS according to the fortieth embodiment of the present invention;

FIG. 81 is a diagram showing a process for implanting ions to a CMOS according to a forty-first embodiment of the Present invention;

FIG. 87 is a cross sectional view taken along line 87—87 shown in FIG. 86;

FIGS. 89A to 89H are diagrams showing a manufacturing process according the forty-fifth embodiment.

DETAILED DESCRIPTION OF THE INVENTION

Embodiments of the present invention will now be described with reference to the drawings.

First Embodiment

Figure 12:
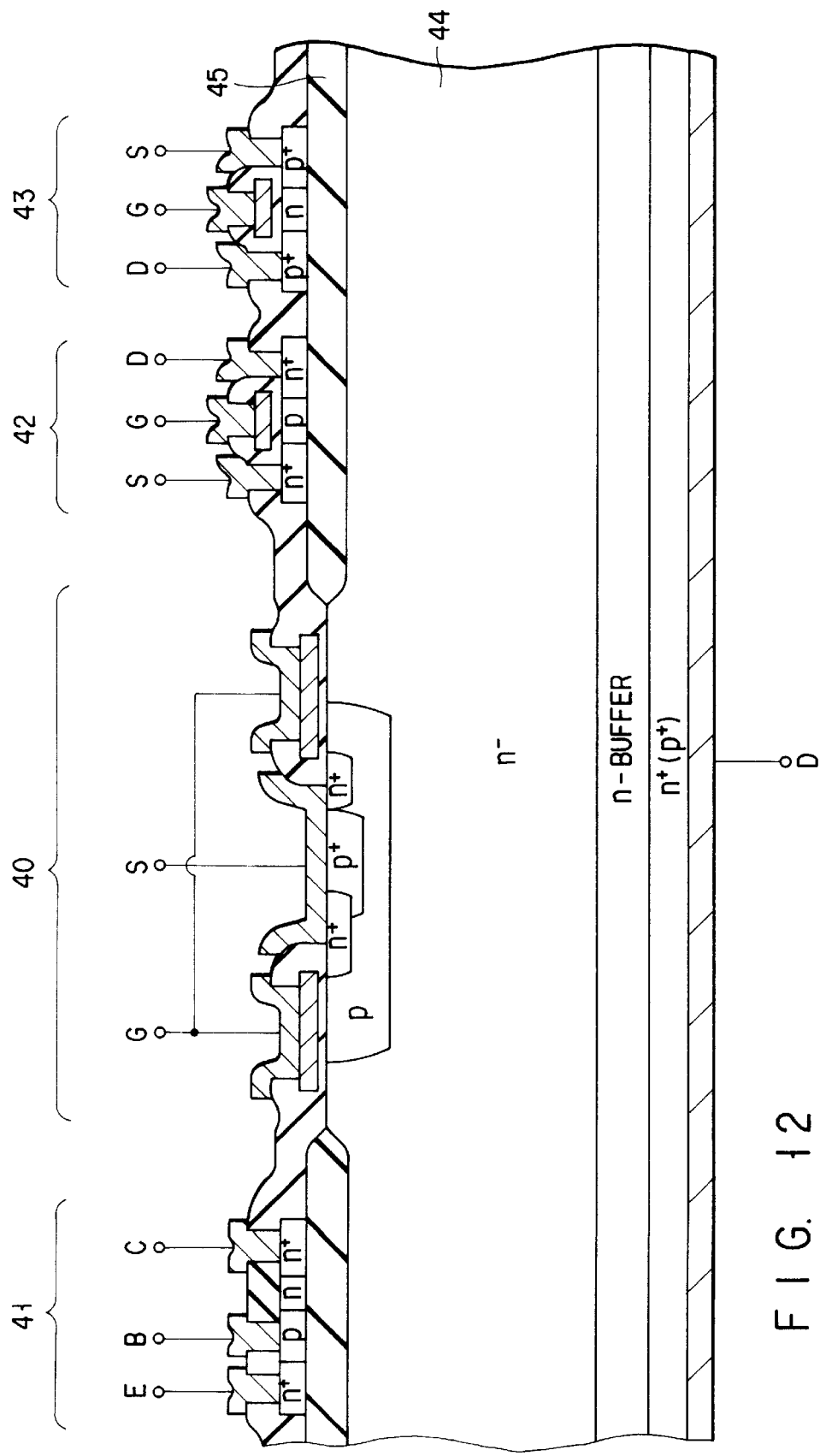
FIG. 12 is a schematic view showing the structure of an integrated circuit according to a first embodiment of the present invention and composed of a control circuit and a vertical power device.

FIG. 12 is a diagram showing the structure of an integrated circuit according to a first embodiment of the present invention and composed of a control circuit and a vertical power device. The integrated circuit has a structure such that control circuits 41 to 43 made of polycrystalline silicon are included on an insulating film 45 on the surface of a semiconductor substrate 44 having a vertical MOSFET (or an IGBT) 40 formed thereon.

A further detailed structure of the integrated circuit will now be described in the manufacturing order with reference to FIGS. 13 to 18. FIGS. 13 to 18 are diagrams showing a process for manufacturing the integrated circuit according to this embodiment. As shown in FIG. 13, the field oxide film 45 having a thickness of about 500 nm to 1 $\mu$m is, by oxidation, formed on the surface of the n-type substrate 44 made of single crystalline silicon. The field oxide film 45 may be formed by a LOCOS method such that only regions which will be formed into the control circuits are oxidized. The field oxide film 45 may be formed such that the overall surface of the n-type substrate 44 is oxidized, and then a portion of the oxide film in the region corresponding to the p-type base layer of the vertical MOSFET 40 is removed by etching.

On the other hand, n-type impurities are diffused on the reverse side of the substrate 44, and then an n-type buffer layer 46 and an n+ drain layer 47 are formed. If a p+ drain layer is formed by diffusion in place of the n+ drain layer 47, a vertical IGBT is formed in place of the vertical MOSFET 40. Note that the order of forming the field oxide film 45 on the right side and the n-type buffer layer 46 and the n+ (or p+) drain layer 47 on the reverse side is not limited.

A process for forming polycrystalline silicon for forming the control circuits 41 to 43 will now be described. On the overall surface of the field oxide film 45 of the n-type substrate 44, there is formed an amorphous silicon layer having a thickness about 150 nm or smaller, more preferably about 50 nm or smaller.

If either side control circuit 42 is formed into the nMOS structure from the amorphous silicon layer, for example, B ions are implanted. At this time, the portion of the amorphous silicon layer for forming a pMOS in the other control circuit 43 is subjected to one of the following processes: (a) a process in which doping is not performed; (b) a process in which B ions are implanted; and (c) a process in which P ions are implanted.

After ions have been implanted into the amorphous layer, the amorphous silicon layer is formed into polycrystalline shape by annealing so that a polycrystalline silicon layer is formed. The annealing process is performed at temperature in a range from 600° C. to 800° C. for 2 hours to 20 hours. If the crystalline grain size is enlarged in order to improve the characteristic as the transistor, a process for maintaining the subject at 1100° C. or higher is added. Although the order of the ion implantation and the annealing process is not limited, more satisfactory characteristic can be obtained in a case where annealing is performed after ions have been implanted.

A portion except the control circuits is removed by etching so that polycrystalline silicon layers 48 to 50 are selectively formed, as shown in FIG. 14.

Then, a resist mask is used to selectively implant p-type impurities from the surface so that a p-type base region (well) 51 is formed, as shown in FIG. 15.

Figure 16:
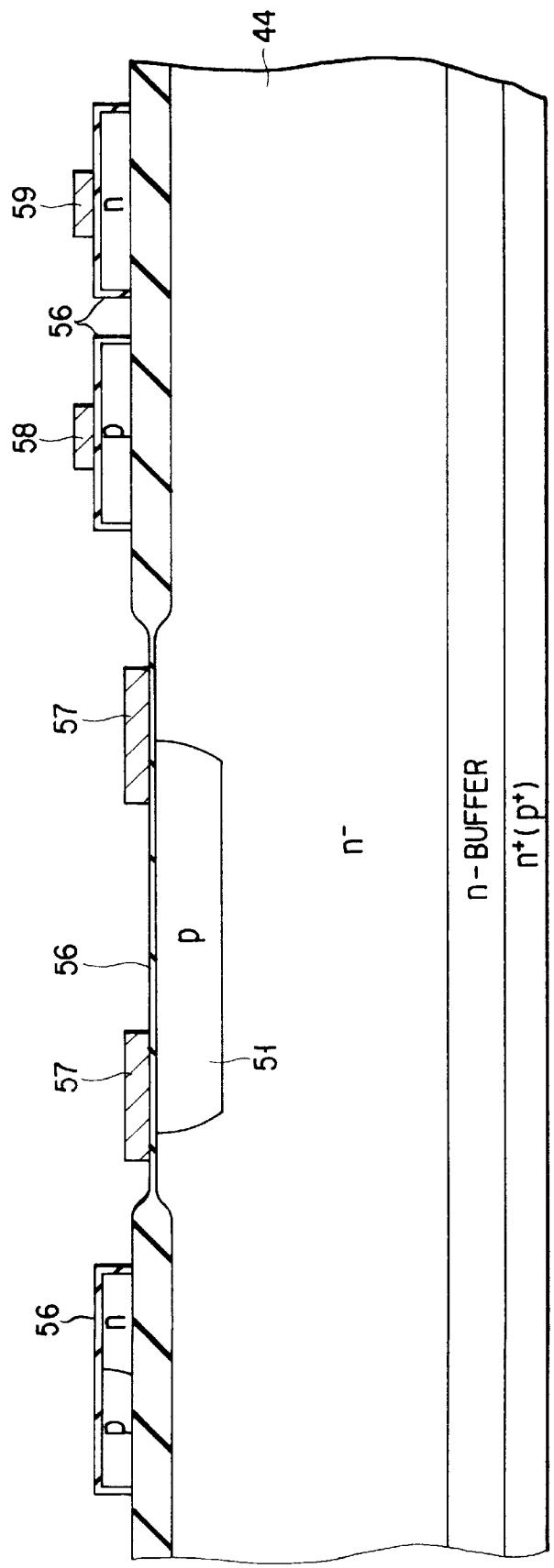

Then, a gate oxide film 56 having a thickness of 200 Å is formed on the overall surface, as shown in FIG. 16. Moreover, a polycrystalline silicon layer having a thickness of 300 nm to 1 μm is formed on the surface of the substrate adjacent to the gate oxide film 56. By patterning the polycrystalline silicon layer, gate electrodes 57 to 59 of the vertical MOSFET 40 and the thin film transistors 42 and 43 are formed.

Figure 17:
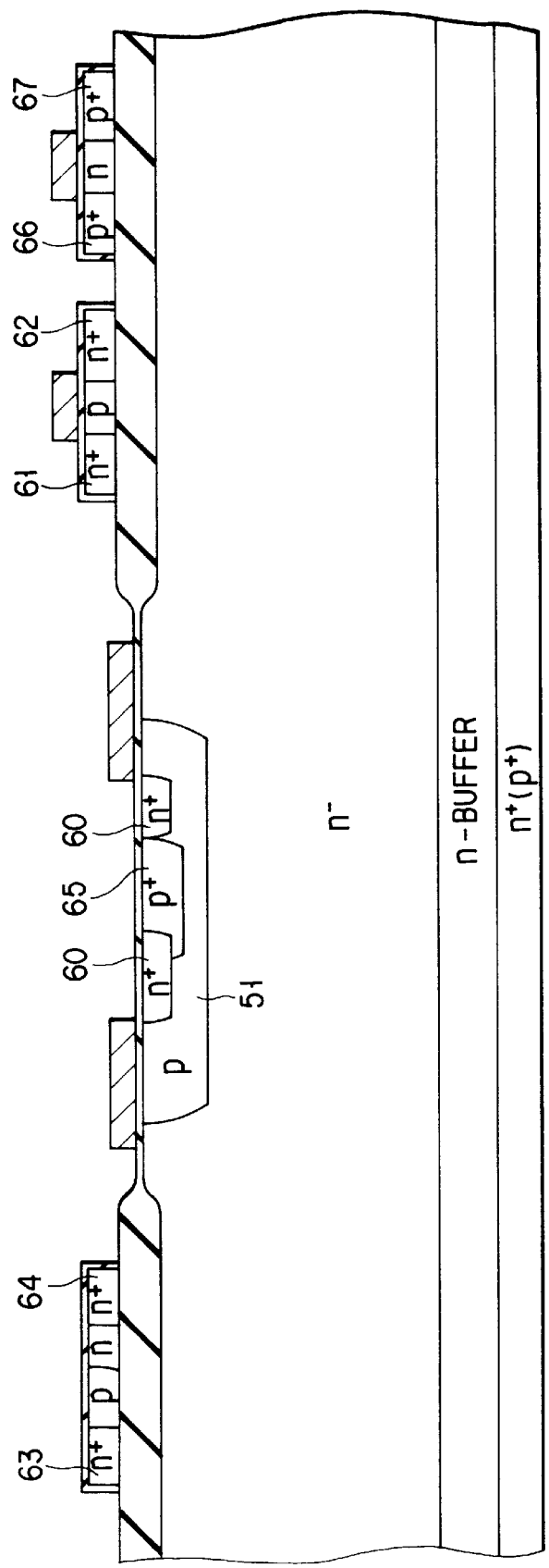

Then, the gate electrodes and the resist are used as masks when n-type and p-type impurities are implanted with a large dose quantity of about $10^{15}$ cm$^{-2}$ so that source (emitter) and drain (collector) regions 60 to 67 of the vertical MOSFET 40 and the thin film transistors 41 to 43 are formed, as shown in FIG. 17. Reference numeral 65 represents a contact region of the p-type base region 51. The gate oxide film 56 having a thickness of 250 Å or smaller permits implanted ions to pass through.

Finally, an oxide film 68 is deposited on the overall surface of the substrate, and then the contact hole is opened so that electrodes 69 to 79 are formed. When a drain electrode 80 has been formed on the reverse side, the semiconductor apparatus according to this embodiment is manufactured, as shown in FIG. 18.

As described above, according to this embodiment, each of the process shown in FIG. 17 for forming regions in which various impurities are diffused (ion implanting regions) shown in FIG. 17 and the process shown in FIG. 16 for forming a region in which the electrodes are formed in the process for manufacturing the vertical MOSFET 40 and the thin film transistors 41 to 43 can be shared. Therefore, the manufacturing cost can be reduced.

Hitherto, the p-type well region and the n-type source region in the p-type well region of the vertical MOSFET have been formed by a self-alignment process using a gate electrode. However, the vertical MOSFET according to the present invention is, different from the conventional method, manufactured such that the gate electrodes are formed after the p-type well region has been formed and no self-alignment process is performed. The reason for this is that errors can be prevented even if the self-alignment is not performed because of the recent improvement in the precise machining technique.

The conventional self-alignment process, involving the n-channel formed between the substrate 44 and the n-type source region being located in a portion of the p-type well region in which the densities of impurities have a gradient, has a problem in that the characteristics of the MOSFETs in one chip can easily be scattered. On the other hand, the manufacturing process according to the present invention causes the n-channel of the vertical MOSFET 40 to be located in a portion of the p-type well region 51 in which the densities of impurities are distributed in a flat form. Therefore, the uniformity of the characteristics of the respective MOSFET can be improved.

Although the thickness of the gate oxide film 56 of the vertical MOSFET 40 may be 600 Å, it is preferable that the thickness be 500 Å or smaller, more preferably 250 Å or smaller and most preferably 200 Å or smaller.

The reason for this will now be described. The CMOS 42 and CMOS 43 are used in the logic system of the device. The logic system is structured to determine "1" and "0" signals and permitted to have a logic power source which may be changed in a range from 4 V to 7 V. On the other hand, the vertical power MOSFET 40 has a possibility that the ON-state resistance is enlarged due to enlargement of the channel resistance when the gate voltage has been changed to 4 V attributable to change in the logic power source in a case where the gate voltage is rated to 5 V. Therefore, the integrated circuit, such as the semiconductor apparatus according to the present invention, in the form in which the vertical power device 40 and the control circuits 41 to 43 are integrated is required to assure the ON-state of the vertical power MOSFET to be a small value even if the gate voltage is 4 V. Therefore, the most preferable thickness of the gate oxide film 56 is 200 Å or smaller.

Likewise, the vertical MOSFET 40 can be driven by a voltage which is lower than a drive voltage of the control circuits 41 to 43, because the oxide film on the single-crystalline silicon has a thickness which is less than the thickness of the polycrystalline silicon, and the gate oxide film 56 is simultaneously formed on the single-crystalline silicon and the polycrystalline silicon.

As a result, the integrated circuit according to the present invention is able to operate all of the vertical power device and the control circuits by a 5 V power supply system.

Modification of First Embodiment

A modification of the first embodiment is a modification of the foregoing manufacturing process structured such that the order of the annealing process for the polycrystalline silicon layer and the ion implantation process are interchanged. That is, the amorphous silicon layer is annealed so that polycrystalline silicon is formed. Then, B ions are implanted into the polycrystalline silicon layer. When B ions are implanted, B ions are implanted also into the p-type well region.

According to this modification, the p-type regions of the control circuits 41 to 43 and the p-type well regions of the vertical MOSFET 40 can simultaneously be formed. Therefore, the manufacturing cost can furthermore be reduced in addition to the effects obtainable from the first embodiment.

Semiconductor apparatus according to second to forty-first embodiments of the present invention will now be described. The vertical MOSFET (or the IGBT) 40 is commonly employed in the semiconductor apparatus according to each of the following embodiments. Moreover, the lateral polycrystalline silicon devices serving as the appendix circuits (the control circuits) are formed into various devices, such as CMOS, BiTr, lateral IGBT, lateral MOSFET or a lateral diode. In order to simplify the description, the vertical MOSFET (or IGBT) 40 is omitted from description. Then, embodiments of various devices each of which is formed on an insulating film will now be described.

Second Embodiment

Figure 19:
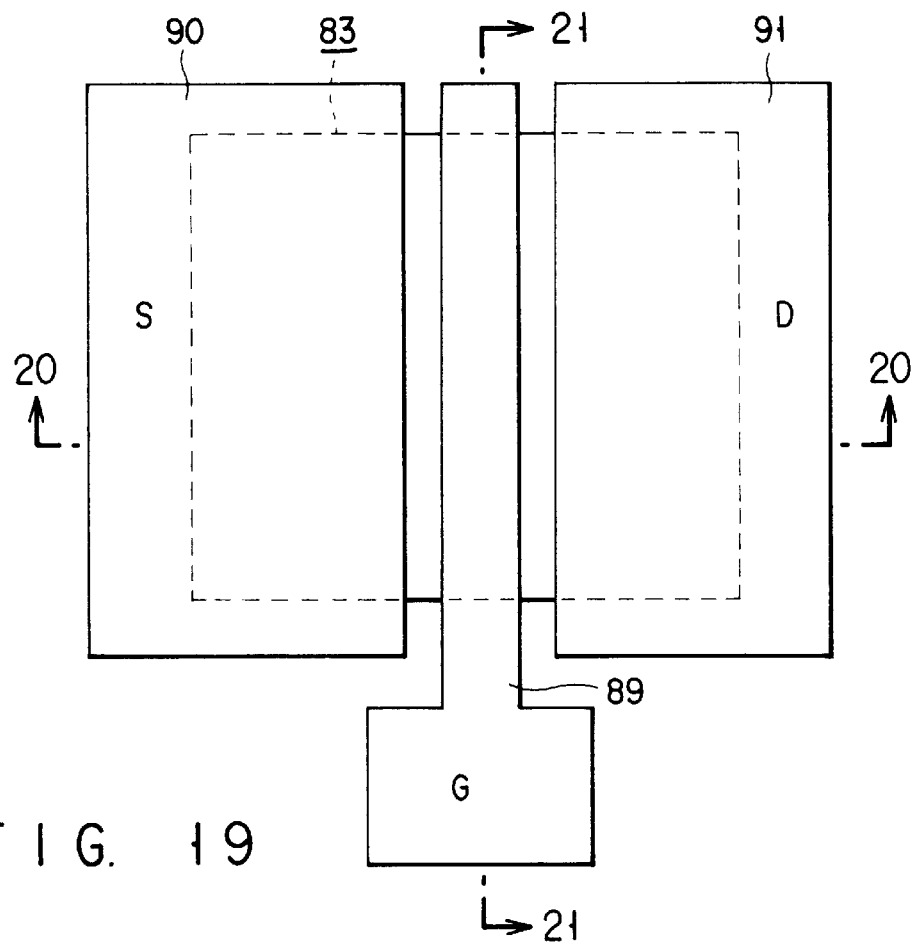
FIG. 19 is a plan view showing a MOSFET according to a second embodiment of the present invention.
Figure 20:
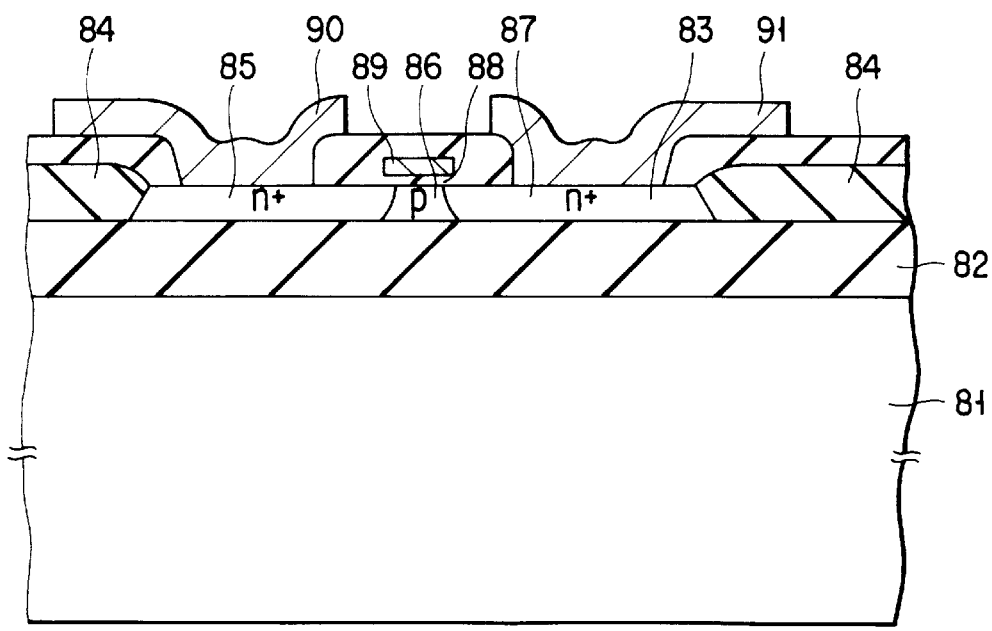
FIG. 20 is a cross sectional view taken along line 20—20 shown in FIG. 19.

FIG. 19 is a plan view showing a MOSFET according to a second embodiment of the present invention. FIG. 20 is a cross sectional view taken along line 20—20 shown in FIG. 19. FIG. 21 is a cross sectional view taken along line 21—21 shown in FIG. 19. The MOSFET has a structure such that an oxide film 82 and single-crystalline or polycrystalline thin film semiconductor layer 83 are formed sequentially on a substrate 81. The thin film semiconductor layer 83 is isolated from surrounding regions by an insulating film 84 serving as a device isolating region. The thin film semiconductor layer 83 is formed by arranging an n source region 85, a p-type base region 86 and n-type drain region 87.

A gate electrode 89 is formed on the p-type base region 86 through a gate insulating film 88. A source electrode 90 is formed on the n⁺ source region 85, while a drain electrode 91 is formed on the n-type drain region 87.

When voltage higher than a threshold value is applied to the gate electrode 89 in a state where positive voltage is applied to the drain electrode 91 and negative voltage is applied to the source electrode 90, an n-type channel is formed on the surface of the p-type base region 86 so that an electric current flows between the drain and the source.

Figure 10:
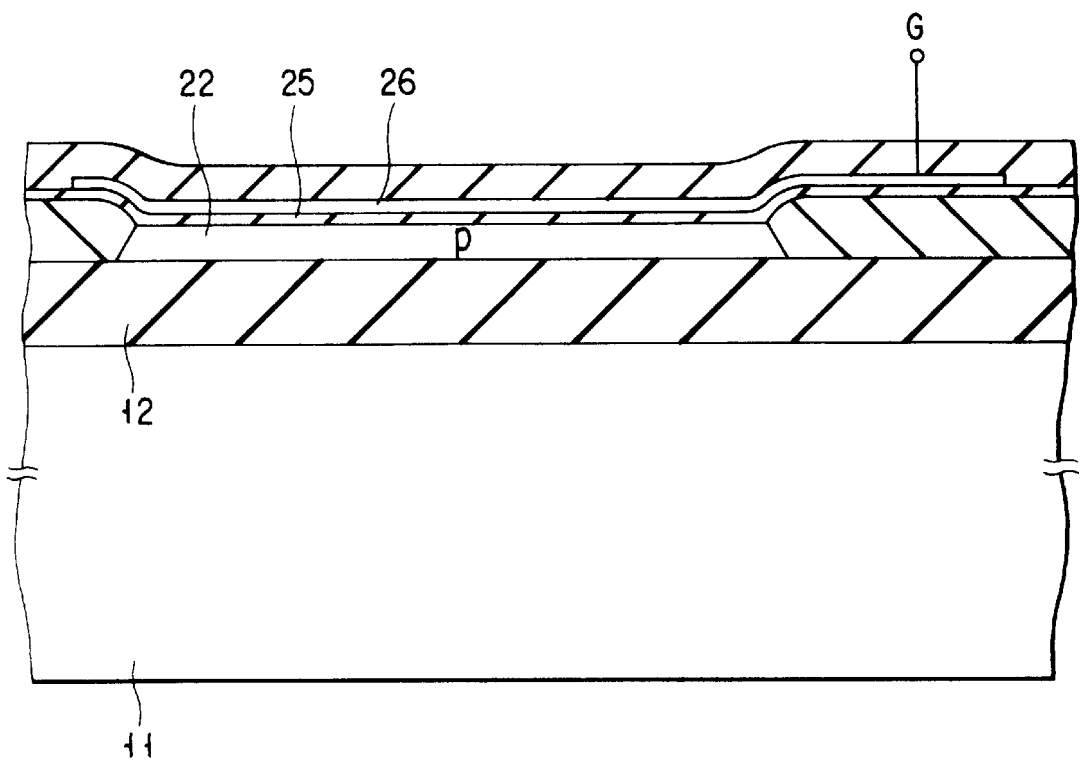
FIG. 10 is a is a cross sectional view taken along line 10—10 shown in FIG. 8.
Figure 11:
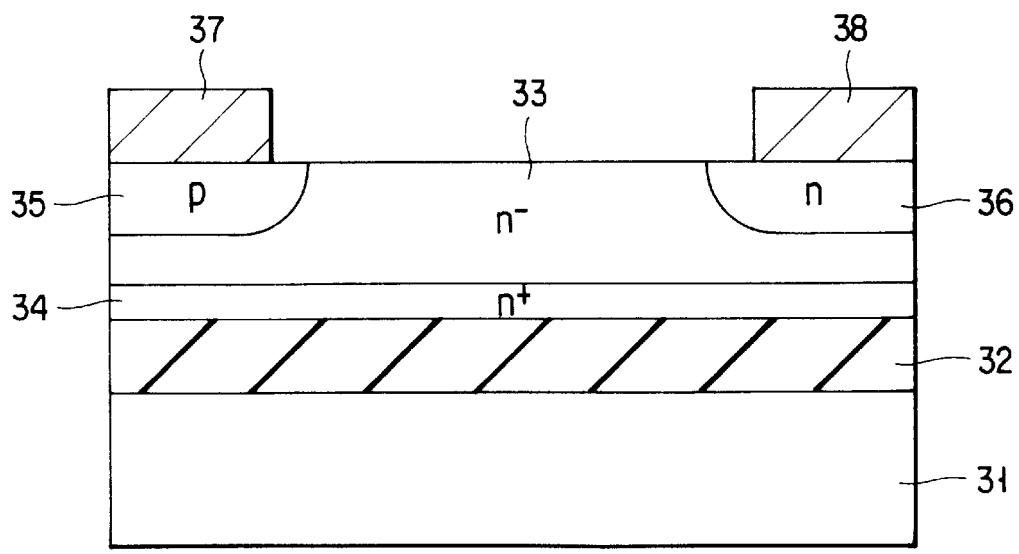
FIG. 11 is a cross sectional view showing a conventional lateral high voltage diode formed by dielectric isolation.

A cross section taken along the gate electrode 89 and running perpendicular to the direction in which the electric current flows is, as shown in FIG. 21, such that the p-type base region 86, the gate insulating film 88 and the gate electrode 89 have wavy cross sectional shapes because of the existence of the wavy surface of the oxide film 82. As described above, the width of the channel is substantially widened as compared with the conventional structure shown in FIG. 10, the ON-state resistance can be reduced.

It is preferable that the wavy shape is not small wavy shape of the order of nm but the same has size greater than tens of nm in order to effectively enlarge the width of the channel. In order to cause the wavy surface of the oxide film 82 to reflect on the top surface of the thin film semiconductor layer 83, it is preferable that the wavy shape has size similar to or greater than the thickness of the thin film semiconductor layer 83.

The lateral semiconductor device, such as the above-mentioned thin film transistor, may be applied to a structure in which it is formed on the surface of a vertical power device through a field oxide film to form a peripheral circuit. The field oxide film corresponds to the (embedded) oxide film 82. A method of manufacturing the wavy oxide film will now be described in a case where a field oxidation is performed. A stripe pattern is used to LOCOS-oxidize a region of a substrate in which a thin film transistor will be formed, so that an oxide film having the wavy surface as shown in FIG. 21 is formed. In this case, a wavy portion having size about ½ of the thickness of the field oxide film can be formed. In a case of a field oxide film having a thickness of 1 μm, a wavy portion having size about 500 nm can be formed. In order to effectively elongate the width of the channel, it is preferable that the period of repetition of the stripe pattern be about one to several times the size of the wavy portion.

Third Embodiment

Figure 22:
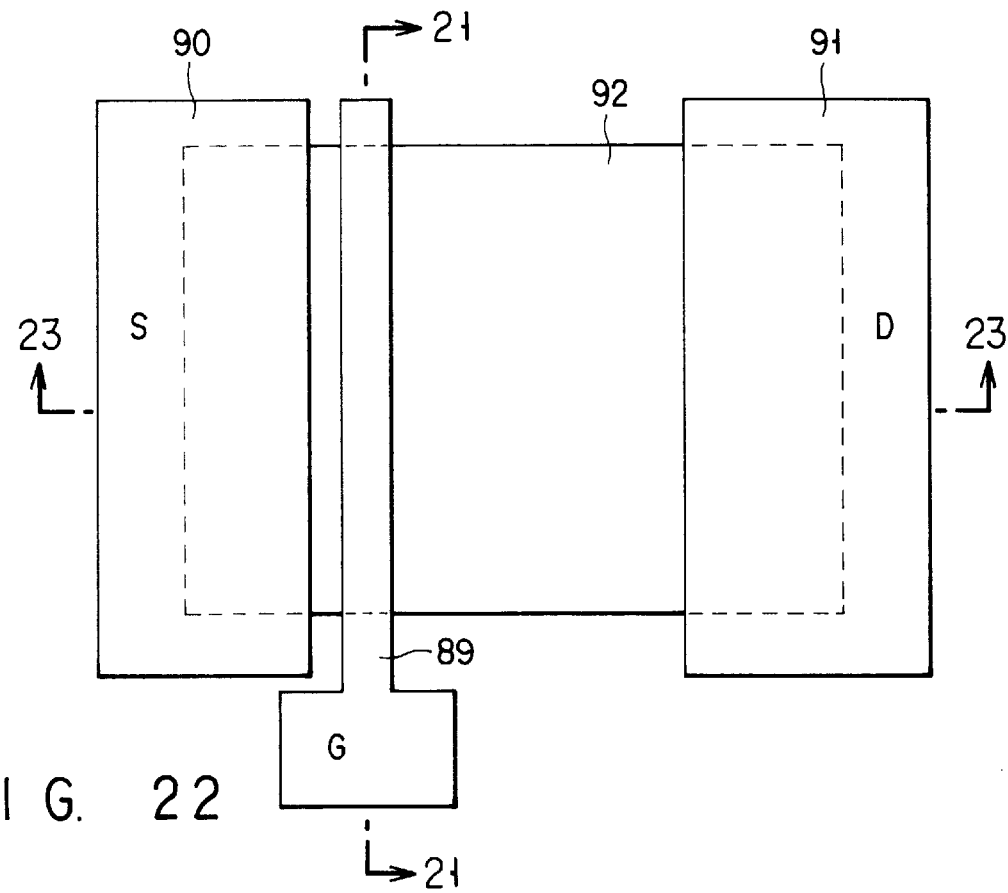
FIG. 22 is a plan view showing an IGBT which is a modification of the structures shown in FIGS. 19 to 21.
Figure 23:
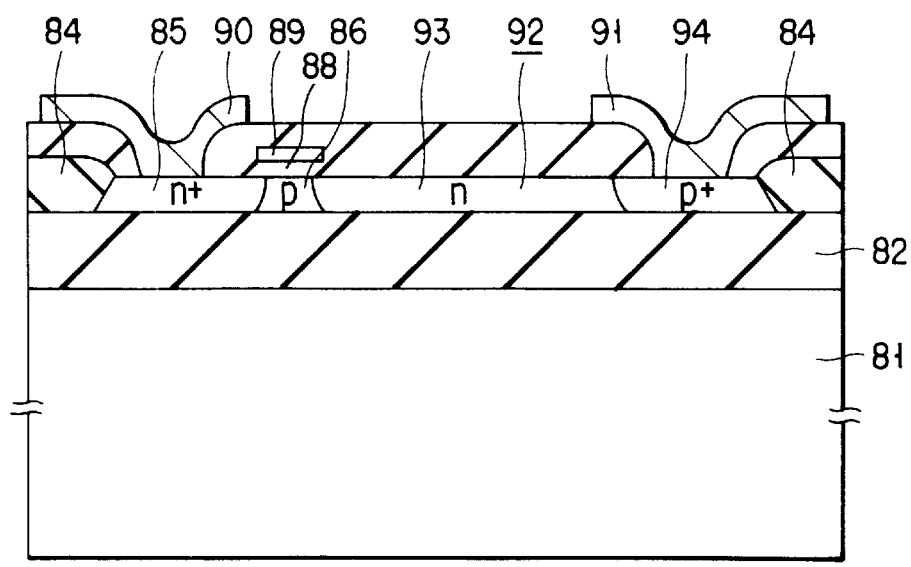
FIG. 23 is a cross sectional view taken along line 23—23 shown in FIG. 22.

FIG. 22 is a plan view showing an IGBT having a structure of modification of the structures shown in FIGS. 19 to 21. FIG. 23 is a cross sectional view taken along line 23—23 shown in FIG. 22. A thin film semiconductor layer 92 has an n⁺ source region 85, a p-type base region 86, an n-type base region 93 and a p-type drain region 94 which are formed in parallel. The IGBT has a structure such that the channel portion has a wavy cross sectional shape similarly to the structure shown in FIG. 21. Therefore, the width of the channel is enlarged substantially. As a result, the channel resistance can be reduced and therefore the ON-state resistance can be reduced similarly to the second embodiment.

Although the second and third embodiments are structured to form the n-channel MOSFET, the structure of the embodiments may, of course, be employed to form a p-channel device.

Fourth Embodiment

Figure 24:
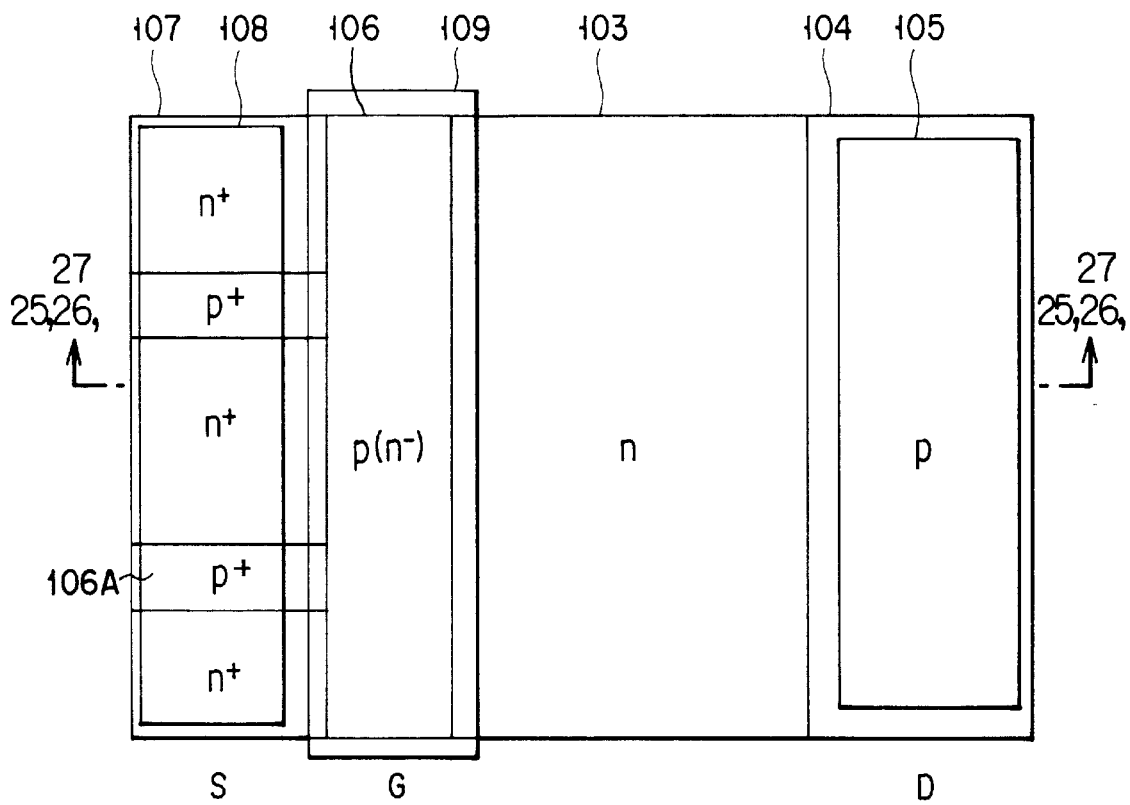
FIG. 24 is a plan view showing an IGBT according to a fourth embodiment of the present invention.
Figure 25:
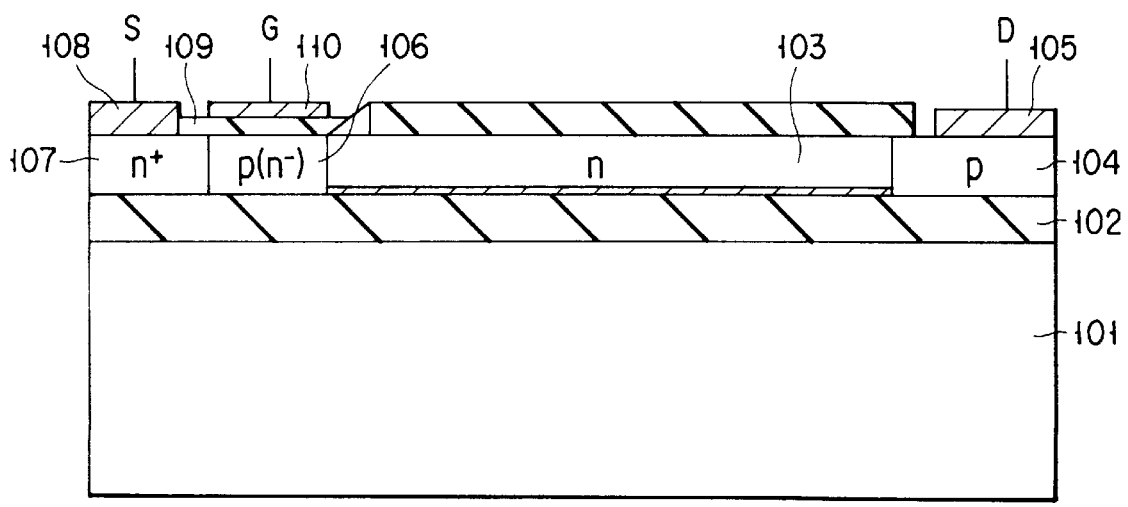
FIG. 25 is a cross sectional view taken along line 25—25 shown in FIG. 24.

FIG. 24 is a plan view schematically showing the structure of an IGBT according to a fourth embodiment of the present invention. FIG. 25 is a cross sectional view taken along line 25—25 shown in FIG. 24 showing the IGBT. The IGBT according to this embodiment has a SOI substrate and structured such that an embedded oxide film 102 and an n-type base region 103 are sequentially formed on the polycrystalline silicon substrate 101.

Specifically, the n-type base region 103 has a structure such that amorphous silicon having a thickness of 0.1 μm is formed on the embedded oxide film 102 by the CVD method. The formed amorphous silicon is annealed at 600° C. for 20 hours so that the crystalline grains are enlarged.

In the n-type base region 103, a p-type drain region 104 is selectively formed from the surface of the n-type base region 103 to the embedded oxide film 102. A drain electrode 105 is formed on the p-type drain region 104.

Similarly, in the n-type base region 103, a p (or an n⁻) type base region 106 is selectively formed from the surface of the n-type base region 103 to the embedded oxide film 102. In the p-type base region 106, an n⁺ source region 107 and p⁺ region 106A are selectively formed from the surface of the p-type base region 106 to the embedded oxide film 102.

A common source electrode 108 is selectively formed on the p⁺ region 106A and the n⁺ source region 107.

A gate insulating film 109 is formed in the base portion of the p-type base region 106, a portion of the n⁺ source region 107 and the n-type base region 103. A gate electrode 110 is formed on the gate insulating film 109 to be opposite to the base portion of the p-type base region 106.

The operation of the IGBT having the foregoing structure will now be described.

When positive voltage is applied to the gate electrode 110, electrons appear in the surface region of the p-type base region 106 directly under the gate in proportion to the positive voltage. Thus, the surface of the p-type base region 106 is inverted to the region of the electrons. The inverted region is formed into the channel so that the n⁺ source region 107 and the n-type base region 103 are short-circuited.

When positive voltage is applied to the drain electrode 105 and negative voltage is applied to the source electrode 108, electrons are supplied from the source electrode 108 to be implanted into the n-type base region 103 through the n$^+$ source region 107 and the channel. As a result, positive holes are injected from the p-type drain region 104 into the n-type base region 103. Since the positive holes are injected, conduction modulation takes place in the n-type base region 103 such that electrons and positive holes exist at substantially the same densities to set off their charges. Thus, the ON-state resistance is reduced and a conducted state is realized. As a result, electrons in the n-type base region 103 is allowed to flow to the drain electrode 105 through the p-type drain region 104. The positive holes in the n-type base region 103 are allowed to flow into the source electrode 108 through the p-type base region 106.

Since the p-type drain region 104 is in contact with the embedded oxide film 102 in the above-mentioned conducted state, the lower surface of the n-type base region 103 is made to be p-channel when the potential of the drain electrode 105 has been raised. Thus, the p-type drain region 104 and the p-type base region 106 are short-circuited. Therefore, an optimum structure having voltage resistance of about 50 V can be realized though extremely strong voltage resistance cannot be obtained.

As described above, according to the fourth embodiment, the n-type base region 103, the p-type drain region 104, the p-type base region 106 and the n$^+$ source region 107 are formed on the same polycrystalline semiconductor layer. Therefore, a low cost semiconductor apparatus having the polycrystalline semiconductor layer can be realized.

Fifth Embodiment

An IGBT according to a fifth embodiment of the present invention will now be described with reference to the drawings. FIG. 26 is a cross sectional view taken along line 26—26 shown in FIG. 24 and schematically showing the structure of the IGBT according to this embodiment. The same elements as those shown in FIGS. 24 and 25 are given the same reference numerals and the same elements are omitted from description. Then, the different portions will now be described.

That is, the apparatus according to this embodiment is a modification of the structure according to the fourth embodiment to prevent short circuit between the p-type drain region 104 and the p-type base region 106. Specifically, epitaxial growth or deposition is used to omit the p-type drain region 104 and a p-type drain layer 104a is, in place of the p-type drain region 104, formed on the n-type base region 103. as shown in FIG. 26.

As a result, the potential of the drain electrode 105 is raised in a conducted state. Even if the lower surface of the n-type base region is made to be p-channel, the short circuit as is experienced with the fourth embodiment can be prevented such that the p-type drain layer 104a and the p-type base region 106 are not short-circuited because the p-type drain layer 104a is not in contact with the embedded oxide film 102.

Therefore, a high voltage device having resistance of 200 V can be realized.

According to the above-mentioned fifth embodiment having the p-type drain layer 104a formed on the n-type base region 103, short circuit between the p-type drain layer 104a and the p-type base region 106 can be prevented. Thus, the voltage resistance of the device can be improved.

Sixth Embodiment

An IGBT according to a sixth embodiment of the present invention will now be described with reference to the drawings. FIG. 27 is a cross sectional view schematically showing the structure of the IGBT according to this embodiment and taken along line 27—27 shown in FIG. 24. The same elements as those shown in FIGS. 24 and 25 are given the same reference numerals and the same elements are omitted from the description. Then, different portions will now be described.

That is, the apparatus according to this embodiment is a modification of the structure according to the fourth embodiment arranged to prevent short circuit between the p-type drain region 104 and the p-type base region 106. Specifically, the embedded oxide film 102 is, by LOCOS (Local Oxidation of Silicon), previously formed thickly only at the position at which the embedded oxide film 102 is in contact with the p-type drain region 4.

As a result, the voltage for forming the p-channel is raised in the embedded oxide film 102 at the position of contact with the p-type drain region 104. Therefore, the p-channel cannot easily be formed. Therefore, short circuit between the p-type drain region 104 and the p-type base region 106 experienced with the fourth embodiment can be prevented.

As a result, a high voltage device can be realized.

As described above, according to the sixth embodiment, the thickness of the region of the embedded oxide film 102 below the p-type drain region 104 has a large thickness. Therefore, the p-channel formed in the interface between the embedded oxide film 102 and the n-type base region 103 does not reach the p-type drain region 104. As a result, the voltage resistance of the device can be improved.

Seventh Embodiment

Figure 28:
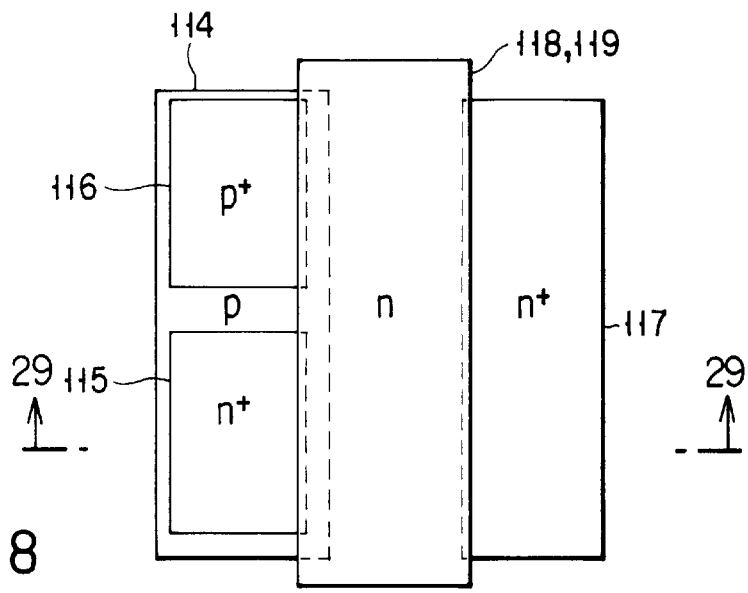
FIG. 28 is a plan view showing a bipolar transistor according to a seventh embodiment of the present invention.
Figure 29:
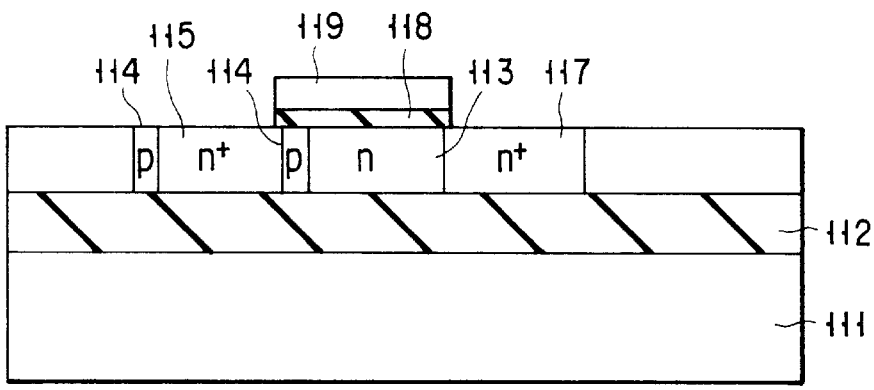
FIG. 29 is a cross sectional view taken along line 29—29 shown in FIG. 28.

A bipolar transistor according to a seventh embodiment of the present invention will now be described with reference to the drawings. FIG. 28 is a plan view schematically showing the structure of the bipolar transistor according to this embodiment. FIG. 29 is a cross sectional view showing the bipolar transistor according to this embodiment and taken along line 29—29 of FIG. 28. The bipolar transistor according to this embodiment comprises a polycrystalline silicon SOI substrate and structured such that an embedded oxide film 112 is formed on a polycrystalline silicon substrate 111.

An n-type collector region 113 is formed on the embedded oxide film 112. The quality of the n-type collector region 113 is improved by annealing as described later.

Then, a diffusion process using a mask is performed to selectively form a p-type base region 114 in the n-type collector region 113. A similar diffusion process using a mask is performed so that an n$^+$ emitter region and a p$^+$ base extracting region 116 are selectively formed in the p-type base region 114. Moreover, an n$^+$ collector extracting region 117 is selectively formed in the n-type collector region 113.

On a region from an end of the n$^+$ emitter region and an end of the p$^+$ base extracting region 116 to an end of the n$^+$ collector extracting region 117 through the p-type base region 114 and the n-type collector region 113, there is formed a gate electrode 119 through a gate insulating film 118.

It is preferable that the embedded oxide film 112 has a thickness larger than 1 μm in order to enlarge the voltage resistance of the high voltage device. If voltage resistance of 200 V is required, the thickness is made to be 2 μm or greater.

In the n-type collector region 113, amorphous silicon is deposited on the embedded oxide film 112 to have a thickness about 100 nm. Then, the amorphous silicon layer is annealed at 600° C. for 20 hours, and then annealed at high temperatures not lower than 1000° C. in order to further improve the quality of the layer. The thickness of the amorphous which is initially deposited is determined to make the thickness of the polycrystalline silicon layer which is finally formed blow the MOSFET gate insulating film 118 to be 100 nm or smaller, preferably 50 nm or smaller.

Since the thickness of the polycrystalline silicon layer is made to be 500 nm or smaller and the same is annealed at 1000° C. as described above, the grain size of the polycrystalline silicon can be enlarged so that the crystallinity is improved. Thus, the known double diffusion method is used to manufacture a bipolar t or having an excellent characteristic.

Eighth Embodiment

Figure 30:
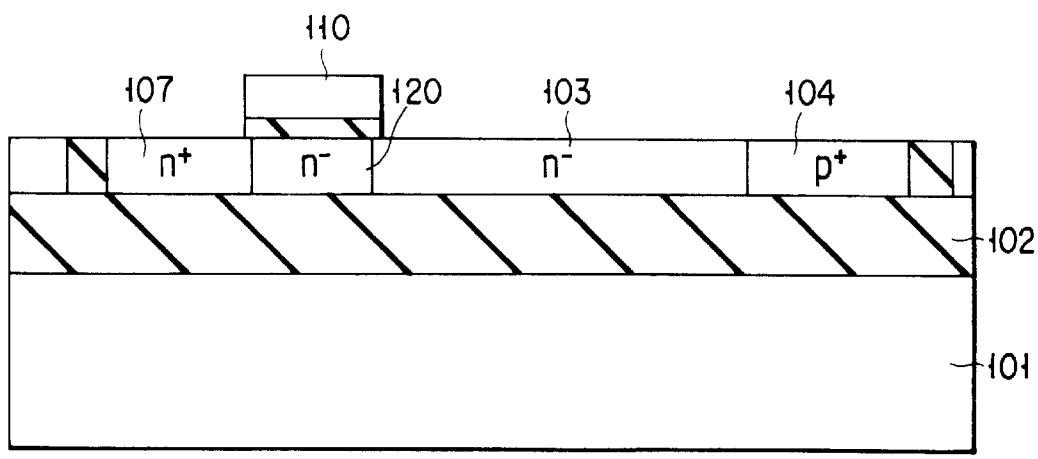
FIG. 30 is a cross sectional view showing an IGBT according to an eighth embodiment of the present invention.

IGBT according to an eighth embodiment of the present invention will now be described with reference to the drawings. FIG. 30 is a cross sectional view schematically showing the structure of the IGBT according to this embodiment. The same elements as those shown in FIGS. 24 and 25 are given the same reference numerals and the same elements are omitted from description. The different portions will now be described.

That is, the apparatus according to this embodiment has a structure which is a modification of the structure according to the fourth embodiment and arranged to strengthen the voltage resistance. Specifically, the apparatus has, as shown in FIG. 30, an n⁻ base region 120 formed on the embedded oxide film 102. The n-type base region 103 and the n⁺ source region 107 on the two sides of the n⁻ base region 120 are formed by implanting phosphorous ions.

The quantity of phosphorous ions is $1\times10^{11}/cm^2$ to $1\times10^{13}/cm^2$. Since the activation ratio of ions implanted into the polycrystalline silicon is restrained, the optimum quantity of dose is made to be larger as compared with that required for the crystalline silicon.

If an IGBT is formed by implantation of phosphorous ions as described above, a high voltage IGBT can be realized.

Ninth Embodiment

Figure 31:
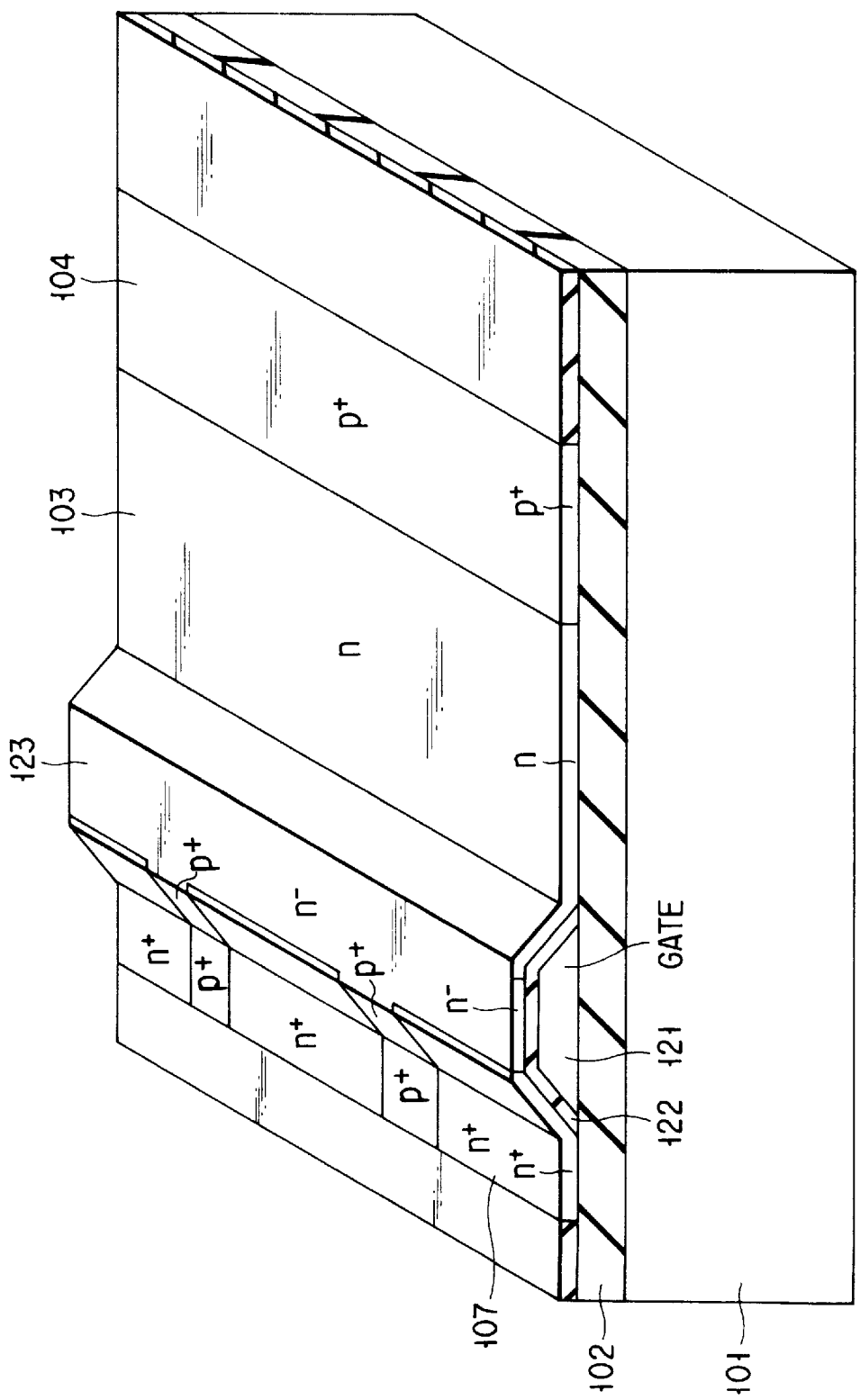
FIG. 31 is a perspective view showing the structure of a semiconductor apparatus according to a ninth embodiment of the present invention.

A semiconductor apparatus according to a ninth embodiment of the present invention will now be described with reference to the drawings. FIG. 31 is a perspective view schematically showing the structure of the semiconductor apparatus according to this embodiment. The same elements as those shown in FIG. 25 are given the same reference numerals and the same elements are omitted from description. The different portions will now be described.

That is, the apparatus according to this embodiment has a structure which is a modification of the structure according to the fourth embodiment such that a gate electrode is formed in the lower portion of a polycrystalline silicon layer. Specifically, as shown in FIG. 31, the apparatus has a gate electrode 121 selectively formed on the embedded oxide film 102 and a gate insulating film 122 formed on the gate electrode 121 in place of the gate insulating film 109 and the gate electrode 110 formed on the polycrystalline silicon layer shown in FIG. 25. Note that a gate extracting electrode to be connected to the gate electrode 121 is omitted from illustration.

The gate electrode 121 is structured such that a polysilicon gate having a thickness of 0.5 μm is selectively formed on the embedded oxide film 102 and the ends of the polysilicon gate are tapered by a PEP (Photo-Etching Process).

The gate insulating film 122 is formed to have a thickness of 50 nm because the gate electrode 121 is oxidized from its surface.

The polycrystalline silicon layers (103, 104, 107 and 123) are formed such that amorphous silicon layer having a thickness of 0.1 μm is formed on the embedded oxide film 102 and the gate insulating film 122 by the CVD method. The amorphous above is annealed at 600° C. for 20 hours so that the grain size is enlarged and then an n⁻ base region 123 is formed. By using an ion implanting method, the n⁺ source region 107, the n-type base region 103 and the p-type drain region 104 are selectively formed in the n⁻ base region 123.

Since the polycrystalline silicon layer is not directly oxidized because of the above-mentioned structure, a thin oxide film is not formed in the crystalline interface so that mobility is enhanced. By forming the gate electrode, which is a lower portion, with the same polycrystalline silicon as that for the gate electrode for the vertical device, the amorphous silicon layer is deposited after the gate electrode has been formed. Therefore, the IGBT can be formed without high temperature heat treatment.

Therefore, a phenomenon in which impurities are diffused at high speed in the crystalline interface attributable to the high temperature heat treatment performed after doping impurities into the polycrystalline silicon can be prevented. Thus, the quality can be improved.

Tenth Embodiment

Figure 32:
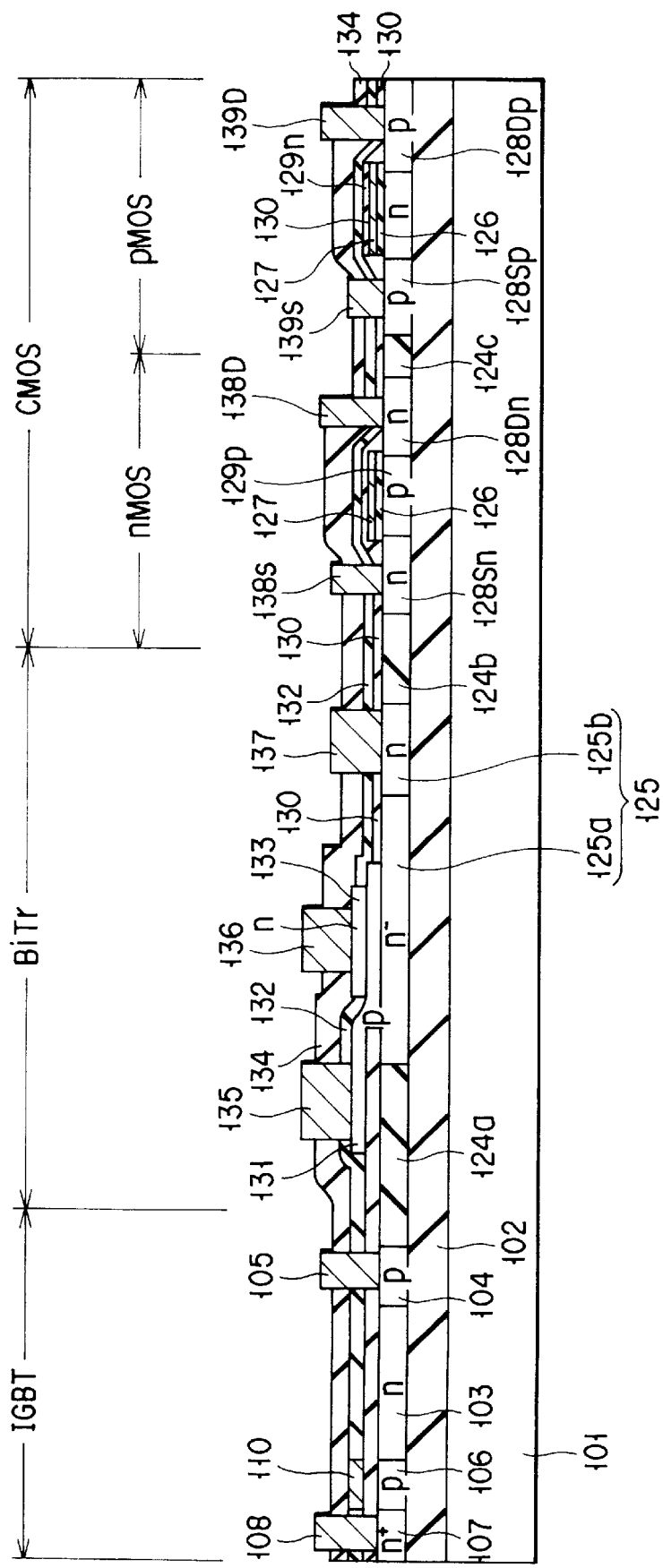
FIG. 32 is a cross sectional view showing a semiconductor apparatus according to a tenth embodiment of the present invention.

A semiconductor apparatus according to a tenth embodiment of the present invention will now be described. FIG. 32 is a cross sectional view schematically showing the structure of the semiconductor apparatus according to this embodiment. The same elements as those shown in FIGS. 24 and 25 are given the same reference numerals and the same elements are omitted from description. The different portions will now be described.

That is, the apparatus according to this embodiment is a circuit formed by integrating a BiCMOS (Bipolar Complementary Metal Oxide Semiconductor) composed of a bipolar transistor, a CMOS and the above-mentioned IGBT. Specifically, as shown in FIG. 32, the biCMOS and the IGBT are, in parallel, formed on the embedded oxide film 102 through device isolation insulating films 124a, 124b and 124c.

The bipolar transistor has an n⁻ collector region 125a and an n-type collector region 125b selectively formed on the embedded oxide film 102, a p-type base region 131 formed on the n⁻ collector region 125a, and an n-type drain region 133 formed on the p-type base region 131.

The CMOS has an nMOS (n-channel MOS) consisting of an n-type source region 128S$n$, a p-type channel region 129$p$ and an n-type drain region 128D$n$ selectively formed on the embedded oxide film 102; a pMOS (p-channel MOS) consisting of a p-type source region 128S$p$, an n-type channel region 129$n$ and a p-type drain region 128D$p$; and a device isolation insulating film 124c for isolating the foregoing nMOS and pMOS from each other.

An integrated circuit having the BiCMOS and IGBT will now be described in the order of the manufacturing process.

Initially, an embedded oxide film 102 having a thickness of about 1 μm is formed by oxidizing the surface of the silicon substrate 1.

Then, an amorphous semiconductor layer having a thickness of about 100 nm to 1000 nm is formed on the embedded oxide film 102.

Then, the amorphous semiconductor layer is annealed at 600° C. for 24 hours in an oxygen atmosphere so as to be crystallized (formed into polycrystalline) so that a first polycrystalline semiconductor layer is formed which serves as the n⁺ source region 107, the p-type base region 106, the n-type base region 103, the p-type drain region 104, the n⁻ collector region 125a, the n-type collector region 125b, the n-type source region 128S$n$, the p-type channel region 129$p$, the n-type drain region 128D*n*, the p-type source region 128S*p*, the n-type channel region 129*n* and the p-type drain region 128D*p*.

Then, the first polycrystalline semiconductor layer is partially oxidized so that the device isolation insulating films 124*a*, 124*b* and 124*c* are formed. The device isolation insulating film 124*a* separates the first polycrystalline semiconductor layer into the IGBT region, the collector region 125 of the bipolar transistor region and the CMOS transistor region. The device isolation insulating film 124*b* separates the collector region 125 and the CMOS transistor region from each other. The device isolation insulating film 124*c* separates the CMOS transistor region into the nMOS transistor region and the pMOS transistor region.

Then, phosphorus ions are implanted into the first polycrystalline semiconductor layer by a small dose quantity so that an n$^-$ type polycrystalline semiconductor layer serving as the n$^-$ collector region 125*a* is formed. Moreover, ions for adjusting the threshold value are implanted into the first polycrystalline semiconductor layer so that the p-type base region 106, the n-type base region 103, the p-type channel region 129*p* and the n-type channel region 129*n* are formed.

Then, the CMOS transistor is formed. Initially, the gate oxide film 126 having a thickness of about 20 nm is formed by heat-oxidizing the surface of the first polycrystalline semiconductor layer. Then, a second polycrystalline semiconductor layer is formed on the gate insulating film of the IGBT and the gate oxide film 126 of the CMOS. Then, the second polycrystalline semiconductor layer is processed by reactive ion etching (RIE) so that the gate electrode 110 of the IGBT and the gate electrode 127 of the CMOS are formed. As a result of the RIE, the gate oxide film 126 in regions except the gate electrodes 110 and 127 is removed.

Then, phosphorus ions are selectively implanted into the first polycrystalline semiconductor layer so that the n$^+$ source region 107, the n-type source region 128S*n* and the n-type drain region 128D*n* are formed. Then, boron ions are selectively implanted into the first polycrystalline semiconductor layer so that the p-type drain region 104, the p-type source region 128S*p* and the p-type drain region 128D*p* are formed. At this time, implantation of phosphorus ions also causes the n-type collector region 125*b* to be formed. Then, heat treatment at about 800° C. is performed so that impurities are activated.

Then, the silicon oxide layer 130 is formed on the overall surface by the CVD method, and then an opening portion is formed in the silicon oxide layer 130. The opening portion is used to bring the p-type polycrystalline silicon germanium layer serving as the p-type base region 131, which is formed in the post process, and the n$^-$ polycrystalline semiconductor layer serving as the n$^-$ collector region 125*a* into contact with each other.

Then, a natural oxide film formed on the surface of, for example, the n collector region 125*a* on the bottom surface of the opening portion is removed by fluoric acid, and then washing with very pure water is performed so that the surfaces of the n$^-$ collector region 125*a* and the like are terminated with hydrogen. Then, a p-type polycrystalline silicon germanium layer having a thickness of about 20 nm to 30 nm and to the surface of which boron has been doped is formed by the CVD method in a vacuum atmosphere. It is preferable that a dense p-type polycrystalline silicon germanium layer be formed at a low temperature of 800° C. or lower, preferably 500° C. to 600° C. or lower. The reason for this is that diffusion of boron is prevented to effectively prevent diffusion of boron to the n$^-$ collector region 125*a*.

Then, the p-type polycrystalline silicon germanium layer is patterned so that the p-type polycrystalline silicon germanium layer serving as the p-type base region 131 is formed.

Since the surface of the n$^-$ collector region 125*a* is terminated with hydrogen, the pn junction interface between the n$^-$ collector region 125*a* and the p-type base region 131 has a satisfactory characteristic.

After the silicon oxide film 132 has been formed, an opening portion is formed in the silicon oxide film 132. The opening portion is formed to bring the n-type polycrystalline silicon layer serving as the n-type drain region 133 to be formed in the post process and the p-type base region 131 into contact with each other.

Then, a natural oxide film formed on the surface of the p-type base region 131 and the like in the bottom portion of the above-mentioned opening portion is removed by fluorine acid, and then washing with very pure water is performed so that the surface of the p-type polycrystalline silicon layer serving as the p-type base region 131 and the like are terminated with hydrogen.

Then, an n-type polycrystalline silicon layer having a thickness of about 500 nm and doped with phosphorus to the overall surface is formed, and then the n-type polycrystalline silicon layer is patterned so that the n-type polycrystalline silicon layer serving as the n-type drain region 133 is formed.

Since the surface of the p-type base region 131 is terminated with hydrogen, the pn junction interface between the p-type base region 131 and the n-type drain region 133 has a satisfactory characteristic.

Then, the inter-layer insulating film 134 is formed on the overall surface, and then contact holes corresponding to the transistor regions are formed in the inter-layer insulating film 134.

Finally, a conducting film, such as an Al film, has been deposited on the overall surface, and then the conducting film is patterned so that the source electrode 108, the drain electrode 105, the base electrode 135, the drain electrode 136, the collector electrode 137, the source electrode 138S, the drain electrode 138D, a gate lead-out electrode (not shown), the source electrode 139S, the drain electrode 139D and the gate lead-out electrode (not shown) are formed. Thus, the basic structure of the IGBT and the BiCMOS transistor is formed.

Since the integrated circuit having the IGBT and the BiCMOS transistor has the structure such that the IGBT region, the bipolar transistor region and the CMOS transistor region are formed by the polycrystalline semiconductor layers, the manufacturing cost can be reduced.

Since this embodiment has the structure such that the natural oxide film has been removed, and then the surface of the polycrystalline semiconductor layer serving as the transistor region for forming the pn junction is terminated with hydrogen, a satisfactory pn junction can be realized. That is, the pn junction interface between the n$^-$ collector region 125*a* and the p-type base region 131, the pn junction interface between the p-type base region 131 and the n-type drain region 133 have a satisfactory characteristic. Therefore, recombination electric currents generating in the pn junction interface can be restrained so that the current amplifying ratio Hfe is furthermore raised.

Although the polycrystalline silicon is employed which diffuses considerably rapidly, the dense p-type polycrystalline silicon germanium layer is formed at the low temperature of 800° C. or lower so that a satisfactory bipolar transistor is formed.

Since this embodiment has the structure such that the bipolar transistor requiring a low temperature process is formed after the process for the CMOS transistor requiring a high temperature step has been performed, the CMOS transistor and the bipolar transistor can be formed on the same substrate while maintaining the reliability.

Since the BiCMOS transistor having the high-performance vertical bipolar transistor is used, an a analog circuit can be realized.

Eleventh Embodiment

Figure 33:
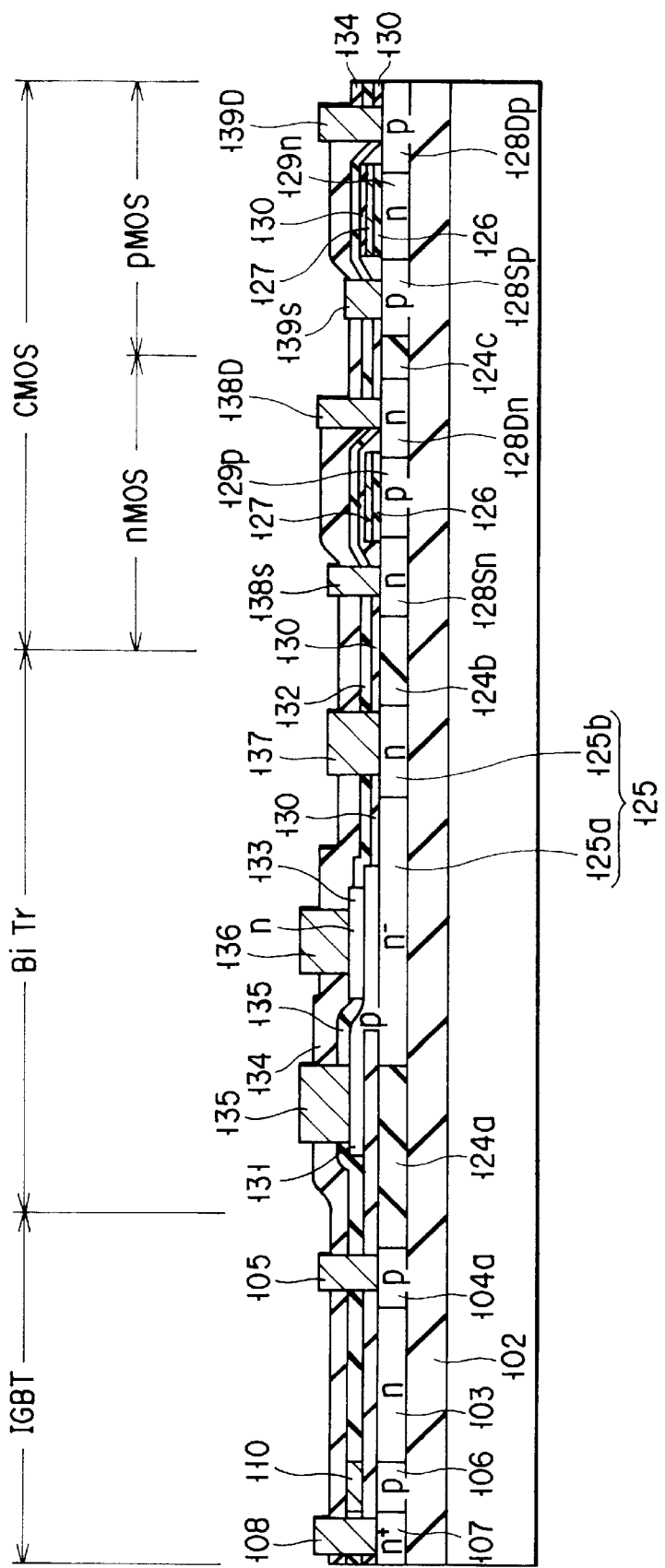
FIG. 33 is a cross sectional view showing a semiconductor apparatus according to an eleventh embodiment of the present invention.

A semiconductor apparatus according to an eleventh embodiment of the present invention will now be described. FIG. 33 is a cross sectional view schematically showing the semiconductor apparatus according to this embodiment. The same elements as those shown in FIGS. 26 and 32 are given the same reference numerals and the same elements are omitted from description and only different portions will now be described.

The semiconductor apparatus according to this embodiment has a structure which is the modification of the tenth embodiment. According to this embodiment, the integrated circuit having the IGBT and the BiCMOS is structured such that the p-type drain layer 104a of the IGBT is, as shown in FIG. 26, formed on the n-type base region 103.

Even if the structure is formed as described above, an effect similar to that obtainable from the tenth embodiment can be obtained. Moreover, the voltage resistance of the IGBT can be improved similarly to the fifth embodiment.

Twelfth Embodiment

A semiconductor apparatus according to a twelfth embodiment of the present invention will now be described with reference to the drawings. FIG. 34 is a cross sectional view schematically showing the structure of the semiconductor apparatus according to this embodiment. The same elements as those shown in FIGS. 27 and 32 are given the same reference numerals and the same elements are omitted from description. Then, only different portions will now be described.

That is, the semiconductor apparatus according to this embodiment has a structure which is the modification of the structure according to the tenth embodiment. According to this embodiment, the above-mentioned integrated circuit having the IGBT and the BiCMOS has a structure such that the IGBT is formed in such a manner that the LOCOS method as shown in FIG. 27 is employed to cause the embedded oxide film 102 below the p-type drain region 104 to have a large thickness.

Even if the above-mentioned structure is employed, an effect similar to that obtainable from the tenth embodiment can be obtained. Moreover, the voltage resistance of the IGBT can be improved similarly to the sixth embodiment.

Thirteenth Embodiment

Figure 35:
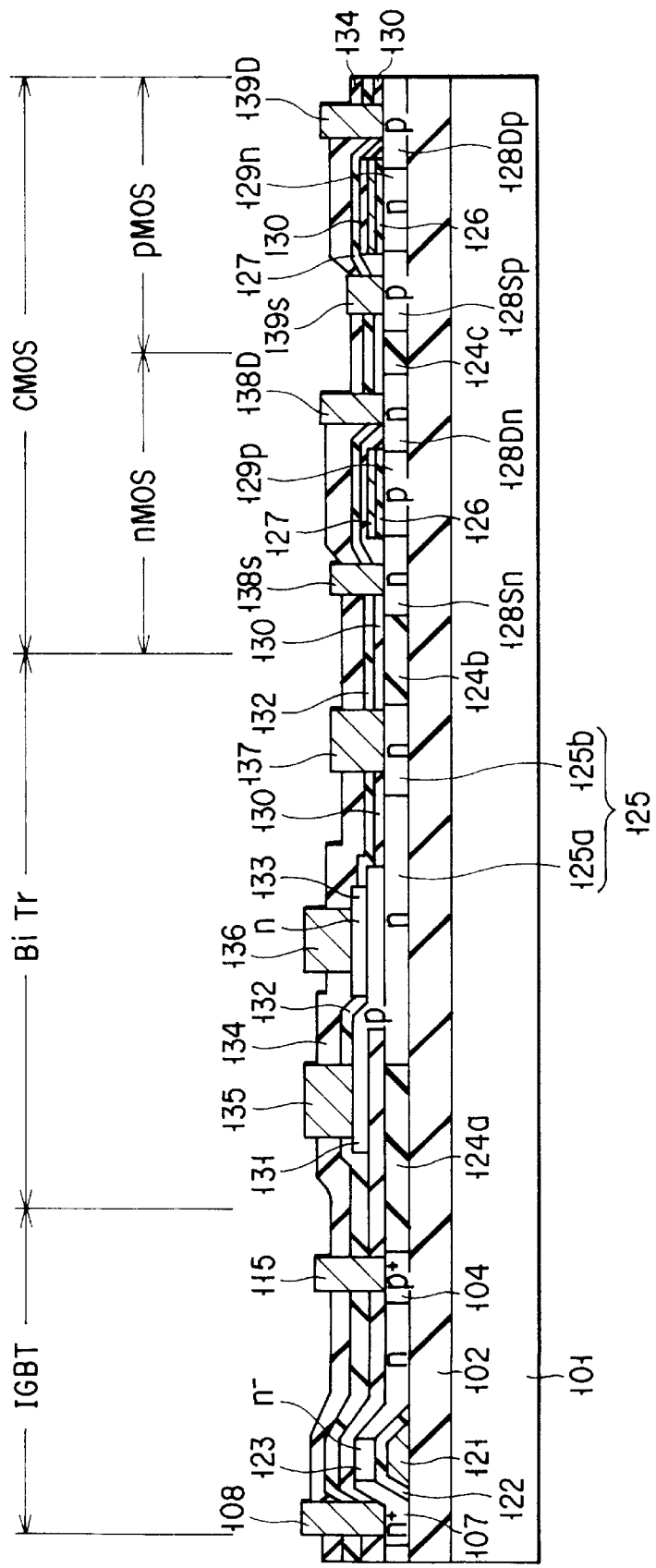
FIG. 35 is a cross sectional view showing a semiconductor apparatus according to a thirteenth embodiment of the present invention.

A semiconductor apparatus according to a thirteenth embodiment of the present invention will now be described with reference to the drawings. FIG. 35 is a cross sectional view schematically showing the structure of the semiconductor apparatus according to this embodiment. The same elements as those shown in FIGS. 31 and 32 are given the same reference numerals and the same elements are omitted from description. Then, only different portions will now be described.

That is, the semiconductor apparatus according to this embodiment has a structure which is a modification of the structure according to the tenth embodiment. According to this embodiment, the above-mentioned integrated circuit having the IGBT and the biCMOS has a structure such that the IGBT is formed in such a manner that the gate electrode 121 is formed on the embedded oxide film 102, as shown in FIG. 31.

Even if the above-mentioned structure is employed, an effect similar to that obtainable from the tenth embodiment can be obtained.

Fourteenth Embodiment

Figure 36:
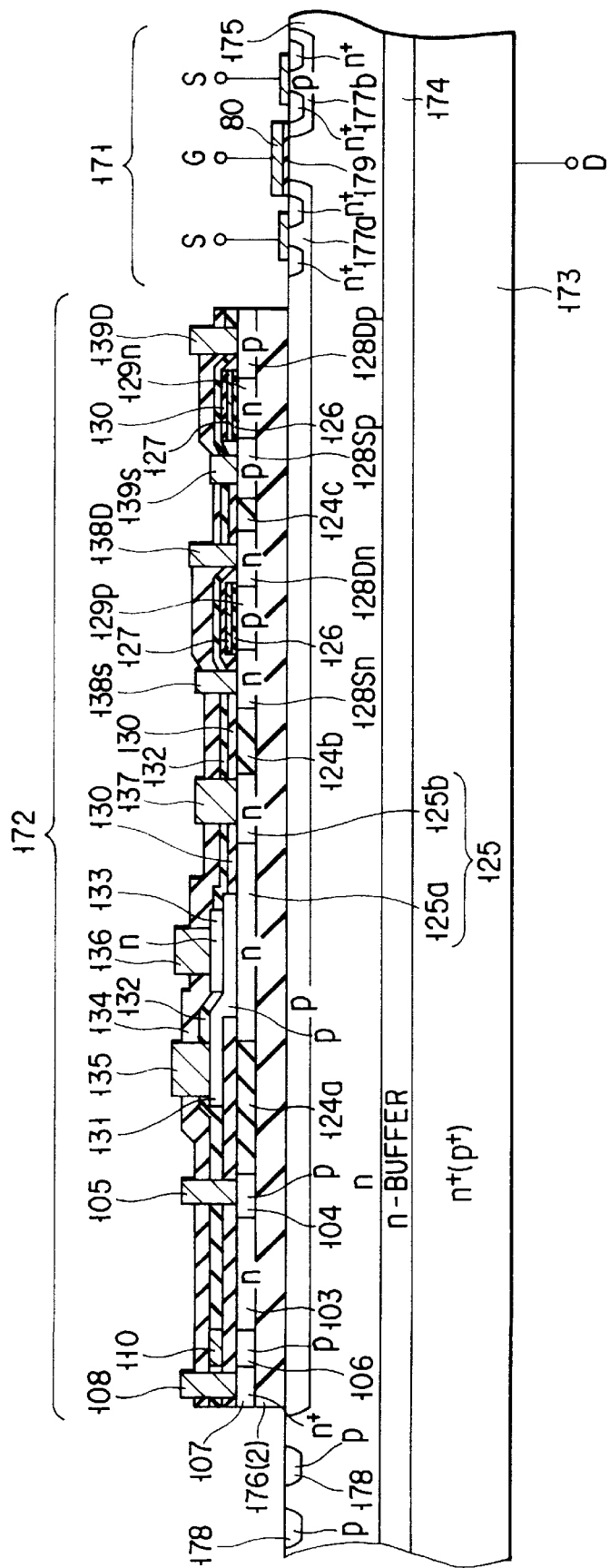
FIG. 36 is a cross sectional view showing a semiconductor apparatus according to a fourteenth embodiment of the present invention.

A semiconductor apparatus according to a fourteenth embodiment of the present invention will now be described with reference to the drawings. FIG. 36 is a cross sectional view schematically showing the structure of the semiconductor apparatus according to this embodiment. The same elements as those shown in FIG. 32 are given the same reference numerals and the same elements are omitted from description. Then, only the different portions will now be described.

That is, the semiconductor apparatus according to this embodiment has a structure which is a modification of the structure according to the tenth embodiment. Specifically, an appendix circuit formed by integrating the IGBT and the biCMOS is, through an insulating region, formed on a substrate on which a power device is formed, as shown in FIG. 36.

The detailed structure of the semiconductor apparatus according to this embodiment will now be described in the manufacturing order.

Initially, as shown in FIG. 36, a p-type diffusion region 177a is formed on the surface of the substrate on which an appendix circuit 172 serving as a control circuit or the like will be formed. The p-type diffusion region 177a may be formed in the same region for a p-type guard ring 178 formed in the Power device and arranged to maintain the voltage resistance. The p-type diffusion region 177a is formed in the p-type guard ring 178 or adjacent to the p-type guard ring 178.

Then, a gate oxide film 179 for the power device 171 is formed, and then a thick oxide film 176 (2) is formed in a portion in which the appendix circuit 172 will be formed. Moreover, amorphous silicon is deposited on the overall surface to have a thickness of about 600 nm, and then annealed at 600° C. for 24 hours in an oxygen atmosphere so that the amorphous silicon region is formed into a polycrystalline shape. The polycrystalline silicon layer is used as a gate electrode 180 of the power device 171 and the IGBT.

The above-mentioned polycrystalline silicon is, by the PEP method, removed from the portion in which the p-base of the power device 171 will be formed. The residual polycrystalline silicon is used as a mask when boron ions are implanted. Then, heating is performed to diffuse boron so that a p-base (well) 177b is formed.

An n$^+$ (or p$^+$) region 173 is formed on the reverse side of a silicon substrate 175 through an n buffer region 174 so as to be a drain of a vertical MOSFET (an IGBT in the case of p$^+$) serving as the power device.

Then, a biCMOS circuit, which is the appendix circuit 172, is formed by the same process as that according to the tenth embodiment (shown in FIG. 32). A polycrystalline silicon layer for forming the collector region 125 for the CMOS and the bipolar transistor is arranged to have a thickness smaller than 100 nm.

Therefore, an intelligent power device formed by integrating an appendix circuit consisting of the IGBT and the biCMOS and the vertical MOSFET can be realized.

Since the above-mentioned structure is arranged such that the thickness of the polycrystalline silicon layer in which the IGBT will be formed is made to be about 600 nm and the thickness of the polycrystalline semiconductor layer in which the CMOS transistor will be formed is made to be 100 nm or smaller, both of the CMOS transistor and the IGBT have satisfactory device characteristics.

Note that FIG. 36 is a schematic drawing and therefore the accurate sizes of the semiconductor apparatus are not illustrated.

Another Embodiment

Although the hetero junction-type bipolar transistor has been described, use of a polycrystalline silicon region having impurities at a low density as the base region enables the present invention to be applied to a usual bipolar transistor.

Although the fourteenth embodiment has the structure such that the circuit shown in FIG. 32 is formed on the power device, another structure may be employed in which any one of the circuits shown in FIGS. 33 to 35 is formed on the power device to attain a similar effect.

Fifteenth Embodiment

FIG. 37 is a cross sectional view showing a MOSFET according to a fifteenth embodiment of the present invention. The MOSFET according to this embodiment has an n-type weak-resistance layer 181 selectively formed on the surface of the high-resistance silicon substrate 11. The field oxide film 12 is selectively formed on the n-type weak-resistance layer 181.

Moreover, the p-type source region 14 and the n-type weak-resistance layer 12 are connected to each other through a wiring portion 182 so as to have the same potential. As a result, the p-offset region 16 has a low potential and the silicon substrate 11 has a high potential. Therefore, the p-offset region 16 is depleted from the oxide film 3 when the gate is turned off. As a result, impurities in a quantity of about $2 \times 10^{12}$ cm$^{-2}$ are doped into the p-offset region 16 and thus significant voltage resistance can be obtained. By appropriately determining the length of the p-offset region 16, a required voltage resistance level can be obtained.

Sixteenth Embodiment

FIG. 38 is a cross sectional view showing a MOSFET according to a sixteenth embodiment of the present invention. The MOSFET according to this embodiment is different from that shown in FIG. 37 in that an n-type weak-resistance layer 181 and a power source 183 for the MOSFET are connected to each other through a wiring portion 182 to have the same potential. As a result, the p-offset region 16 has a low potential and the silicon substrate 11 has a high potential. Therefore, an effect similar to that obtainable from the fifteenth embodiment can be obtained when the gate is turned off.

Seventeenth Embodiment

FIG. 39 is a cross sectional view showing a MOSFET according to a seventeenth embodiment of the present invention. The MOSFET according to this embodiment is different from the structure shown in FIG. 37 in that the n-type weak-resistance layer 181 and the gate electrode 19 are connected to each other through a wiring portion 182 to have the same potential. As a result, the p-offset region 16 has a low potential and the silicon substrate 11 has a high potential. Thus, an effect similar to that obtainable from the fifteenth embodiment can be obtained. Moreover, the n-type weak-resistance layer 181 serves as a back gate when the gate is turned on so that the n-type base region 18 is applied with the gate voltage also from the silicon substrate 11. Therefore, a channel is formed in the bottom portion of the n-type base region 18 so that the ON-state resistance is weakened.

Eighteenth Embodiment

Figure 7:
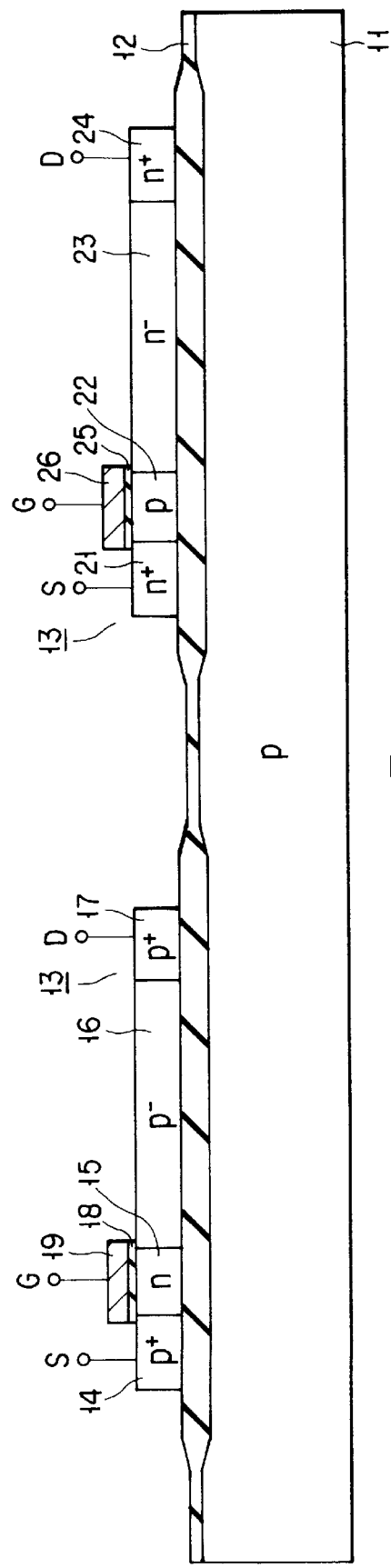
FIG. 7 is a cross sectional view showing a conventional lateral MOSFET.
Figure 8:
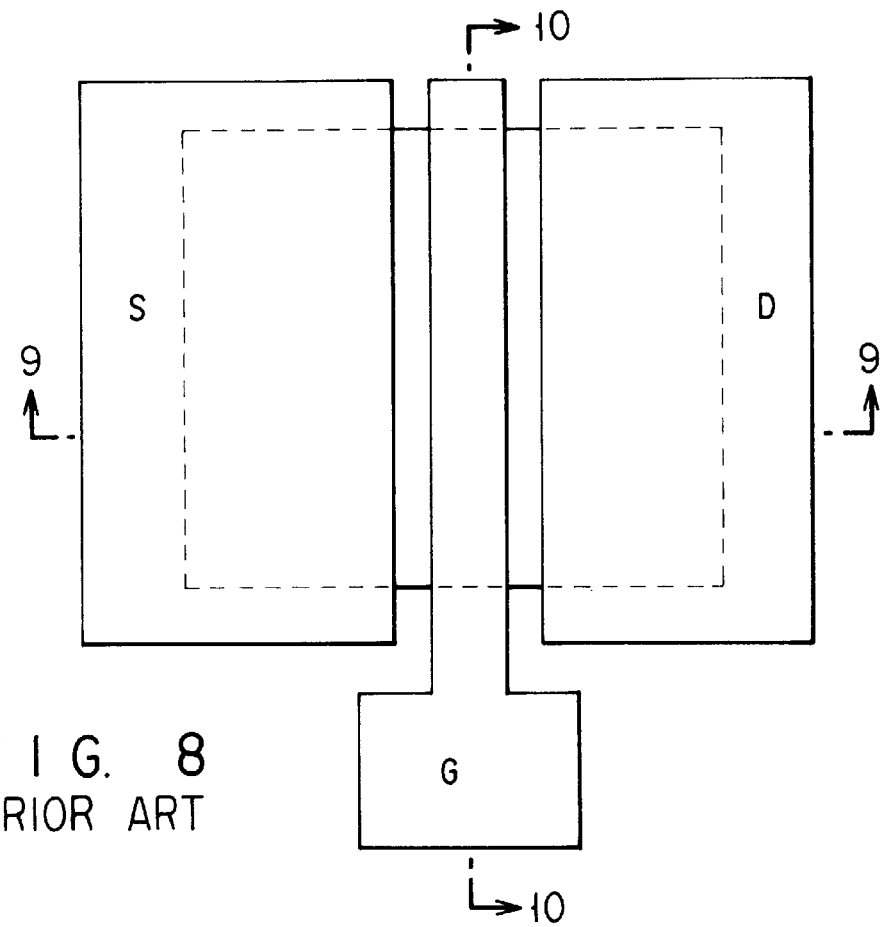
FIG. 8 is a plane view showing the conventional lateral MOSFET.
Figure 9:
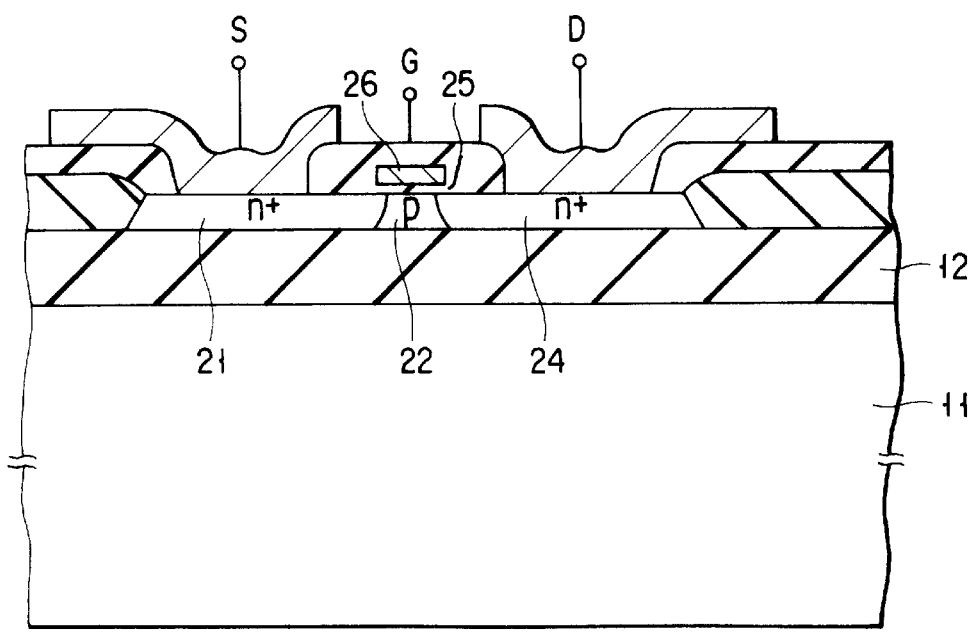
FIG. 9 is a cross sectional view taken along line 9—9 shown in FIG. 8.

FIG. 40 is a cross sectional view of a MOSFET according to an eighteenth embodiment of the present invention. The MOSFET according to this embodiment is different from the MOSFET shown in FIG. 7 in that the n-type weak-resistance layer 181 is selectively formed on the surface of the p-type and high-resistance silicon substrate 11. The field oxide film 12 is selectively formed on the n-type weak-resistance layer 181.

The gate electrode 26 and the n-type weak-resistance layer 181 are connected to each other through a wiring portion 184 to have the same potential. As a result, the n-type weak-resistance layer 181 acts as a back gate when the gate is turned on so that the gate voltage is applied to the p-type base region 22 also from the silicon substrate 11. Therefore, a channel is formed in also the bottom portion of the p-type base region 22 so that the ON-state resistance is weakened.

Nineteenth Embodiment

Figure 1:
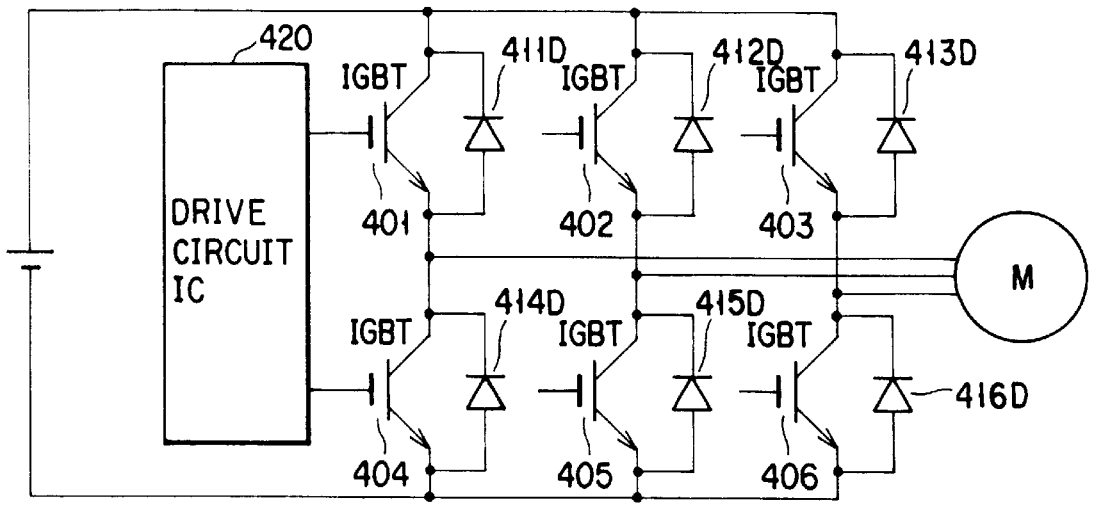
FIGS. 1 and 2 are structural views showing a conventional inverter apparatus.

FIG. 41 is a cross sectional view showing the structure of a high voltage MOSFET according to a nineteenth embodiment of the present invention. The same elements as those shown in FIG. 1 are given the same reference numerals and the same elements are omitted from description. Then, only the different portions will now be described.

The high voltage MOSFET according to this embodiment is structured to improve the mobility and lower the ON-state voltage (ON-state resistance). Specifically, as shown in FIG. 41, a high-resistance SiC layer 191 is provided which is formed on the oxide film 2 and arranged to form a hetero junction in the interface with the n-type drift region 3 so as to form a carrier storage layer 190. Moreover, the thickness of each of the regions 3, 4, 6 and 7 is 150 nm or smaller.

The operation of the high voltage MOSFET having the above-mentioned structure will now be described.

Since the SiC layer is formed on the drift region 3 made of polysilicon, the difference of the band gap between the drift region 3 and the SiC layer causes the interface to have a band structure as shown in FIG. 42. The potential of a bottom portion of the conducting band is lowered in the polysilicon portion in the interface so that the storage layer 190 in which electrons are accumulated is formed. The storage layer 190 serves as a channel (two-dimensional electron gas) through which electrons are able to freely move along the interface.

As a result, even if no voltage is applied between the source and the drain, the channel is formed in the storage layer 190. When the gate is turned on and voltage is applied between the source and the drain, carriers are able to pass through the storage layer 190 at high speed. Thus, the mobility in the drift region can be improved and thus the ON-state voltage can be lowered.

If the voltage between the source and the drain is raised, expansion of the depletion layer causes the channel on the channel region 2 to be lost. However, the high voltage between the source and the drain lowers the potential barrier for each crystalline interface to permit electrons to flow over each potential barrier. Thus, the operation of the device is not affected adversely.

According to the nineteenth embodiment, the SiC layer which forms the carrier storage layer 190 by forming the hetero junction in the interface with the drift region 2 is provided so that a channel is formed in the storage layer 190 even if no voltage is applied between the source and the drain. If voltage is applied between the source and the drain, carriers are permitted to pass through the storage layer 190 at high speed. Thus, mobility in the drift region 3 can be improved so that the ON-state voltage is lowered.

Since the thickness of each of the regions 3, 4, 6 and 7 is not greater than 150 nm, the crystallinity of each of the regions 3, 4, 6 and 7 can be improved so that the characteristics as the device are improved. Note that the base region 6 may be in the form of n-type.

Twentieth Embodiment

A high voltage MOSFET according to a twentieth embodiment of the present invention will now be described.

FIG. 43 is a cross sectional view showing the structure of the high voltage MOSFET according to this embodiment. The same elements as those shown in FIG. 41 are given the same reference numerals and the same elements are omitted from description. The different portions will now be described.

That is, the high voltage MOSFET according to this embodiment has a structure which is a modification of the structure according to the nineteenth embodiment. Specifically, a high-resistance insulating material layer 192 is, in place of the SiC layer 191, formed on the n-type drift region 3 as shown in FIG. 43, the insulating material layer 192 being arranged to form the carrier storage layer 190 in the interface with the n-type drift region 3 in accordance with the difference in the work function.

Also the above-mentioned high voltage MOSFET attains similar operations and effects to those obtainable from the nineteenth embodiment.

Twenty-First Embodiment

A high voltage MOSFET according to a twenty-first embodiment of the present invention will now be described. FIG. 44 is a cross sectional view showing the structure of the high voltage MOSFET. The same elements as those shown in FIG. 41 are given the same reference numerals and the same elements are omitted from description. Only different portions will now be described.

The high voltage MOSFET according to this embodiment has a structure which is a modification of the structure according to the nineteenth embodiment. Specifically, as shown in FIG. 44, the SiC layer is omitted and a SiGe layer 193 is formed between the n-type drift region 3 and the oxide film 2, the SiGe layer 193 being arranged to form the carrier storage layer 190 in the interface with the n-type drift region 3 in accordance with the difference in the work function. The SiGe layer 193 is formed below a portion of each of the n-type drift region 3 and the p-type base region 6.

Also the high voltage MOSFET having the above-mentioned structure attains an effect similar to that obtainable from the nineteenth embodiment.

Twenty-Second Embodiment

A high voltage IGBT according to a twenty-second embodiment will now be described. FIG. 45 is a cross sectional view showing the structure of the high voltage IGBT. The same elements as those shown in FIG. 41 are given the same reference numerals and the same elements are omitted from description. Only different portions will now be described.

That is, the high voltage IGBT according to this embodiment is a modification of the structure according to the nineteenth embodiment. Specifically, a p-type drain region 194 is provided in place of the n-type drain region 4, as shown in FIG. 45. The source electrode 8 is as well as in contact with the p-type base region 6.

If the voltage resistance IGBT has the above-mentioned structure, an effect similar to that obtainable from the nineteenth embodiment can be obtained.

Twenty-Third Embodiment

A high voltage MOSFET according to a twenty-third embodiment will now be described. FIG. 46 is a cross sectional view showing the structure of the high voltage MOSFET according to this embodiment. The same elements as those shown in FIG. 41 are given the same reference numerals and the same elements are omitted from description. Only the different portions will now be described.

That is, the high voltage MOSFET according to this embodiment has a structure which is a modification of the structure according to the nineteenth embodiment. Specifically, as shown in FIG. 46, a semi-insulating polycrystalline silicon (SIPOS) layer 196 is, in place of the Sic layer 191, provided which is formed on the n-type drift region 3 through the insulating film 195, which is doped into the n-type, which has strong resistance and which forms the carrier storage layer 10 in the interface with the n-type drift region 3 in accordance with the difference in the work function.

Also the high voltage MOSFET according to this embodiment having the above-mentioned structure attains effects similar to that obtainable from the nineteenth embodiment.

Twenty-Fourth Embodiment

FIG. 47 is a schematic cross sectional view showing a thin film transistor serving as a semiconductor apparatus according to a twenty-fourth embodiment of the present invention.

Referring to FIG. 47, reference numeral 201 represents a substrate made of silicon and so forth. An insulating film 202, for example, a silicon oxide film, having a thickness of about 1 $\mu$m is formed on the substrate 201. A silicon carbide germanium layer 203 serving as a first polycrystalline semiconductor layer and having a thickness of about 50 $\mu$m is deposited on the insulating film 202. A silicon layer 204 serving as a second polycrystalline semiconductor layer and having a thickness of about 50 nm is deposited on the silicon carbide germanium layer 203.

A source region 205 and a drain region 206 are formed at the two ends of the silicon layer 204 by ion implantation. The surface of the silicon layer 204 interposed between the source region 205 and the drain region 206 serves as the channel region.

A gate insulating film 207 in the form of an oxide film is formed on the silicon layer 204. A gate electrode 208 made of polycrystalline silicon is formed on the gate insulating film 207.

The source region 205 is provided with a source electrode 209 so as to be in contact with the source region 205. The drain region 206 is provided with a drain electrode 210 so as to be in contact with the drain region 206.

Figure 48:
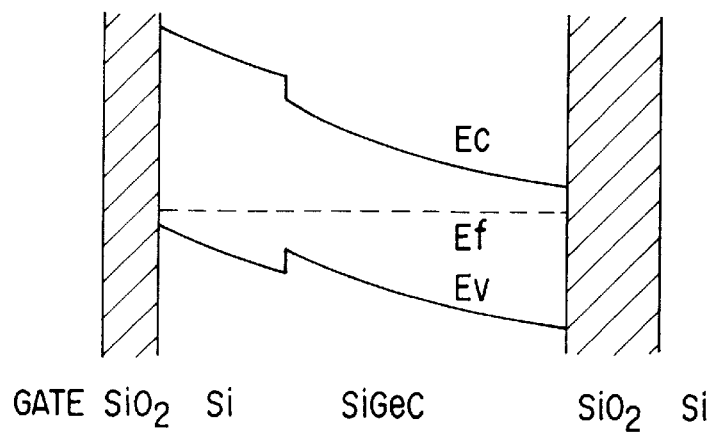
FIG. 48 is a graph showing an energy band for a p-channel thin film transistor according to the twenty-fourth embodiment.
Figure 49:
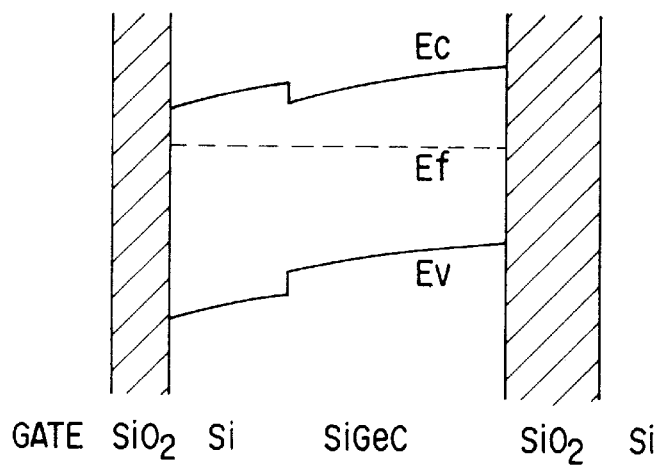
FIG. 49 is a graph showing an energy band for an n-channel thin film transistor according to the twenty-fourth embodiment.

The energy band of the thin film transistor having the above-mentioned structure is shown in FIGS. 48 and 49. FIG. 48 shows the energy band of a p-channel structure, while FIG. 49 shows the energy band of an n-channel structure. As can be understood from FIGS. 48 and 49, the forbidden band width of the silicon carbide germanium layer is smaller than that of the silicon layer.

In the case of FIG. 48, the valence band of the silicon carbide germanium layer 203 is higher than that of the silicon layer. Therefore, a two-dimensional gas layer is generated in the channel region, thus causing the mobility to be improved.

In the case of FIG. 49, the conducting band of the silicon carbide germanium layer is lower than that of the silicon layer. Therefore, a two-dimensional gas layer is generated in the channel region. Therefore, the mobility is improved similarly to the case of the p-channel.

Therefore, if the CMOS is formed by using the thin film transistor as shown in FIG. 47, the mobility of both of the p-channel and the n-channel are improved. Therefore, a CMOS having a satisfactory characteristic can be obtained with a simple structure as compared with the conventional silicon germanium.

Twenty-Fifth Embodiment

FIG. 50 is a schematic cross sectional view of a hetero junction bipolar transistor serving as a semiconductor apparatus according to a second embodiment of the present invention. Referring to FIG. 50, the same elements as those shown in FIG. 47 are given the same reference numerals and the same elements are omitted from description hereinafter.

Referring to FIG. 50, a silicon layer 211 serving as a third polycrystalline semiconductor layer is deposited on the insulating film 202. The silicon layer 211 serves as an emitter region.

On the silicon layer 211, there are formed a silicon carbide germanium layer 212 serving as a fifth polycrystalline semiconductor layer and a silicon layer 213 serving as a fourth polycrystalline semiconductor layer.

The silicon carbide germanium layer 212 is used as a base region, while the silicon layer 213 is used as a collector region.

Each of the silicon layer 211, the silicon carbide germanium layer 212 and the silicon layer 213 is provided with an emitter electrode 214, a base electrode 215 and a collector electrode 216 which are formed in contact with the respective layers.

Reference numerals 217 and 218 represent insulating films. A portion of the silicon carbide germanium layer 212 is formed on an insulating film 217a to permit the base electrode to be drawn out.

Figure 51:
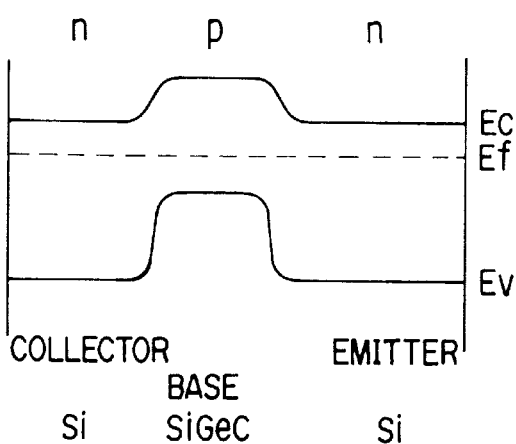
FIG. 51 is a graph showing an energy band for an npn transistor according to the twenty-fifth embodiment of the present invention.
Figure 52:
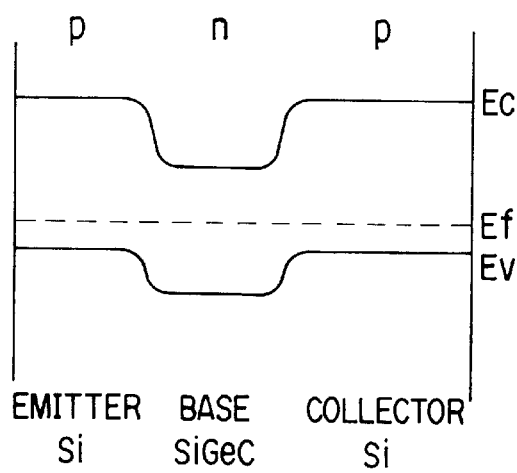
FIG. 52 is a graph showing an energy band for a pnp transistor according to the twenty-fifth embodiment.

The energy band of the hetero junction bipolar transistor having the above-mentioned structure is shown in FIGS. 51 and 52. FIG. 51 shows the energy band of an npn transistor, while FIG. 52 shows the energy band of a pnp transistor.

As can be understood from the energy bands similar to those shown in FIGS. 48 and 49, a further satisfactory characteristic can be realized as compared with a usual bipolar transistor.

Twenty Sixth Embodiment

Figure 53:
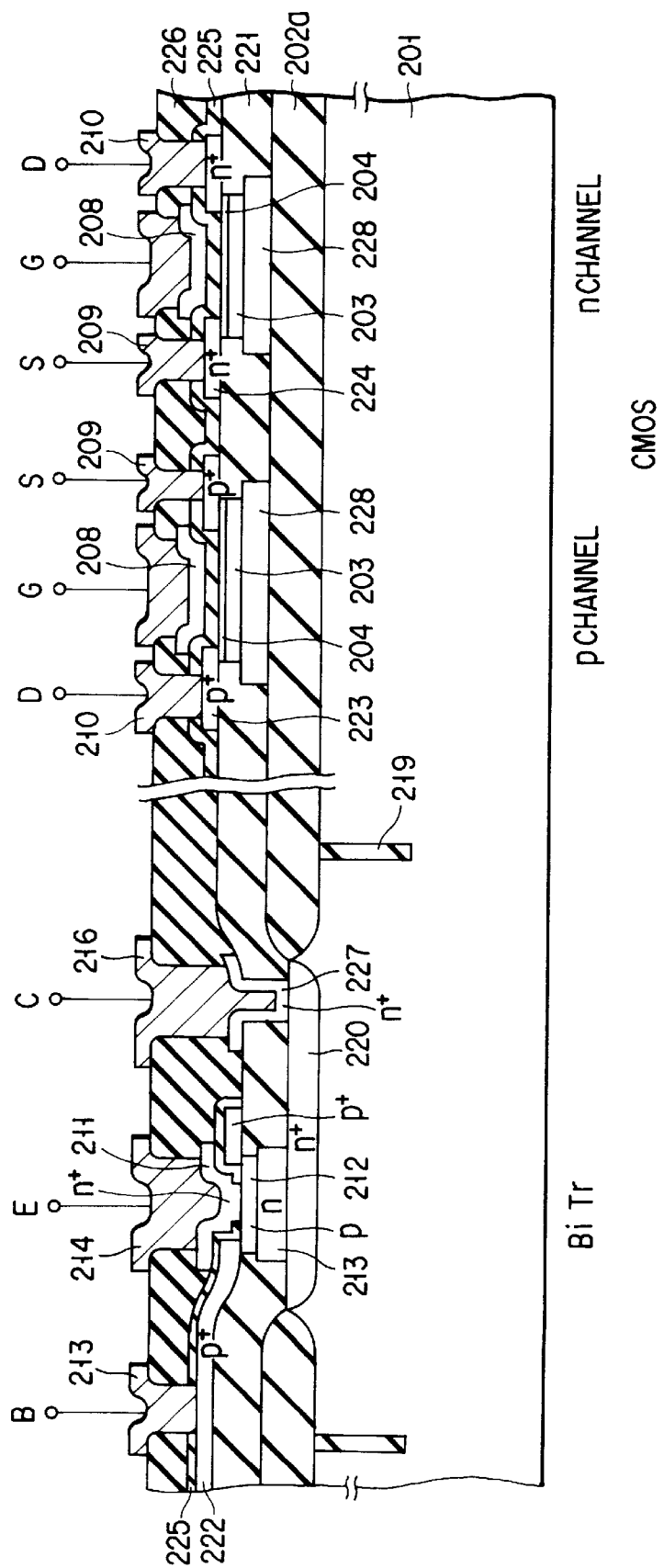
FIG. 53 is a cross sectional view showing a BiCMOS transistor according to a twenty-sixth embodiment of the present invention.

FIG. 53 is a cross sectional view showing a biCMOS transistor serving as a semiconductor apparatus according to a twenty-sixth embodiment of the present invention. The description will be performed in the manufacturing order.

Initially, an insulating film 219 for isolating devices embedded in a trench groove is previously formed on a substrate 1 made of single crystalline silicon, followed by performing LOCOS oxidation so that a LOCOS oxide film 202a having a thickness of about 1 μm is formed.

Then, an opening portion (not shown) is formed in a portion of the LOCOS oxide film 202a in the bipolar transistor portion, and then phosphorus ions are implanted and diffused in the opening portion so that an n-type embedded layer 220 having a high density is formed. Then, a polycrystalline silicon layer having a thickness of about 1 μm is, while being doped, deposited in such a manner that the density of n-type impurities is $10^{17}$ cm$^{-3}$ or higher so that a collector region 213 is formed. A polycrystalline silicon germanium layer having a thickness of about tens of nm is deposited on the collector region 221 so that a base region 212 is formed. A dense n-type collector contact layer 227 is formed in a portion of the n-type embedded layer 220 opposite to the n-type collector region 213.

In the CMOS portion, there are sequentially laminated a polycrystalline silicon layer 228, a polycrystalline silicon germanium layer 203 and a polycrystalline silicon layer 204. The polycrystalline silicon layer 228 is formed simultaneously with the collector region 213, while the polycrystalline silicon germanium layer 204 is formed simultaneously with the base region 212. The foregoing polycrystalline silicon layers 203 and 228 and the polycrystalline silicon carbide germanium layer 204 are patterned, and then the CVD method is employed to deposit an oxide film 221 in the CMOS portion and the bipolar transistor portion.

The surface of the oxide film 221 is flattened, and then etched to remove the polycrystalline silicon layer 204 and the oxide film on the base region 212. Thus, a dense p-type base electrode drawing-out region 222 is deposited on the base region 212, and dense p-type layer 223 and n-type layer 224 serving as the source region and the drain region are deposited and patterned.

Then, a TEOS film 225 which serves as a pad and a gate oxide film when the emitter is formed is deposited. The oxide film in the emitter portion is etched to form an opening, and then a polycrystalline silicon layer serving as the emitter region and the gate electrode 208 is deposited and patterned. Then, an interlayer insulating film 226 is deposited, an opening is formed, and then an aluminum source electrode 9, a drain electrode 210, an emitter electrode 214, a base electrode 215 and a collector electrode 216 are formed so that a biCMOS transistor is manufactured.

The thus-manufactured biCMOS transistor has the bipolar transistor portion and the CMOS portion both having excellent characteristics. Thus, the biCMOS transistor has an excellent characteristics.

Twenty-Seventh Embodiment

Figure 54:
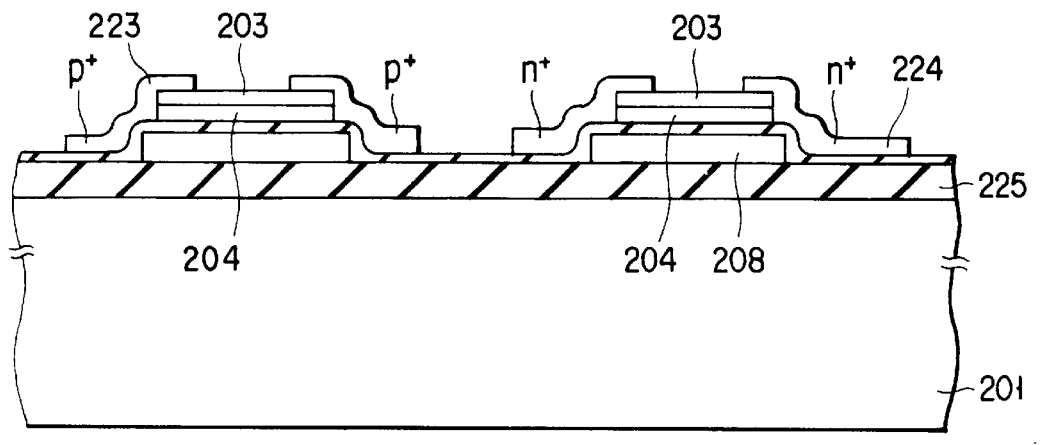
FIG. 54 is a cross sectional view showing a CMOS transistor according to a twenty-seventh embodiment of the present invention.

FIG. 54 is a cross sectional view of a CMOS transistor serving as a semiconductor apparatus according to a twenty-seventh embodiment of the present invention.

The CMOS transistor according to this embodiment is different from the CMOS transistor of the biCMOS transistor shown in FIG. 53 in that the gate electrode 208 is first formed on the insulating film and the polycrystalline semiconductor layer is formed on the gate electrode 208 through a TEOS film 225.

When the biCMOS comprising the foregoing CMOS transistor is combined with a high voltage vertical device such as a power MOSFET, the gate electrode of the CMOS transistor can be formed simultaneously with the gate for the high voltage vertical device. Therefore, the necessity of individually forming the gates can be eliminated, thus causing the manufacturing process to be simplified satisfactorily.

Twenty-Eighth Embodiment

The inventors of the present invention have allowed to various polycrystalline silicon germanium to grown on an amorphous oxide silicon film to investigate the same. As a result, a fact was found that thinning of the film to the grain size of the polycrystalline silicon is able to rapidly improve the mobility of electrons. As a result of experiments performed by the inventors of the present invention, the characteristic can be improved when the thickness is reduced to be smaller than 40 nm. Then, structures reflecting the above-mentioned fact will now be described in twenty-eighth to thirtieth embodiment.

Figure 55:
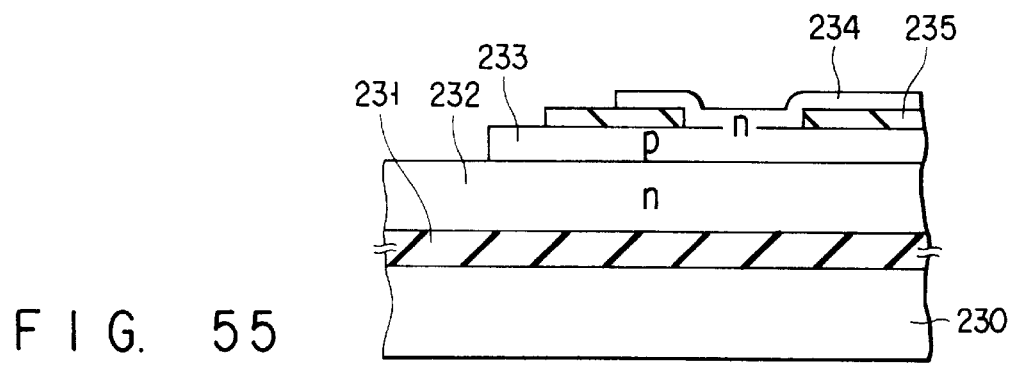
FIG. 55 is a cross sectional view showing a semiconductor apparatus according to a twenty-eighth embodiment of the present invention.

FIG. 55 is a cross sectional view showing a semiconductor apparatus according to the twenty-eighth embodiment of the present invention.

On a silicon substrate 230, an oxide silicon layer 231 (SiO2) is formed by heat oxidation or the like. Then, a ultra high vacuum CVD apparatus is operated so that a polycrystalline and n-type silicon germanium layer 232 (having a thickness of 300 nm) is formed on the oxide silicon layer 231, and a polycrystalline and p-type silicon germanium layer 233 (having a thickness of 30 nm) is formed on the polycrystalline and n-type silicon germanium layer 232. Then, the substrate is taken out from the ultra high vacuum CVD apparatus, and then an oxide silicon film 235 (having a thickness of 100 nm) is formed on the silicon germanium layer by another CVD apparatus. Moreover, an emitter opening portion is formed by lithography. Then, the ultra high vacuum CVD apparatus is operated so that an uppermost polycrystalline and n-type silicon layer 234 (having a thickness of 100 nm) for an emitter is allowed to grow.

Then, gates for a base (a p-type silicon germanium layer 233) and a collector (a polycrystalline and n-type silicon germanium layer 232) are formed.

Thus, a bipolar transistor can be manufactured which has the polycrystalline and n-type silicon germanium layer 232 serving as the collector layer, the polycrystalline and p-type silicon germanium layer 233 serving as the base layer and the uppermost polycrystalline and n-type silicon layer 234 serving as the emitter.

The bipolar transistor having the above-mentioned structure is formed such that the band gap of the silicon emitter layer is wider than the band gap of the silicon germanium base layer 233 so that electrons are efficiently implanted from the emitter layer 234 to the base layer 233. Therefore, the density of impurities in the base layer 233 can considerably be raised. Thus, even if the thickness of the base layer is reduced, the base resistance can be lowered.

In this embodiment, the thickness of the base layer 233 made of the polycrystalline silicon germanium was determined to be 30 nm which was smaller than the grain size.

Then, the thickness of the base layer 233 was varied from 100 nm to 20 nm to measure the base running time of the bipolar transistor, results being as follows:

TABLE 1

Relationship between the Thickness of Polycrystal Base Layer and Running Time for Electron in Base Layer

| Thickness of Base Layer (nm) | 100 | 90 | 80 | 70 | 60 | 50 | 40 | 32 | 20 |
|---|---|---|---|---|---|---|---|---|---|
| Running Time (ps) | 9.8 | 9.0 | 7.8 | 6.7 | 5.5 | 4.3 | 2.5 | 1.5 | 1.0 |

A fact was found that the base running time of the bipolar transistor was rapidly raised in a region in which the thickness of the base layer was smaller than 40 nm which was similar to the grain size of the polycrystalline silicon.

In the region in which the thickness was smaller than 40 nm, the base running time was considerably shortened rather than the degree expected from simply reducing the thickness of the base layer. The reason for this is considered as follows:

As described above, the thickness of the polycrystalline silicon germanium layer is reduced to be not greater than the grain size so that the possibility of scattering in the interface of the bulk particles is rapidly lowered during running of the electrons from the emitter to the collector.

Twenty-Ninth Embodiment

Figure 56:
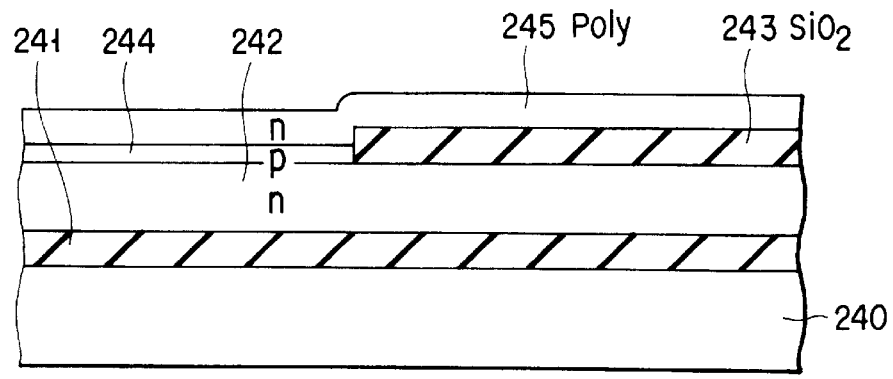
FIG. 56 is a cross sectional view showing a semiconductor apparatus according to a twenty-ninth embodiment of the present invention.

FIG. 56 is a cross sectional view of a semiconductor apparatus using the polycrystalline silicon layer according to the twenty-ninth embodiment of the present invention.

Initially, a heat oxidation process is performed so that a silicon oxide film 241 is formed on the surface of a silicon substrate 240. Then, an n-type silicon germanium layer 242 (having a thickness of 300 nm) is formed by the CVD method. The composition of germanium is made to be 20% and n-type impurities (arsenic) is added by $1E17$ $cm^{-3}$.

Then, an oxide film 243 is formed on the n-type silicon germanium layer 242, and then a portion of the oxide film 243 is removed by etching. Although the oxide film 243 is formed by the CVD method in this embodiment, the oxide film 243 may be formed by a method of oxidizing the surface of the n-type silicon germanium layer 242 with heat. At this time, another effective method may be employed in which another silicon layer is formed on the n-type silicon germanium layer 242 and the silicon layer is oxidized with heat in place of direct heat oxidation of the silicon germanium layer 243.

A portion of the oxide film 243 is removed, and then a p-type silicon germanium layer 244 (containing germanium by 20%, density of boron: $1E19$ $cm^{-3}$ and thickness: 20 nm) is formed on only the silicon germanium layer 242 by a selective growth method in such a manner that no thin film grows on the oxide film 243. Then, a silicon layer 245 (density of arsenic: $1E20$ $cm^{-3}$) containing n-type impurities at a high density is formed on the overall surface including the surface of the oxide film 243.

The above-mentioned polycrystalline thin films except the oxide silicon film can be allowed to grow by the ultra high vacuum CVD apparatus. The growth method is similar to that disclosed in Japanese Patent Application No. 6-34019. By simultaneously employing a method disclosed in Japanese Patent Application No. 6-213959 in which a raw material decomposing heater is operated to decompose a portion of raw material molecules to supply it to the surface of the growing portion, selective growth and non-selective growth can easily be controlled. Although the example in which the single crystalline thin film is formed on a single crystalline substrate is described in the above-mentioned disclosure, polycrystalline layer can easily be formed by forming a thin film on an amorphous substrate as is performed in this embodiment.

Then, a MOS-FET having the foregoing oxide film as the gate insulating film can be formed in a portion including the oxide film. That is, the n-type silicon layer 245 formed on the oxide silicon film 243 is etched such that a portion of the n-type silicon layer 245 is left so that a gate electrode is formed. After the side wall of the gate electrode has been processed, ions are implanted so that source and drain portions are formed.

Since the thus-manufactured FET has the polycrystalline silicon germanium layer 242 serving as the channel, a high mutual conductance can be obtained as compared with a FET manufactured by polycrystalline silicon.

On the other hand, a bipolar transistor can be manufactured in a portion which does not contain the oxide film. That is, the n-type silicon germanium layer 242 is used as a collector, the p-type silicon germanium layer 244 is used as a base and the n-type silicon layer 245 is used as an emitter. The electrodes in the respective layers are formed by opening contact holes from the surface. The thus-manufactured bipolar transistor is a hetero bipolar transistor having a band gap of the emitter which is wider than that of the base layer similarly to the first embodiment.

Thirtieth Embodiment

FIG. 57 is a cross sectional view of a semiconductor apparatus according to a thirtieth embodiment of the present invention.

Initially, an oxide film 251 (having a thickness of 300 nm) is formed on a silicon substrate 250 by a heat oxidation process. Then, a polycrystalline silicon layer 252 having a thickness of 500 nm is formed by the CVD method. Then, a polycrystalline silicon germanium layer 253 having a thickness of 20 nm and containing germanium by 10% is laminated on the polycrystalline silicon layer 252. No impurity is added to the two layers above.

Then, a polycrystalline silicon layer 254 to which boron has been added by $3E18$ $cm^{-3}$ and having a thickness of 300 nm is formed. The above-mentioned polycrystalline thin films are formed by the ultra high vacuum CVD apparatus. Then, the surface of the silicon layer 254 is oxidized with heat so that an oxide silicon layer 258 having a thickness of 30 nm is formed. Then, the polycrystalline silicon layer 257 is removed by etching in such a manner that a portion which is formed into the gate of the FET is left. Then, a side wall is formed in the thus-formed gate portion, and then boron ions are implanted so that the source and the drain are formed. Finally, each electrode is formed so that the FET is manufactured.

In the FET according to this embodiment, holes supplied from the silicon layer 254 can be accumulated in the polycrystalline silicon germanium layer 253 and excellent mobility can be realized. Therefore, excellent performance can be obtained. A significant effect can be obtained when a silicon layer having no impurities added thereto is inserted between the p-type silicon layer 254 and the polycrystalline silicon germanium layer 253.

Although electrons flow in a direction perpendicular to the thin film of the polycrystalline semiconductor of the hetero bipolar transistor shown in FIG. 55, holes flow in the in-plane direction of the polycrystalline semiconductor thin film layer according to this embodiment. Also the above-mentioned system is able to have a significant device characteristic by controlling the thickness to be not greater than 40 nm which is substantially the same as the grain size of polycrystalline. The mobility of holes realized when the thickness of the single crystalline silicon germanium layer 253 is changed from 200 nm to 20 nm is as follows:

| Thickness (cm) | 200 | 150 | 100 | 80 | 70 | 60 | 50 | 40 | 30 | 20 |
|---|---|---|---|---|---|---|---|---|---|---|
| Mobility ($cm^2$/VS) | 30 | 32 | 31 | 35 | 36 | 35 | 45 | 80 | 90 | 100 |

As can be understood from the table above, the mobility of holes are raised when the thickness has been made to be about 40 nm. Even in a case of a device in which holes run in the lateral direction, the performance can be improved by reducing the thickness of the polycrystalline semiconductor film to be not greater than 40 nm which is substantially the same as the grain size.

If the thickness is large, a multiplicity of grain bulks exist in the silicon germanium layer of the polycrystalline semiconductor film and thus electrons (or holes) in the grain bulk are affected by the potential of the interface of the grain bulk as compared with the hetero interface. Therefore, the hetero trapping effect sometimes becomes unsatisfactory. If the thickness is large, the difference in the lattice constant between silicon and silicon germanium is absorbed in the interface of the grain bulk. On the other hand, if the thickness is enlarged to approximate the grain bulk, distortion is generated in each grain. Thus, it is considered that the foregoing effect raises the mobility of holes in the silicon germanium crystalline portion.

In each of the foregoing embodiments, the UHV-CVD method using the cracking heater disclosed in Japanese Patent Application No. 6-213959 is employed to continuously form the respective layers so that impurities, such as carbon and oxygen, are removed from the interface of the layers. Thus, the effect of the present invention can furthermore be improved.

Since the above-mentioned method permits required impurities to be added to the layers after the temperature at which the thin film is allowed to grow has been set to 400° C. or lower, quartz glass or the like can be employed to form the substrate. Therefore, the apparatus can be designed furthermore freely.

Thirty-First Embodiment

FIG. 58 is a cross sectional view of a high voltage diode according to a thirty-first embodiment of the present invention. FIG. 59 is a graph showing distribution of densities of impurities in the high voltage diode according to this embodiment. The high voltage diode has a structure such that an oxide film 262 and a polycrystalline silicon layer 263 are formed on a semiconductor substrate 261. The polycrystalline silicon layer 263 has a p-type source region 264, an n⁻ base region 265 and an n-type drain region 266 formed in this sequential order and in parallel. An anode electrode 267 serving as the anode of the apparatus is formed on the p-type source region 264. A cathode electrode 268 serving as a cathode of the apparatus is formed on the n-type drain region 266.

A method of manufacturing the high voltage diode will now be described with reference to FIG. 60. As shown at steps A to B in FIG. 60, an oxide film 262 is formed on the substrate in the bulk state by heat oxidation or deposition. A polycrystalline silicon layer 263 is formed on the oxide film 262 by deposition (see step C in FIG. 60) of polycrystalline silicon or annealing or laser annealing (see steps D and E in FIG. 60) after amorphous silicon has been deposited. The polycrystalline SOI substrate is different from the conventional SIMOX in that the thickness of the oxide film 262 can be made to be a required value. Since the polycrystalline silicon layer 263 is formed by depositing polycrystalline silicon or amorphous silicon 269, a thin film having a uniform thickness can easily be formed. The amorphous silicon 269 can be formed into a polycrystalline silicon layer having an excellent quality by annealing at 600° C. for about 8 hours. The voltage resistance of a device made of the polycrystalline silicon is equivalent to that of a device made of single crystalline silicon. Therefore, by forming a p-type conducting region and an n-type region on the above-mentioned polycrystalline SOI substrate, a high voltage semiconductor device can be obtained.

Figure 61:
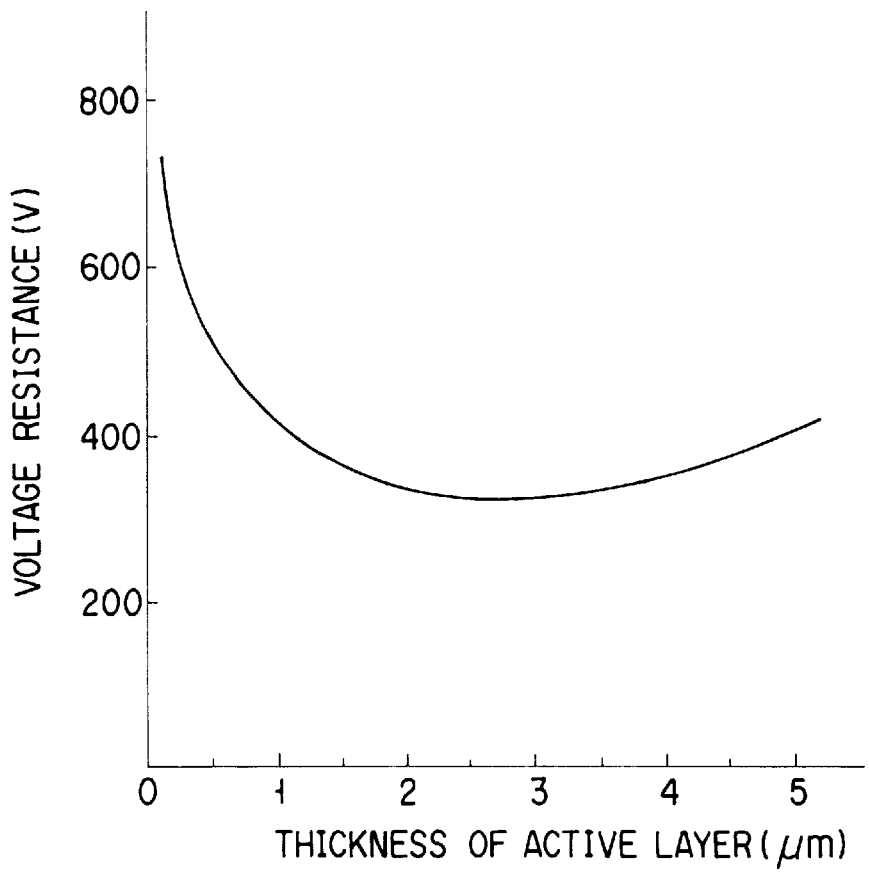
FIG. 61 is a diagram showing dependency of the voltage resistance of the device according to the thirty-first embodiment upon the thickness of an active layer.

FIG. 61 is a graph showing dependency of the voltage resistance of the device upon the thickness of the active layer (an n⁻ base region 265). If the thickness of the active layer is in a range from several $\mu$m to tens of $\mu$m, the voltage resistance of the device is weakened in proportion to the thickness of the active layer. If the thickness of the active layer is not greater than 2 $\mu$m, satisfactory voltage resistance can be obtained.

Since a diode has a structure such that the diffusion layers of the n-type drain region 266 and the p-type source region 264, which are in a dense state, reach the bottom portion of the active layer, all of inverse bias voltage applied to the n-type drain region 266 is shared by the lower oxide film 262. Therefore, a structure in which the thickness of the lower oxide film 262 is determined to be an appropriate value enables satisfactory voltage resistance to be maintained even if the thickness of the active layer of the polycrystalline silicon layer 263 is a small value of about 1 $\mu$m.

Since the active layer can easily be thinned if the polycrystalline silicon is employed as is employed in this embodiment, a satisfactory thin device can be manufactured. A thin-type high voltage diode capable of withstanding voltage of 400 V or greater and having a thickness of 1 $\mu$m or smaller can be formed. The structure shown in FIG. 61 has voltage resistance of 730 V to 400 V when the thickness of the active layer has a thickness of 0.1 $\mu$m to 1 $\mu$m. If the structure of the device is the same, the polycrystalline silicon has greater voltage resistance than that of single crystalline silicon.

Thirty-Second Embodiment

Figure 62:
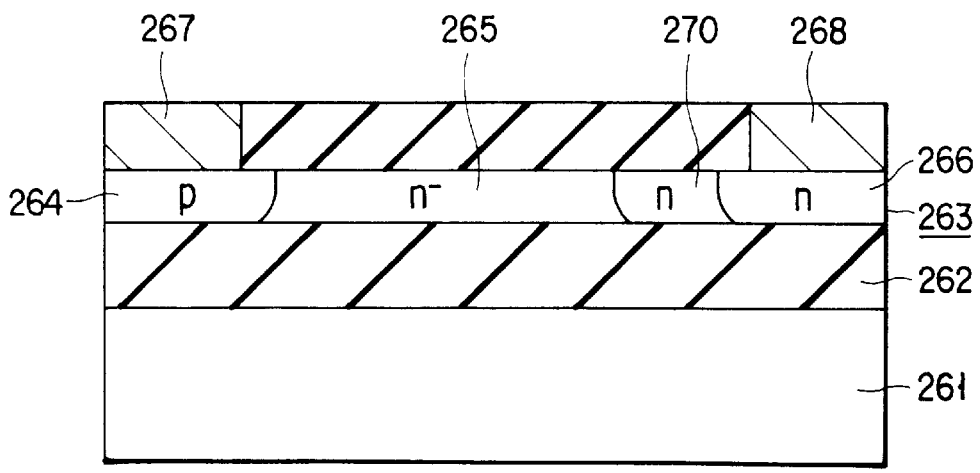
FIG. 62 is a cross sectional view showing a high voltage diode according to a thirty-second embodiment of the present invention.

FIG. 62 is a cross sectional view of a high voltage diode according to a thirty-second embodiment of the present invention. FIG. 63 is a graph showing distribution of impurities in the high voltage diode according to this embodiment. The high voltage diode according to this embodiment has a structure different from the structure shown in FIG. 58 in that an n-type conducting region 270 is formed in the n⁻ base region 265 having a low density in such a manner that the n-type conducting region 270 is in contact with the n-type drain region 266 having a high density, the n-type conducting region 270 having an intermediate density.

The n-type conducting region 270 is formed by using the high diffusion rate of impurities in the polycrystalline silicon and by a heat process. The n-type conducting region 270 enables the density to have a gradient from the n-type drain region 266 to the p-type source region 264. Thanks to the gradient of the density, concentration of electric fields in the drain portion occurring when the inverse bias voltage is applied can effectively be moderated. In a case of a single crystalline silicon, a process must be performed in which masks corresponding to the plural layers are used to gradually change the density of impurity ions in order to incline the density. In a case of a polycrystalline silicon layer, for example, a mask for one layer is used when n-type impurity ions are implanted, followed by performing a heat process and diffusing the impurities so that the density has a gradient over a wide region. If the period of the heat process is elongated in the case of the polycrystalline silicon layer, the gradient of the density can be uniformed, as shown in FIG. 64.

The density gradient is effective for the structure respectively according to the thirty-first to thirty-sixth embodiment.

A manufacturing process for realizing the density gradient will now be described.

Although a process for depositing amorphous silicon into a polycrystalline form will now be described, polycrystalline silicon may directly be deposited. As shown at steps A to C in FIG. 65, amorphous silicon 269 is deposited, and then it is formed into a polycrystalline shape by annealing or laser annealing. Then, impurity ions having a density suitable to the n⁻ base region are implanted, and then a heat treatment is performed. Thus, as shown at step D in FIG. 65, an SOI substrate having the polycrystalline layer 263 containing impurities at a required density is formed.

If the density of the impurities in the polycrystalline layer 263 is $1.0 \times 10^{10}$ cm⁻² to $2.0 \times 10^{12}$ cm⁻², more preferably $0.5 \times 10^{12}$ cm⁻² to $8 \times 10^{12}$ cm⁻², satisfactory high voltage resistance can be obtained. In order to protect crystalline from damage by the implanted ions, ions may be implanted before the process for forming the polycrystalline is performed.

Then, as shown at step E in FIG. 65, ions are implanted into a region wider than the n-type drain region 268, and then heat process is performed. Thus, density gradient can be realized in the n⁻ base region 265, as shown at step F in FIG. 65. It is preferable that the overall quantity of the impurity ions be in a range from $1.0 \times 10^{11}$ cm⁻² to $3.0 \times 10^{12}$ cm⁻². Since the impurities are diffused in the polycrystalline at a high rate, density gradient can be realized in the overall n-type base region by determining the conditions of the heat process.

Figure 66:
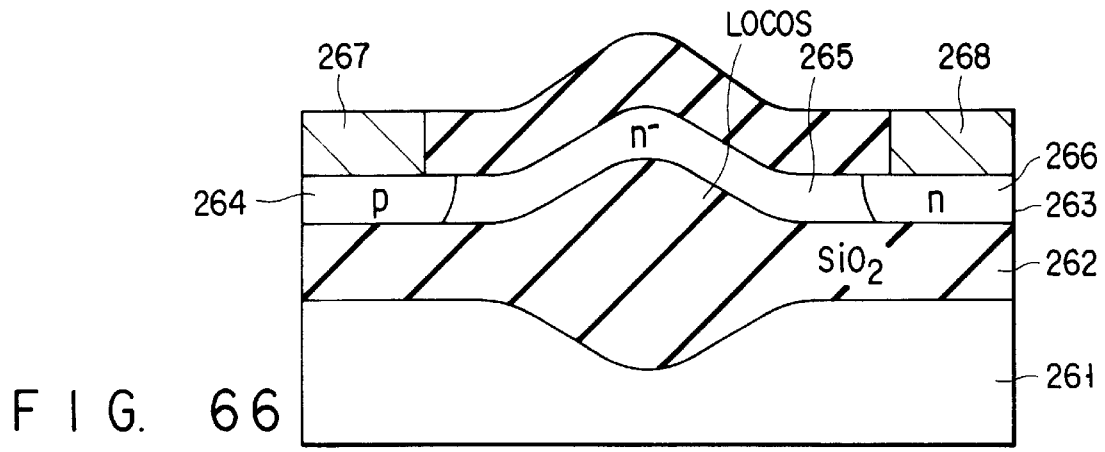
FIG. 66 is a structural view showing a modification of the high voltage diode which can be formed by deposition.

Then, as shown at step G in FIG. 65, the p-type source region 264 and the cathode electrode 268 are diffused and formed. In the case where the polycrystalline silicon layer 263 is formed into the active layer as described above, it is formed by deposition, as shown in FIGS. 60A to 60E. Therefore, it can be formed regardless of the shape of the lower layer. Therefore, an output portion or a control circuit portion having a shape over the LOCOS may be formed, as shown in FIG. 66.

Thirty-Third Embodiment

Figure 67:
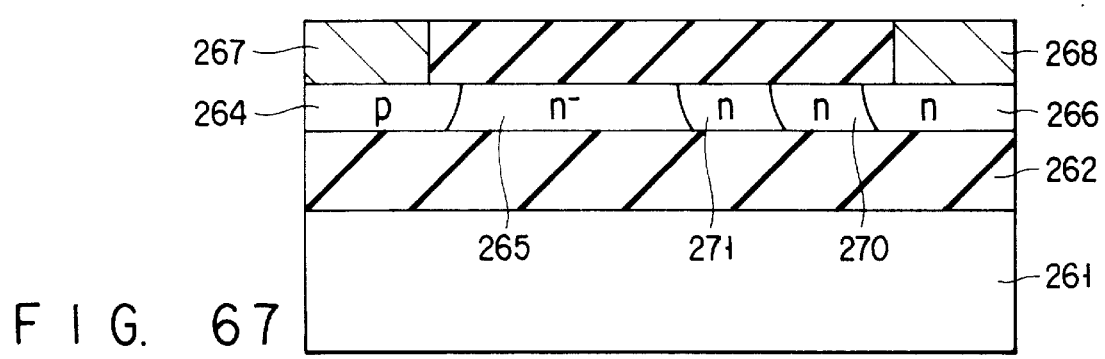
FIG. 67 is a cross sectional view showing a high voltage diode according to a thirty-third embodiment of the present invention.

FIG. 67 is a cross sectional view showing a high voltage diode according to a thirty-third embodiment. The high voltage diode according to this embodiment is different from the structure shown in FIG. 62 in that a plurality of n-type conducting regions 270 and 271 are formed in the n⁻ base region 267 having a low density in order to uniform the density gradient. Each of the n-type conducting regions 270 and 271 is formed by a process in which ion implantation is performed twice while changing the width of the opening in the mask. The above-mentioned process has a reduced number of steps as compared with the process for realizing the density gradient in the single crystalline silicon layer.

Thirty-Fourth Embodiment

Figure 68:
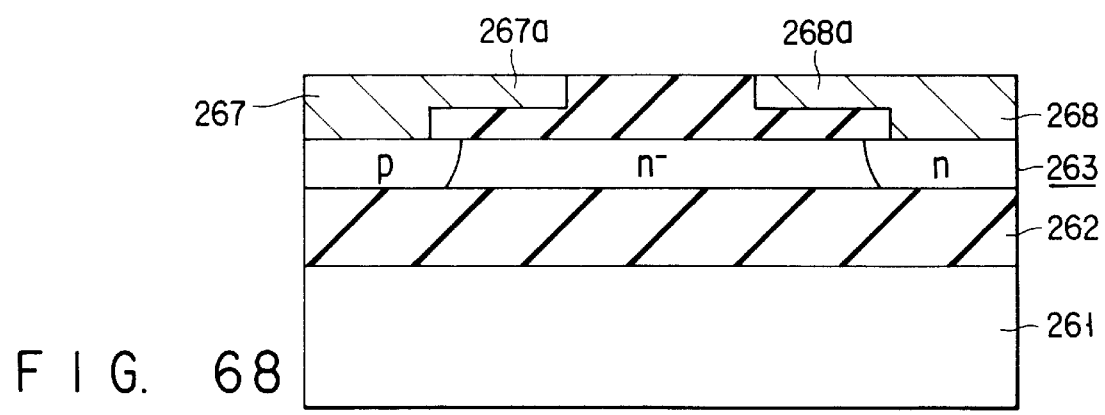
FIG. 68 is a cross sectional view showing a modification of the structure of the high voltage diode shown in FIG. 58.

FIG. 68 is a cross sectional view showing a modification of the structure according to the embodiment shown in FIG. 58. The high voltage diode according to this embodiment is different from the structure shown in FIG. 58 in that the cathode electrode 268 and the anode electrode 267 have field plates 267a and 268a. The field plates cause the concentration of electric fields in the drift region to be moderated and therefore the voltage resistance can furthermore be improved.

Figure 69:
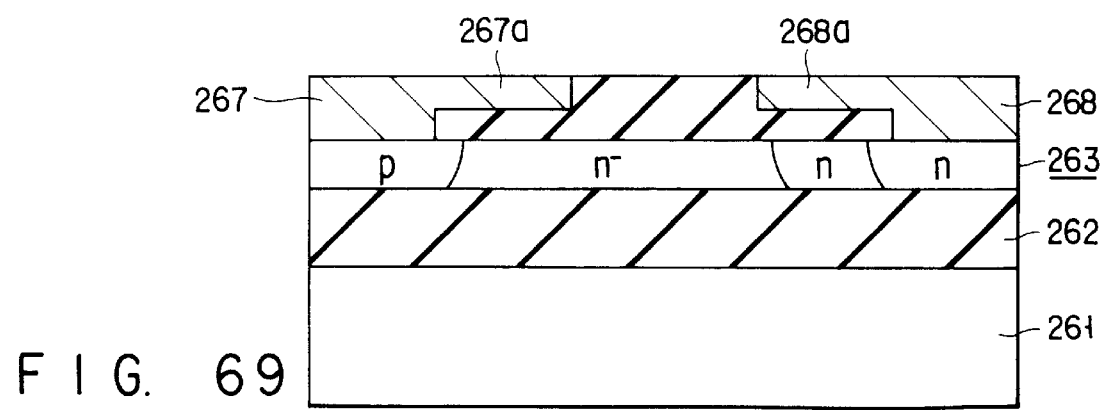
FIG. 69 is a cross sectional view showing a modification of the structure of the high voltage diode shown in FIG. 62.

The above-mentioned field plates are suitable for the thirty-first to thirty-sixth embodiments. If the field plates 267a and 268a are provided for the structure shown in FIG. 62, a structure shown in FIG. 69 is formed.

Thirty-Fifth Embodiment

Figure 70:
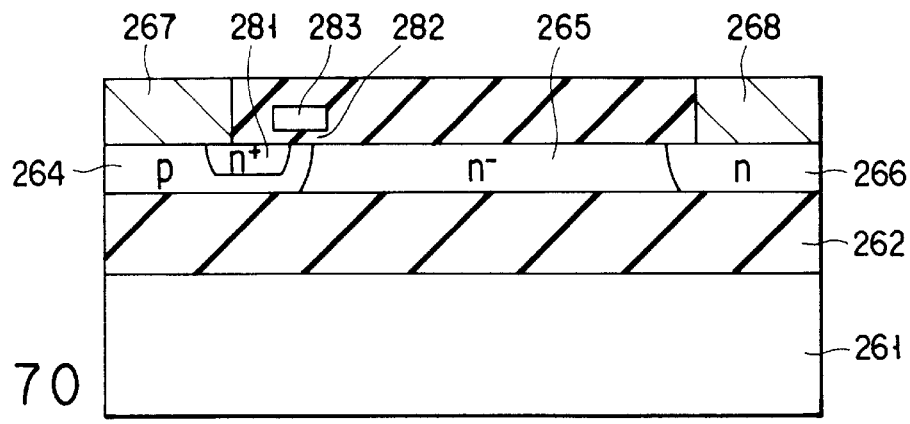
FIG. 70 is a cross sectional view showing a MOSFET having a structure obtained by modifying the structure shown in FIG. 58.

FIG. 70 is a cross sectional view of a MOSFET having a structure which is a modification of the structure shown in FIG. 58. The MOSFET according to this embodiment is different from the structure shown in FIG. 58 in that a dense n-type source region 281 is selectively diffused and formed on the surface of the p-type source region 264. Moreover, a gate electrode 283 is formed in a region from the end of an n-type source region 281 to a position of contact with the n⁻ base region 265 through the p-type source region 264, the gate electrode 283 being formed through a gate oxide film 282 having a thickness suitable to the drive voltage.

Figure 71:
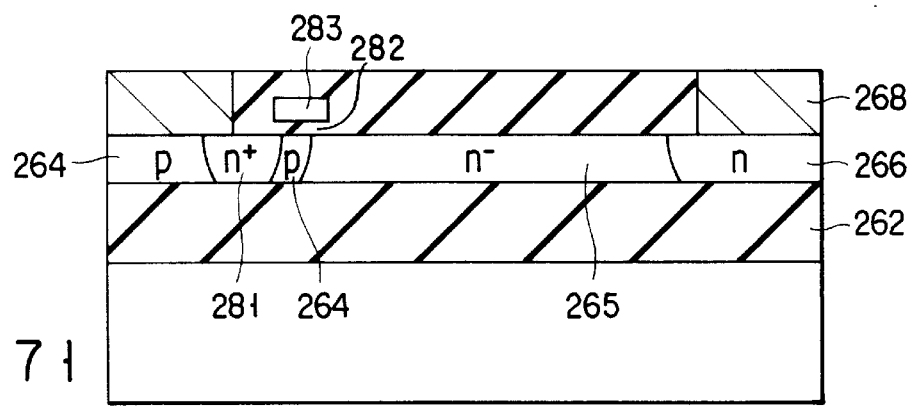
FIG. 71 is a cross sectional view showing a modified structure of the MOSFET shown in FIG. 70.

Even if the MOSFET has the above-mentioned structure, a high voltage lateral semiconductor apparatus can be formed. FIG. 71 shows a MOSFET having a structure different from that shown in FIG. 70 in that a very thin active layer is provided and the n-type source region 281 reaches the oxide film. Also in the above-mentioned structure, high voltage is applied to the drain portion, the voltage resistance is not weakened and thus satisfactory voltage resistance can be realized.

Thirty-Sixth Embodiment

Figure 72:
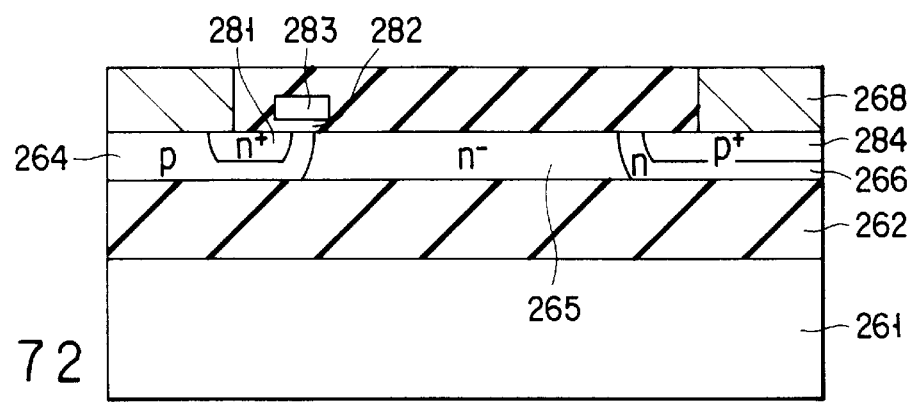
FIG. 72 is a cross sectional view showing an IGBT which having a structure obtained by modifying the structure shown in FIG. 70.

FIG. 72 is a cross sectional view of an IGBT having a structure which is a modification of the structure shown in FIG. 70. The IGBT according to this embodiment is different from the structure shown in FIG. 70 in that a dense p-type emitter layer 284 is diffused and formed selectively on the surface of the n-type drain region 266. Also in the foregoing structure of the IGBT, high voltage is applied to the drain portion and is shared by the oxide film 262 similarly to the above-mentioned structure. Thus, the voltage resistance is not weakened and high voltage resistance can be realized.

Figure 73:
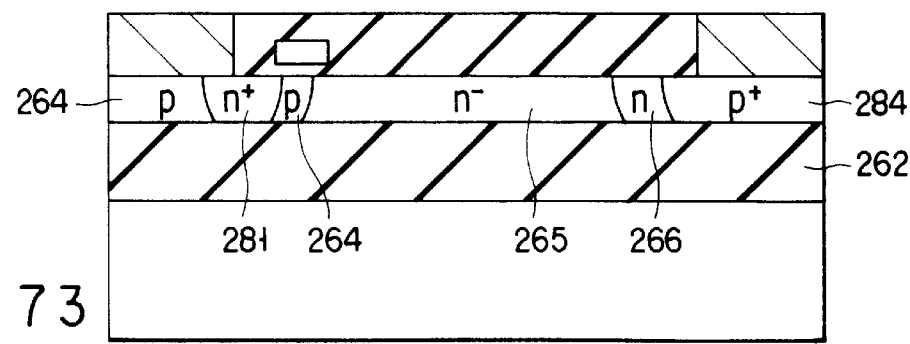
FIG. 73 is a cross sectional view showing a modified structure of the IGBT shown in FIG. 72.

Similarly, an IGBT shown in FIG. 73 is different from that shown in FIG. 72 in that a very thin active layer is provided and the n-type source region 281 and the p-type emitter layer 284 reach the oxide film. In also the foregoing structure, high voltage is shared by the oxide film similarly to the above-mentioned structure so that satisfactory voltage resistance is realized.

Thirty-Seventh Embodiment

Modifications of the first embodiment will now be described. That is, semiconductor apparatuses according to thirty-seventh to forty-first embodiments have a structure in which an amorphous silicon layer is annealed into a polycrystalline silicon layer and ion implantation into the polycrystalline silicon layer is performed to form a lateral semiconductor device.

Figure 74:
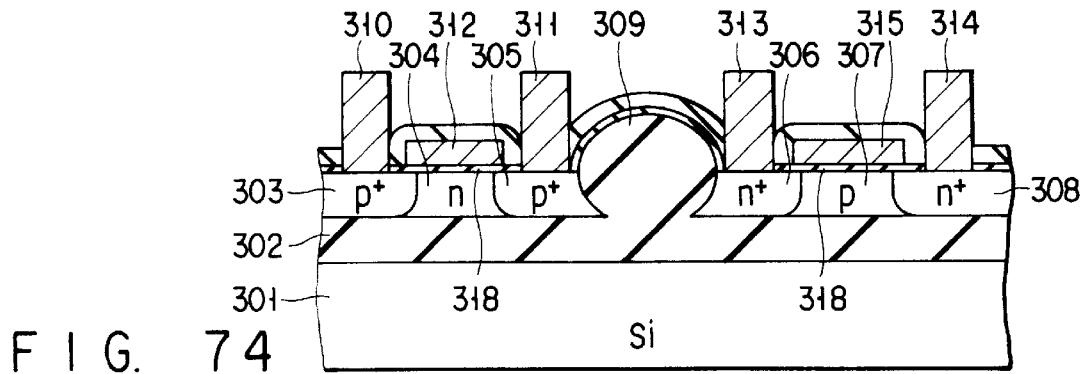
FIG. 74 is a cross sectional view showing a CMOS according to thirty-seventh embodiment of the present invention.

FIG. 74 is a cross sectional view schematically showing the structure of a CMOS according to a thirty-seventh embodiment of the present invention. The CMOS has a pMOS portion having an embedded oxide film 302 formed on a silicon substrate 301 and composed of a p-type source region 303 selectively formed on the embedded oxide film 302, an n-type region 304 in which a channel is formed and a p-type drain region 305; an nMOS portion composed of an n-type source region 306 and a p-type region 307 in which a channel is formed and an n-type drain region 308; and a device isolating insulating film 309 for isolating the pMOS portion and the nMOS portion from each other. On each of the foregoing regions, corresponding source electrode 310, a drain electrode 311, a gate electrode 312, a source electrode 313, a drain electrode 314 and a gate electrode 315 are formed. Thus, the basic structure of the CMOS transistor is formed.

The regions 303 to 308 for forming the pMOS portion and the nMOS portion are formed such that a high-resistance polycrystalline silicon layer previously formed thicker than a region which is damaged by implanted impurity ions is LOCOS-separated; ions are implanted to dope impurities; a heat diffusion process is performed; and oxidation and etching are performed to have a small thickness.

Specifically, the regions are formed in such a manner that the thickness when ions are implanted is made to be about 200 nm and the thickness after the etching process has been performed is made to be 100 nm.

The CMOS according to this embodiment will now be described in accordance with the manufacturing process.

Initially, an oxide film 302 is formed on the silicon substrate 301 by heat oxidation or the like, and then amorphous silicon is deposited on the oxide film 302. Amorphous silicon above is formed into polycrystalline by annealing at 600° C. for about 8 hours. As has been known, amorphous silicon is formed into a high quality polycrystalline silicon when annealed at 600° C. for about 8 hours. The polycrystalline silicon layer is formed to have a thickness of, for example, about 200 nm to protect the bottom portion of the layer from damage from ion implantation which is performed later.

Figure 75A:
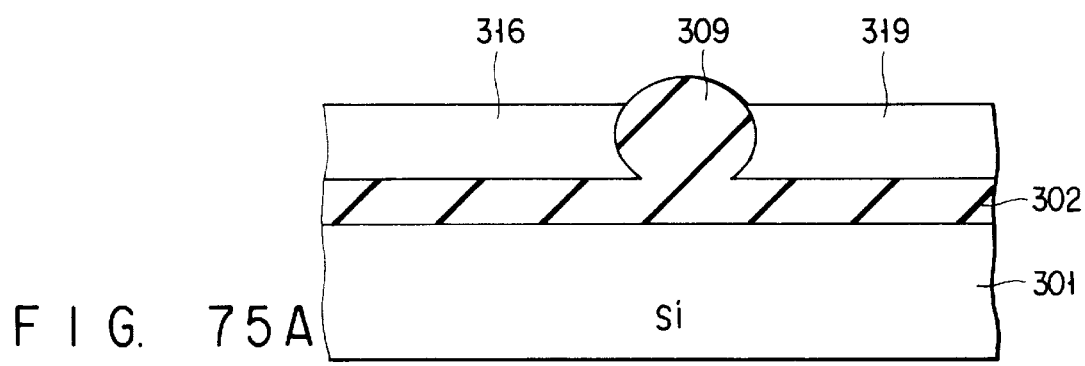
FIGS. 75A to 75F are diagrams showing a process for manufacturing a CMOS according to the thirty-seventh embodiment.

Then, as shown in FIG. 75A, a device isolating insulating film 309 is formed in the polycrystalline silicon layer 316 by the known LOCOS isolation method.

Figure 75B:
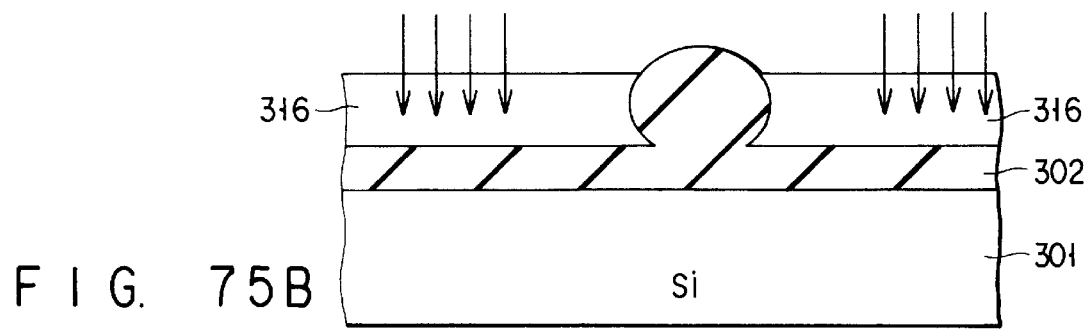

Then, as shown in FIG. 75B, ion implantation is performed to dope impurities to form a channel. Since the polycrystalline silicon layer 316 is formed to have a thickness larger than the region which is damaged by implanted ions, the crystallinity of the upper portion is broken by implanted ions and thus formed into an amorphous form while the bottom portion has a high quality polycrystalline portion allowed to remain as it is.

Figure 75C:
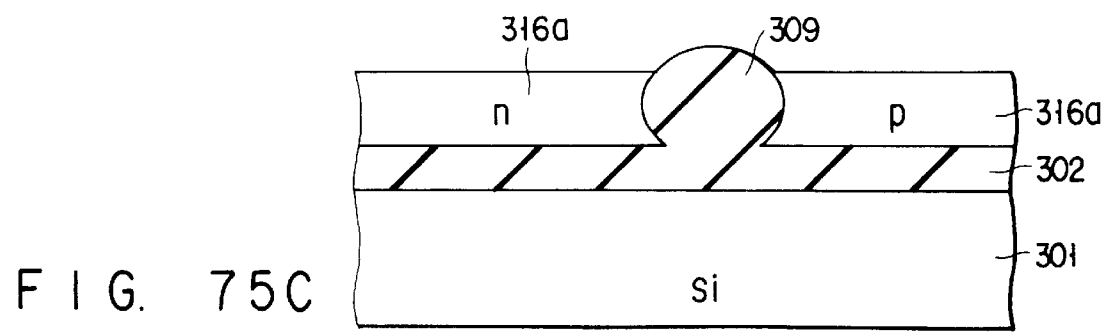

Then, an annealing process is performed so that the implanted impurities are diffused, as shown in FIG. 75C. Thus, p and n-type regions each having a predetermined density are formed. Also the crystallinity of the damaged region ruptured due to the ion implantation can be restored by the heat process in such a manner that the polycrystalline portions in the bottom portion are used as the cores. That is, an active layer 316a having a predetermined channel density can be formed while maintaining the polycrystalline characteristic. Since the LOCOS separation has been performed before ions are implanted for forming the channel, the regions can be formed independently even if the pMOS portion and the nMOS portion are formed adjacently.

Figure 75D:
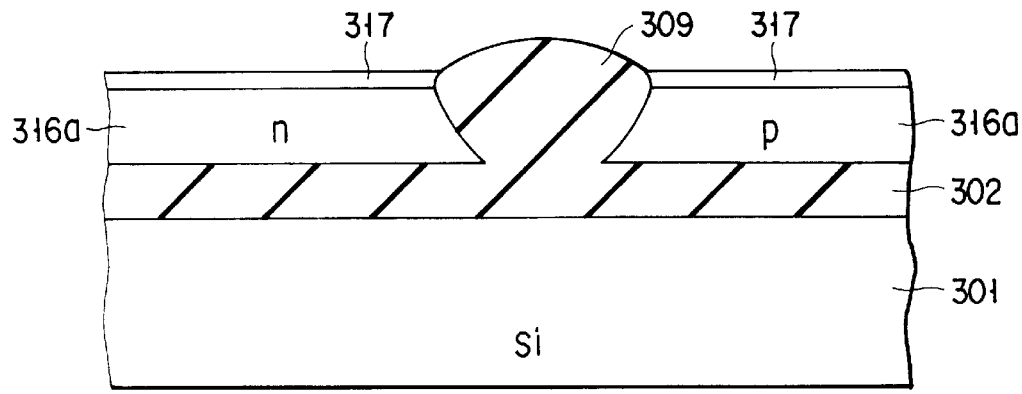
Figure 75E:
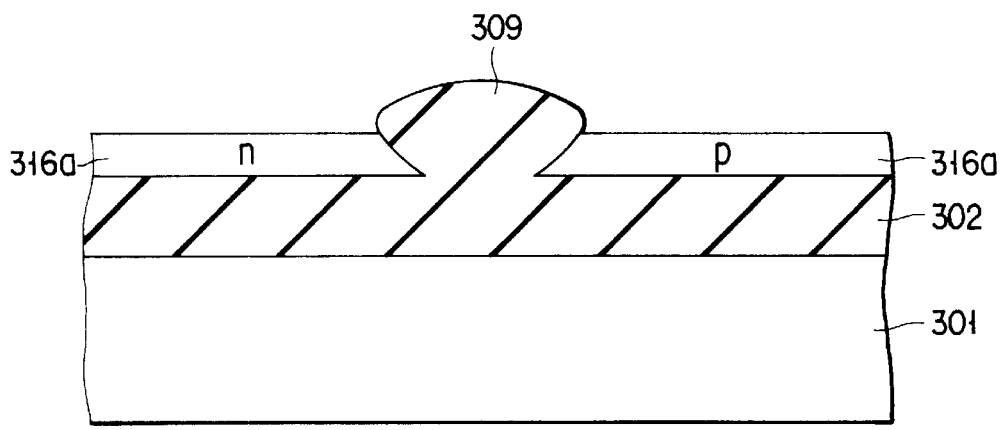
Figure 75F:
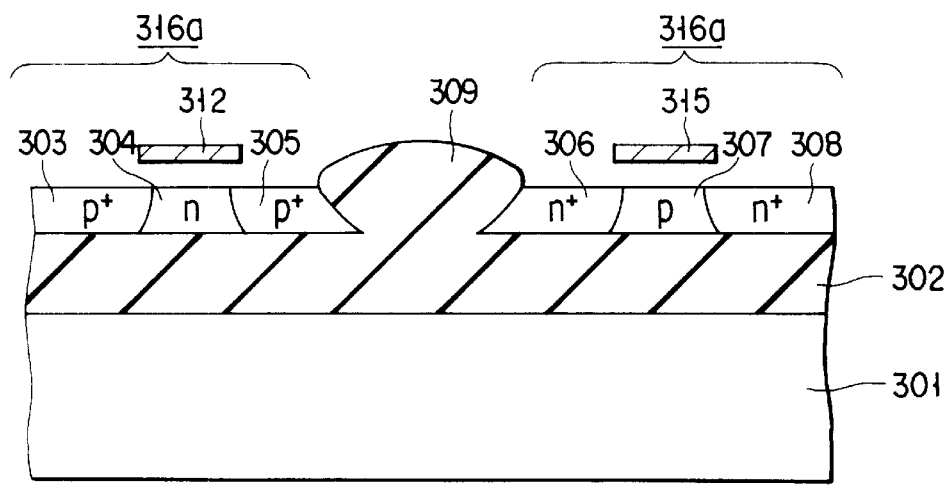

Then, as shown in FIG. 75D, an oxide film 317 is formed on the surface of the active layer 316a by heat oxidation or the like so that the active layer 316a is thinned. Then, as shown in FIG. 75E, the oxide film 317 is removed by etching or the like. As a result, the thin active layer 316a is formed. Then, ions are implanted into the pMOS portion and annealing is performed so that the p-type source layer 303 and the p-type drain layer 305 are formed. The nMOS portion is subjected to a similar process so that the n-type source layer 306 and the p-type drain layer 308 are formed. Then, the gate insulating film 318 is formed, and then the gate electrodes 312 and 315 are formed on the gate insulating film 318. As a result, as shown in FIGS. 75F and 74, a polycrystalline semiconductor apparatus having excellent characteristic because of a satisfactory crystallinity and the thin active layer 316a can be formed. Note that the gate insulating film is omitted from FIG. 75F. Then, a source electrode and a drain electrode are formed. If the initial thickness is about 200 nm, the polycrystalline portion can be maintained in the bottom portion by implantation of ions at a low acceleration. Then, oxidation and etching are performed so that an active layer 316 exhibiting excellent electric characteristics and having a thickness of about 100 nm can easily be formed.

As described above, according to the thirty-seventh embodiment, the device regions 303 to 308 of the CMOS are formed by reducing the thickness of the high-resistance polycrystalline silicon layer 316, which has been formed to have a thickness larger than the thickness of the region, which is damaged by the ion implantation, after the ion implantation and annealing. Therefore, the portion in the bottom portion of the polycrystalline layer, which is not damaged, can be used as the core by annealing performed after ions have been implanted to restore the crystallinity. Then, the thickness is reduced to improve the characteristics as the device. Thus, excellent characteristics can be realized while reducing the cost.

Thirty-Eighth Embodiment

A CMOS according to a thirty-eighth embodiment of the present invention will now be described.

FIG. 76 is a cross sectional view schematically showing the structure of the CMOS according to this embodiment. The same elements as those shown in FIG. 74 are given the same reference numerals and the same elements are omitted from description. Only the different portions will now be described.

That is, the CMOS according to this embodiment has a structure which is a modification of the structure according to the thirty-seventh embodiment. Specifically, this embodiment is different from the thirty-seventh embodiment in that the thickness of each of the regions 303a to 308a made of polycrystalline silicon is reduced previously.

Each region is covered with a mask when ions are implanted so that ions are selectively implanted. Thus, the polycrystalline characteristic can be maintained directly under the mask. The annealing process performed as a post-process enables the overall crystallinity to be restored in such a manner that the polycrystalline portion directly under the mask is used as the core.

If the area of the portion covered with the mask is excessively large, diffusion of impurities does not performed sufficiently. If the portion which is not covered with the mask is too large, restoration of the crystallinity cannot be performed satisfactorily. Therefore, it is preferable that the mask be patterned at predetermined intervals. In this embodiment, a mask having a stripe pattern running parallel to the direction of the channel (a direction of the electric current) is employed. Although the pattern for the mask may be determined arbitrarily, it is preferable that the above-mentioned pattern running parallel to the direction of the channel or a pattern having the same interval shapes be used in order to uniformly form the channel regardless of the irregular processing conditions. The mask is arranged such that the area of the mask is reduced for the portion in which the diffusion or the grow takes place slower. That is, the area covered with the mask is reduced in the case where the diffusion takes place slower. If the growth takes place slower, the area covered with the mask is enlarged. Thus, irregularity of the channel can be prevented.

The CMOS will now be described in accordance with the manufacturing procedure.

Initially, similarly to the above-mentioned procedure, the polycrystalline silicon layer 316 is formed from amorphous silicon as shown in FIG. 77A. The polycrystalline silicon layer 316 is, by the device isolating insulating film 309, LOCOS-isolated.

Then, as shown in FIG. 77B, a stripe mask (resist) 321 is used to implant ions. As a result, the polycrystalline silicon layer 316 is, as shown in FIG. 78, brought to a state where regions (indicated by symbol p shown in FIG. 78) in each of which ions are implanted in a direction of the depth of the device and regions in each of which ions are not implanted alternately appear.

Since the thickness of the polycrystalline silicon layer 316 has been reduced to improve the device characteristic, damage of the ion implantation reaches the bottom portion of the active layer in the region into which ions have been implanted even if the acceleration voltage is lowered. Thus, the crystallinity is sometimes ruptured. However, the polycrystalline portion is allowed to remain below the portion covered with the mask. Therefore, a heat process is performed as a post-process so that the crystallinity is restored in such a manner that the polycrystalline portion below the portion covered with the mask is used as the core. Since impurities in the polycrystalline silicon are diffused at high speed, diffusion uniformly propagates to a portion covered with the mask.

If the direction of the stripe of the mask is aligned to the direction of the channel (the direction of the electric current), deterioration in the device characteristic can be prevented even if the crystallinity and the impurities profile depend upon the mask pattern because the direction is the same as the direction of the electric current.

Then, the oxidation and etching processes according to the above-mentioned embodiment are omitted in this embodiment. Then, the heat treatment is performed after ions have been implanted so that the crystallinity is restored, and then electrodes are formed. As a result, a high quality CMOS as shown in FIG. 76 can be manufactured.

As described above, according to the thirty-eighth embodiment, the mask 321 is used when ions are implanted for forming the channel to remain the polycrystalline portion below the mask. Therefore, even if the polycrystalline silicon layer 316 is previously thinned, a CMOS made of high quality polycrystalline silicon can be manufactured.

Since the thickness of the polycrystalline silicon can be thinned in the initial state, the heat oxidation and etching processes according to the thirty-seventh embodiment for reducing the thickness of the polycrystalline layer after the heat treatment has been performed can be omitted. Thus, the manufacturing process can be simplified.

Thirty-Ninth Embodiment

A CMOS according to a thirty-ninth embodiment of the present invention will now be described. The CMOS according to this embodiment has a structure similar to that according to the thirty-eighth embodiment except for the mask pattern for use when ions are implanted for forming the channel. Therefore, only the different portion will now be described.

FIG. 79 is a diagram showing a process for forming the CMOS in which the stripe of the mask is made to run parallel to the direction of the lateral depth of the device. Referring to FIG. 79, symbol p represents a region into which ions are implanted. Even if the foregoing mask pattern is employed, a CMOS having a thin active layer and exhibiting excellent device characteristic can be formed similarly to the second embodiment.

The CMOS using the mask pattern according to this embodiment has a stripe pattern along the edge portions of the source regions 303a and 306a and the drain regions 305a and 308a. Therefore, the crystallinity and the impurities profile are made uniform in the edge portions. Thus, an influence of the deterioration in the voltage resistance can be prevented.

Fortieth Embodiment

A CMOS according to a fortieth embodiment of the present invention will now be described. Since the CMOS according to this embodiment has a similar structure as that of the CMOS according to the thirty-eighth embodiment except the mask pattern for use when ions are implanted for forming the channel, only the different portion will now be described.

FIG. 80 is a diagram showing a process for forming the CMOS patterned by setting a mask in the form of a lattice. Referring to FIG. 80, symbol p represents a region into which ions are implanted.

Even if the foregoing mask is used, an effect similar to that obtainable from the thirty-eighth embodiment can be obtained. Since ions are implanted in the lattice form, the channel can uniformly be formed even if the processing conditions are irregular in the process for forming the device.

Forty-First Embodiment

A CMOS according to a forty-first embodiment of the present invention will now be described. The CMOS according to this embodiment has a structure similar to that according to the thirty-eighth embodiment except for the angle at which ions are implanted for forming the channel. Therefore, only different portions will now be described.

FIG. 81 is a diagram showing a state where ion implantation for forming the channel is performed to make an angle from the surface of the wafer. In a case of a thin polycrystalline silicon layer, the conventional method cannot prevent rupture of the crystallinity to the bottom portion of the polycrystalline silicon layer even if the acceleration voltage at which ions are implanted is reduced. However, the process for forming the CMOS according to this embodiment has the arrangement in which the ion implantation is performed to make an angle to prevent damage caused from the ion implantation. If the ion implantation is performed as described above, the polycrystalline portion directly under the mask (the resist) cannot be damaged and allowed to retain similarly to the thirty-eighth embodiment and the fortieth embodiment. Therefore, the crystallinity of the active layer can be restored by the following annealing process.

That is, according to this embodiment, an effect similar to that obtainable from any one of the thirty-eighth to fortieth embodiments can be obtained.

Another Embodiment

Although the above-mentioned embodiments have been described while taking the CMOS as an example, the present invention is not limited to this. The present invention may similarly be applied to a device, such as a bipolar transistor or an IGBT (Insulated Gate Bipolar Transistor), that can be manufactured by using the polycrystalline silicon layer, and a similar effect can be obtained.

Forty-Second Embodiment

The foregoing embodiments have the structure in which the vertical power device and the lateral polycrystalline silicon device are integrated. Then, an embodiment of a semiconductor apparatus will now be described in which the vertical power device is omitted and only a lateral polycrystalline silicon device is formed. Note that the devices described in the second to forty-first embodiments may, of course, be solely employed regardless of the existence of the vertical power device.

Figure 82:
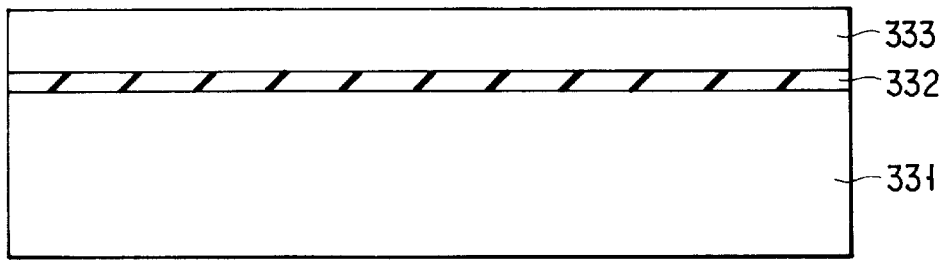
FIG. 82 is a cross sectional view showing a polycrystalline silicon substrate according to a forty-second embodiment of the present invention.

FIG. 82 is a cross sectional view showing the structure of a polycrystalline silicon substrate according to a forty-second embodiment of the present invention. The polycrystalline silicon substrate has a structure such that a polycrystalline silicon layer 333 is, through an oxide film 332 having a thickness of 10 nm or smaller, formed on a polycrystalline (or single crystalline) silicon substrate 331.

A method of manufacturing the above-mentioned polycrystalline silicon substrate will now be described.

Figure 83A:
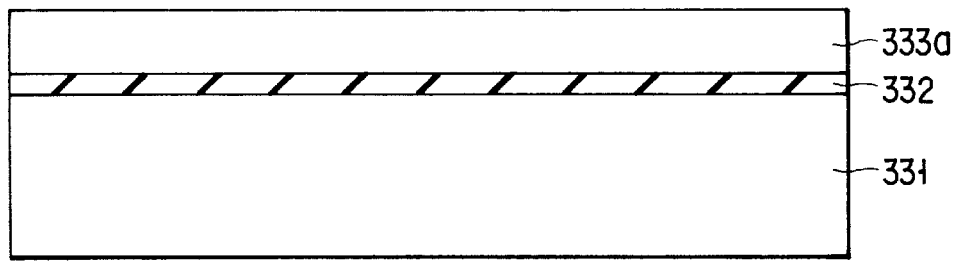
FIGS. 83A and 83B are diagrams showing a manufacturing process according to the forty-second embodiment.

The oxide film 332 having a thickness of 5 nm or smaller is formed on the polycrystalline Si substrate 1 by, for example, heat oxidation. Then, the CVD method is employed to deposit an amorphous silicon layer 333a on the oxide film 332, as shown in FIG. 83A.

Figure 83B:
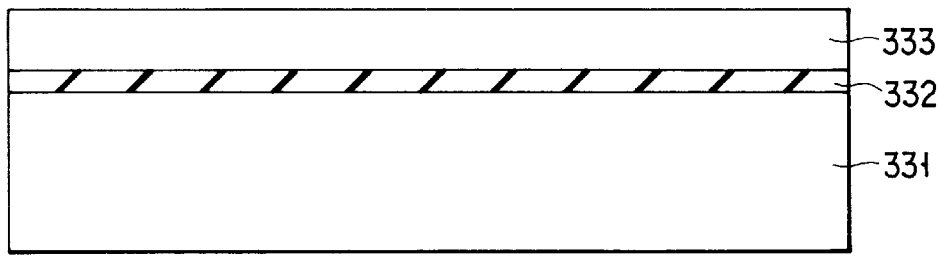

Then, annealing is performed at a usual temperature level of 600° C. for 20 hours. Thus, the amorphous silicon layer 333a receives information of the lower polycrystalline Si substrate 331 through the oxide film 332 so as to be formed into polycrystalline silicon from the oxide film 332 toward the surface in such a manner that the polycrystalline Si substrate 331 is used as the core. Finally, the polycrystalline silicon layer 333 is formed on the oxide film 332, as shown in FIG. 83B.

Since the thickness of the oxide film 332 is not greater than 100 nm, the stress from the oxide film 332 can be reduced during the foregoing process. Thus, the crystallinity can be improved when the annealing process is performed to form the amorphous silicon layer 333a into the polycrystalline silicon layer 333. When the annealing process is performed, the embedded oxide film 332 must be a very thin film. The reason for this is that the above-mentioned effect of improving the crystallinity can be obtained when the thickness of the embedded oxide film 332 is not more than 100 nm. If the thickness is not more than 50 nm, a significant effect can be obtained. If the same is not more than 5 nm, an excellent effect can be obtained.

Then, annealing is performed at 1300° C. or higher to prevent small crystalline defects and to improve the crystallinity. Thus, a structure having a large crystalline particles and exhibiting excellent crystallinity can be formed. If the crystallinity can be improved by annealing at 1300° C., the mobility can be improved. If annealing at 1300° C. or higher is performed in an atmosphere in which reducing gas, such as hydrogen, exists, movement takes place in the crystalline to plug defects. Thus, the crystallinity can be furthermore improved.

Then, oxidation is performed at a high temperature level of 1300° C. or higher and in an atmosphere of high concentration oxygen, the pressure of which is higher than one atmosphere, so as to thicken the internal oxide film 332. That is, the oxidation in the hot and high concentration oxygen atmosphere causes the surface of the polycrystalline silicon layer 333 to be oxidized. Moreover, the oxide film 332 in the inside portion can be thickened. That is, the polycrystalline silicon layer 333 exhibiting excellent crystallinity is formed by using the thin oxide film 332, and then the inside oxide film 332 is thickened. Thus, the voltage resistance of the oxide film 332 can be improved.

As described above, since the thickness of the oxide film 332 is not greater than 100 nm in the forty-second embodiment, the stress of the oxide film 332 can be reduced. Therefore, the crystallinity can be improved when usual annealing at about 600° C., with which the amorphous silicon layer 333a is formed into the polycrystalline silicon layer 333, is performed. Then, the polycrystalline silicon layer 333 is annealed at 1300° C. or higher so that small crystalline defects of the polycrystalline silicon layer 333 are decreased and the crystallinity is improved. Therefore, a structure having large crystalline particles and exhibiting excellent crystallinity can be formed.

Since the thickness of the oxide film is not greater than 10 nm in this embodiment, the foregoing effects can furthermore be improved.

Since the process for performing oxidation at high temperature higher than 1300° C. and in an atmosphere of high concentration oxygen higher than one atmosphere to thicken the oxide film 2 after annealing has been performed is included, the polycrystalline silicon layer 333 exhibiting excellent crystallinity is formed and then the internal oxide film 332 can be thickened. Therefore, the voltage resistance of the device can be improved while maintaining the excellent crystallinity.

Since the thickness of the oxide film 332 and the conditions under which the polycrystalline silicon layer 333 is annealed are regulated, the foregoing effects can reliably be obtained. Thus, the manufacturing process can be stabilized.

Since the silicon substrate 331 is made of polycrystalline silicon, it can be manufactured with a low cost.

Forty-Third Embodiment

An IGBT having the polycrystalline silicon substrate according to the forty-third embodiment of the present invention will now be described.

Figure 84:
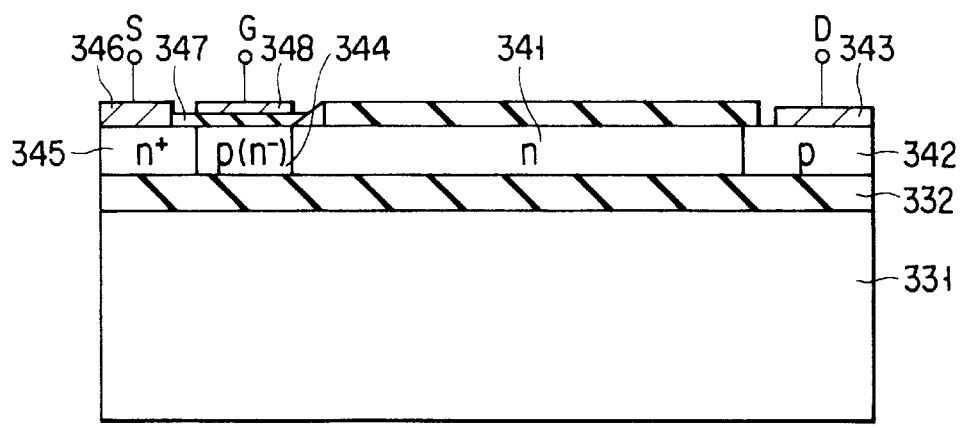
FIG. 84 is a cross sectional view showing an IGBT according to a forty-third embodiment of the present invention.

FIG. 84 is a cross sectional view showing the structure of the IGBT according to this embodiment. The IGBT according to this embodiment has the polycrystalline silicon substrate according to the forty-second embodiment and structured such that the oxide film 332 and an n-type base region 341 made of polycrystalline silicon are sequentially formed on the polycrystalline silicon substrate 331.

Specifically, the n-type base region 341 is formed such that the CVD method is employed to form amorphous silicon having a thickness of 0.1 µm on the oxide film 332 and amorphous silicon above is annealed at 600° C. for 20 hours so that the crystalline grains are enlarged.

As described above, annealing at 1300° C. or higher and annealing in a hot and high concentration oxygen atmosphere are performed.

In the n-type base region 341, a p-type drain region 342 is selectively formed from the surface of an n-type base region 341 to reach the oxide film 332. On the p-type drain region 342, there is formed a drain electrode 343.

Similarly, in the n-type base region 341, a p (or n-) type base region 344 is selectively formed from the surface of the n-type base region 341 to reach the oxide film 332. In the p-type base region 344, an n⁺ source region 345 is selectively formed from the surface of the p-type base region 344 to reach the oxide film 332.

Moreover, a common source electrode 346 is selectively formed on a portion (not shown) of the p-type base region 344 and the n⁺ source region 345.

A gate insulating film 347 is formed on a portion of the p-type base region 344, a portion of the n⁺ source region 345 formed on the two sides of the p-type base region 344 and a portion of the n-type base region 341. A gate electrode 348 is formed on the gate insulating film 347.

Even if the above-mentioned IGBT is formed, use of the polycrystalline silicon substrate according to the forty-second embodiment enables the ON-state resistance to be weakened thanks to the excellent crystallinity. Moreover, the oxide film 332, which has been finally thickened, improves the insulating characteristic from the other devices. Thus, the reliability can be improved.

Forty-Fourth Embodiment

A biCMOS (Bipolar Complementary Metal Oxide Semiconductor) having the polycrystalline silicon substrate according to a forty-fourth embodiment of the present invention will now be described.

Figure 85:
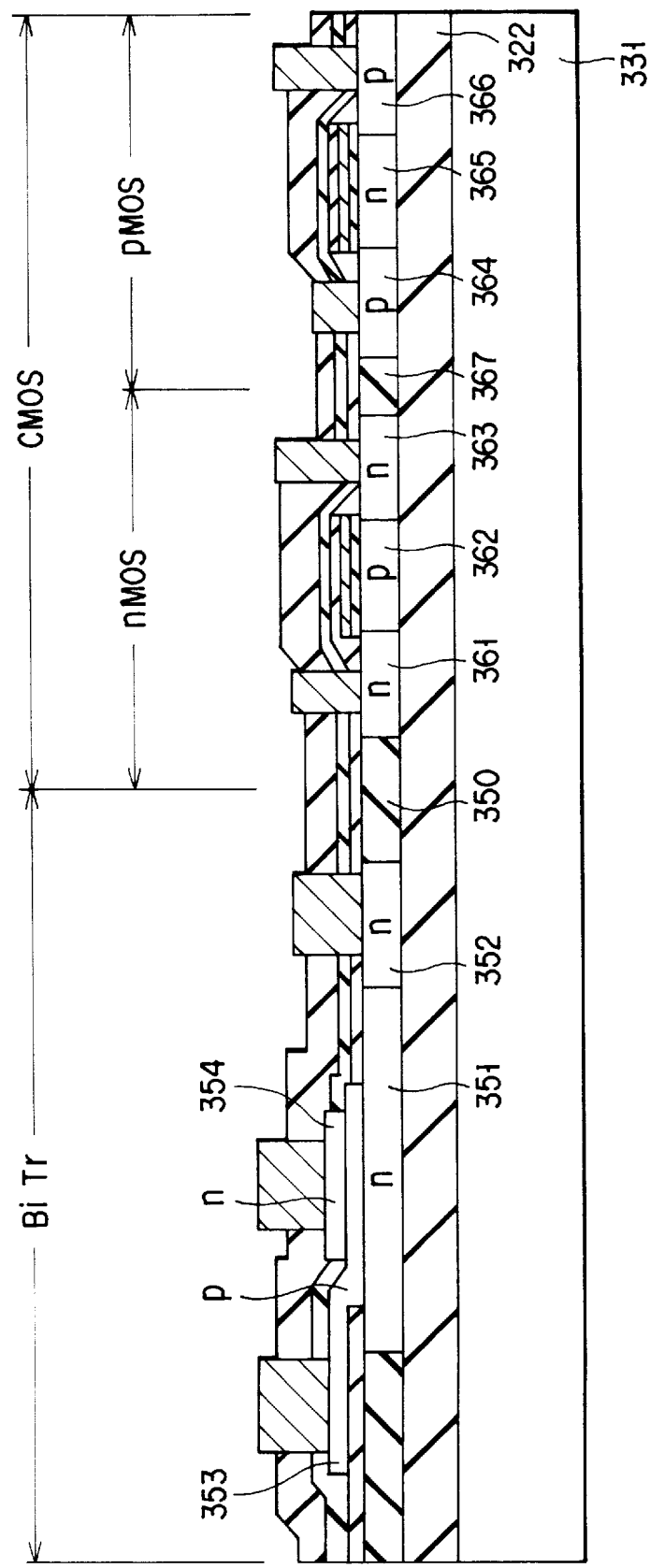
FIG. 85 is a cross sectional view showing a BiCMOS according to a forty-fourth embodiment of the present invention.

FIG. 85 is a cross sectional view showing the structure of the biCMOS according to this embodiment. The biCMOS according to this embodiment comprises the polycrystalline silicon substrate according to the forty-second embodiment. Specifically, the biCMOS is composed of a bipolar transistor and a CMOS, as shown in FIG. 85. The bipolar transistor and the CMOS are formed in parallel on the embedded oxide film 332 through a device isolation insulating film 350.

The bipolar transistor has an n⁻ collector region 351 and an n-type collector region 352 selectively formed on the embedded oxide film 332, a p-type base region 353 formed on the n⁻ collector region 351 and an n-type drain region 354 formed on the p-type base region 353.

The CMOS has an nMOS (n-channel MOS) consisting of an n-type source region 361, a p-type channel region 362 and an n-type drain region 363 selectively formed on the embedded oxide film 332; a pMOS (p-channel MOS) consisting of a p-type source region 364, an n-type channel region 365n and a p-type drain region 366; and a device isolation insulating film 367 for isolating the foregoing nMOS and the pMOS from each other.

Even if the above-mentioned biCMOS is formed, the excellent crystallinity of the polycrystalline silicon substrate according to the forty-second embodiment improves the characteristic of, for example, the bipolar transistor. Moreover, the oxide film, which has been finally thickened, improves the insulating characteristic from the other device. Thus, the reliability can be improved.

Another Embodiment

The forty-second embodiment has the structure such that oxidation performed in the hot and high-concentration oxygen atmosphere causes the oxide film to be thickened to improve the voltage resistance. The present invention is not limited to the foregoing structure. The above-mentioned oxidation process in the hot and high-concentration oxygen atmosphere may be omitted in a case where a device having a poor voltage resistance is manufactured as required to obtain a similar effect by applying the contrivance of the present invention.

Although the forty-second embodiment has the structure such that usual annealing at 600° C. is performed to form the amorphous silicon layer 333a into the polycrystalline silicon layer 333; and then annealing is performed at 1300° C. or higher, the present invention is not limited to this. The usual annealing process at 600° C. may be omitted and the amorphous silicon layer 333a may be annealed at 1300° C. or higher to form the polycrystalline silicon layer 333. The present invention may be applied to obtain a similar effect by appropriately determining the conditions including the temperature rising rate.

Although the forty-third and forty-fourth embodiments have been described in which the polycrystalline silicon substrate according to the present invention is employed to form the device such as the IGBT or the BiCMOS, another arbitrary device may be formed. Even if another arbitrary device is formed, the present invention may similarly be applied and a similar effect can be obtained. Moreover, the various characteristics of the formed device can be improved.

Another Embodiment

All of the above-mentioned embodiments have the structure such that the first conducting type is the n-type and the second conducting type is the p-type. However, the present invention is not limited to this. For example, the first conducting type may be p-type and the second conducting type may be n-type to attain a similar effect by applying the present invention.

Forty-Fifth Embodiment

The foregoing embodiments have been mainly described to have the lateral device on the vertical power device or only the lateral device. A forty-fifth embodiment has an arrangement having an effective terminal structure for use in a combination of a vertical power device and a lateral device formed on the vertical power device. The terminal structure is arranged such that a vertical power device for a great electric power is surrounded by a guard ring layer and a lateral device is disposed over the guard ring layer through an insulating film. The terminal structure causes the distribution of same potential lines to be uniformed in both the vertical device and the lateral device. Thus, an advantage can be realized in that the concentration of electric fields can be prevented. The structure will now be described.

Figure 86:
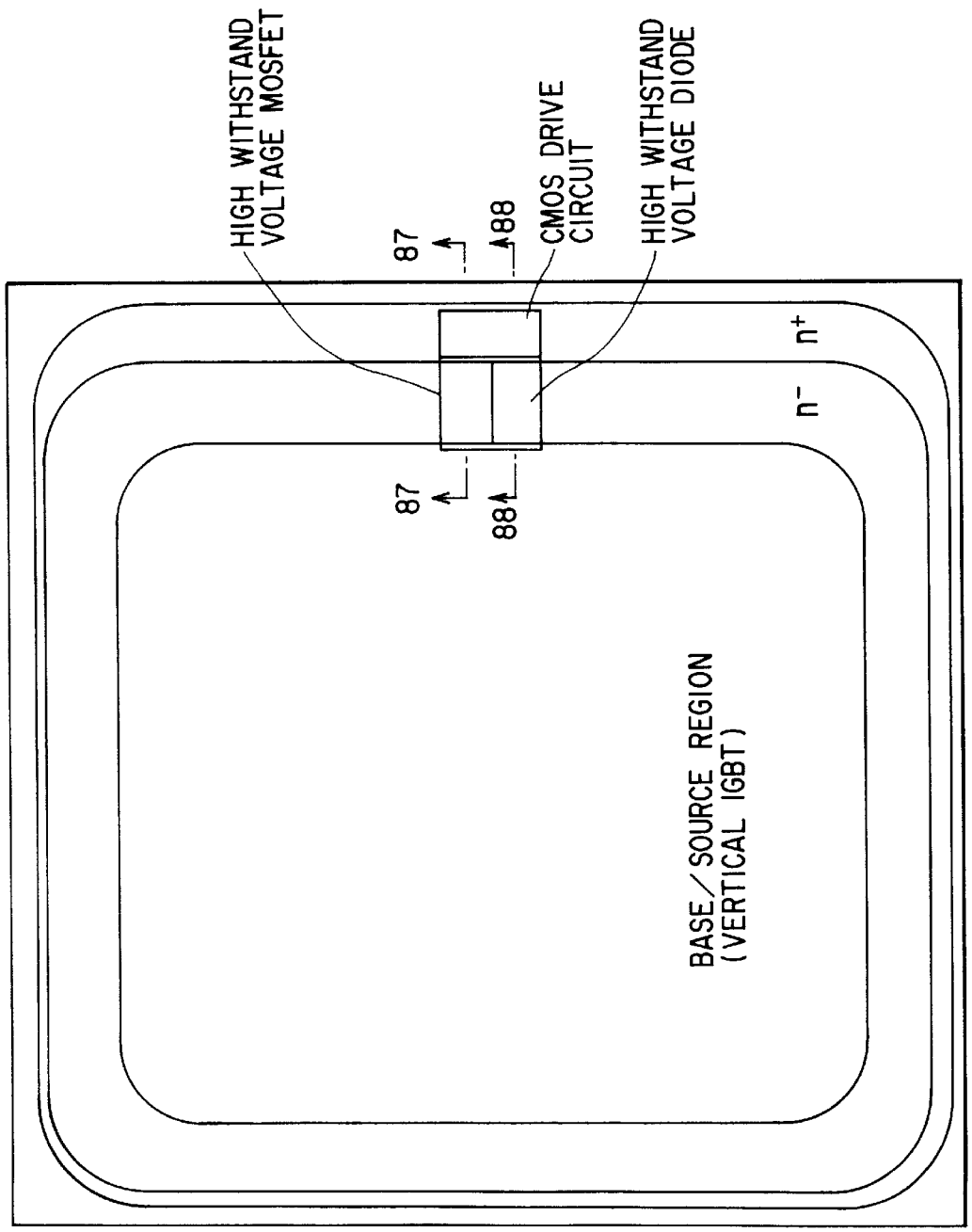
FIG. 86 is a plan view showing a semiconductor apparatus according to a forty-fifth embodiment of the present invention.
Figure 88:
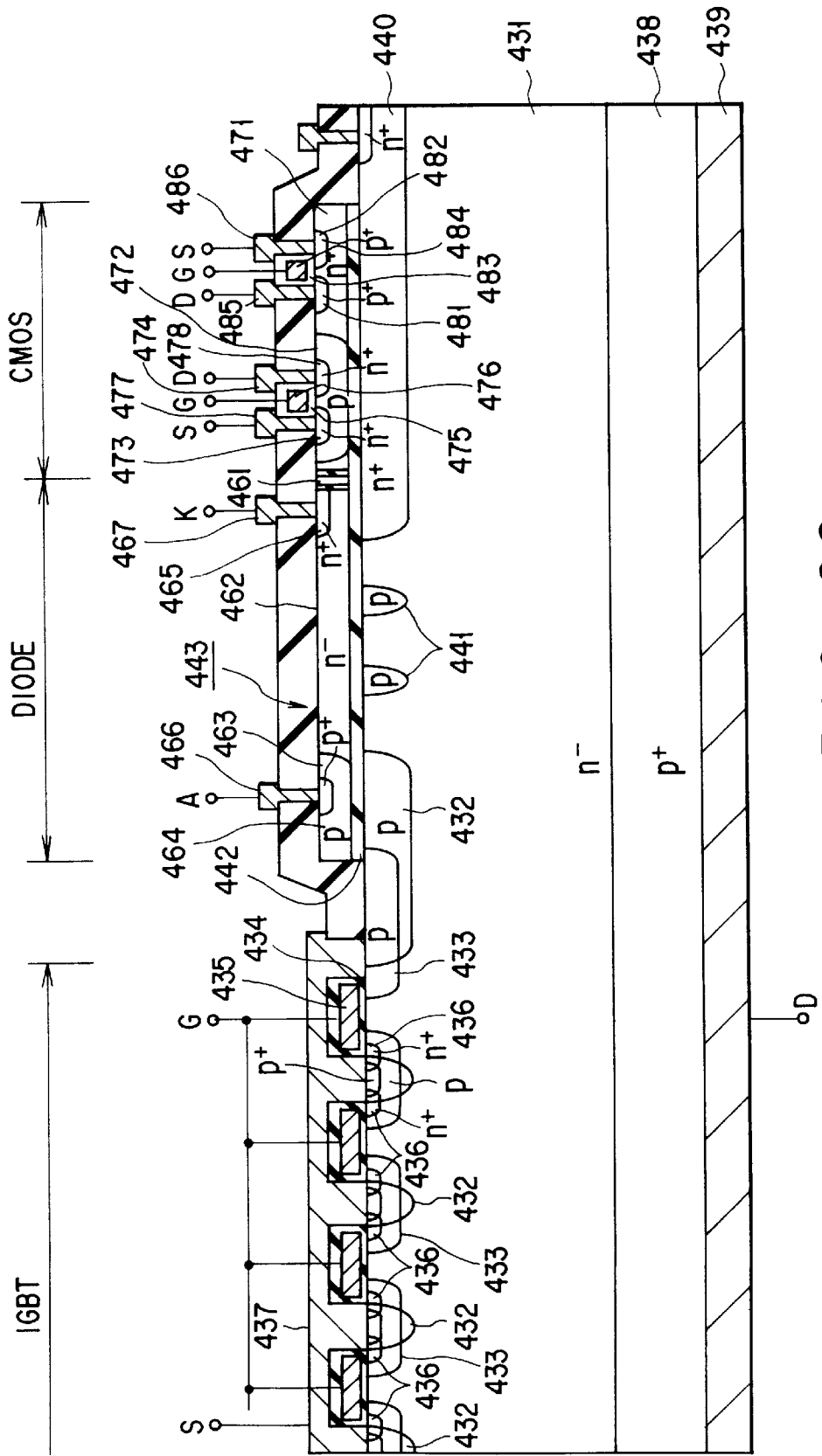
FIG. 88 is a cross sectional view taken along line 88—88 shown in FIG. 86.

FIG. 86 is a plan view of a semiconductor apparatus according to the forty-fifth embodiment of the present invention. FIG. 87 is a cross sectional view taken along line 87—87 shown in FIG. 86. FIG. 88 is a cross sectional view taken along line 88—88 shown in FIG. 86.

The semiconductor apparatus according to this embodiment has a vertical IGBT formed in the central region of the substrate and lateral appendix circuits formed in the peripheral region of the substrate and including a high voltage MOSFET, a high voltage diode and a CMOS.

The IGBT has a structure such that a p-type base layer 432 and a p-type well layer 433 are selectively formed on the surface of a high-resistance n⁻ base layer 431. A gate electrode 435 is, through an insulating film 434, formed on the n⁻ base layer 431 surrounded by the p-type base layer 432 and the p-type well layer 433 and exposed to outside. An n⁺ source layer 436 is selectively formed on the surfaces o the p-type base layer 432 and the p-type well layer 433. A common source electrode 437 is, in ohmic-contact with the n⁺ source layer 436 and the p-type base layer 432, formed on the n⁺ source layer 436 and the p-type base layer 432.

A dense p⁺ drain layer 438 is formed on the n⁻ base layer 431 opposite to the p-type base layer 432. A drain electrode 439 is formed on the p⁺ drain layer 438 to be in ohmic contact with the p⁺ drain layer 438.

In a region surrounding the vertical IGBT, a dense n⁺ layer 440 is formed around the p-type base layer 432 apart from the p-type base layer 432 for a predetermined distance.

Two p-type guard ring layers 441 are selectively formed on the surface of the n⁻ base layer 431 surrounded by the p-type base layer 432 and the n⁺ layer 440. A high-resistance semiconductor layer 443 made of polycrystalline silicon is, through a common insulating film 442, formed on a region from the p-type base layer 432 to reach the n⁺ layer 440 through the n⁻ base layer 431 and each guard ring layer 441. The high-resistance semiconductor layer 443 has the high voltage MOSFET, the high voltage diode and the CMOS.

As shown in FIG. 87, the high voltage MOSFET has a structure such that a p-type base layer 452 disposed above the p-type base layer 432 of the IGBT is, in the n⁻ drift layer 451, which is the high-resistance semiconductor layer, formed to reach the insulating film. An n⁺ source layer 453 and a p⁺ layer 454 are selectively formed on the surface of the p-type base layer 452.

On the other hand, an n⁺ drain layer 455 is selectively formed above the n⁺ layer 440 in the periphery of the substrate, the n⁺ drain layer 455 being formed on the surface of the n⁻ drift layer 451. A gate electrode 457 is, through an insulating film 456, formed on a region from a portion of the n⁺ source layer 453 to reach the n⁻ drift layer 451 through the p-type base layer 452.

A p-type base electrode 458 is provided for the p⁺ layer 454. A source electrode 459 is provided for the n⁺ source layer 453. A drain electrode 460 is provided for the n⁺ drain layer 455.

The length of the n⁻ drift layer 451 between the p-type base layer 452 and the n⁺ drain layer 455 is made to be substantially the same as the distance of the n⁻ base layer 431 between the p-type base layer 432 and the n⁺ layer 440 of the main IGBT. The foregoing MOSFET has a trench 461 in the periphery thereof so that the devices are isolated.

As shown in FIG. 88, the high voltage diode has a structure such that a p-type anode layer 463 disposed above the p-type base layer 432 of the IGBT is, in the n⁻ drift layer 462, which is the high-resistance semiconductor layer 443, formed to reach the insulating film 442. A p⁺ layer 464 is selectively formed on the surface of the p-type anode layer 463.

On the other hand, an n⁺ cathode layer 465 is selectively formed above the n⁺ layer 440 in the periphery of the substrate, the n⁺ cathode layer 465 being formed on the surface of the n⁻ drift layer 462.

An anode electrode 466 is provided for the p⁺ layer 464. A cathode electrode 467 is provided for the n⁺ cathode layer 465.

The length of the n⁻ drift layer 462 between the p-type anode layer 463 and the n⁺ cathode layer 465 is made to be substantially the same as the distance of the n⁻ base layer 431 between the p-type base layer 432 and the n⁺ layer 440 of the main IGBT. The foregoing high voltage diode has a trench 461 in the periphery thereof so that the devices are isolated.

The CMOS is formed on the insulating film 442 above the n⁺ layer 440 in the periphery of the substrate. Note that the n⁺ layer 440 in the lower portion of the CMOS is formed outer than each p-type guard ring layer 441, the n⁺ layer 440 being a substantially same potential region. The CMOS has a p-type layer 472 in an n⁻ layer 471 serving as the high-resistance semiconductor layer 443 on the insulating film 442, the p-type layer 472 having a depth to reach the insulating film 442.

An n⁺ source layer 473 and an n⁺ drain layer 474 are selectively formed on the surface of the p-type layer 472. A gate electrode 476 is, through an insulating film 475, formed on a region from a portion of the n⁺ source layer 473 to reach the n⁺ drain layer 474 through the p-type layer 472. A source electrode 477 is provided for the n⁺ source layer 473. A drain electrode 478 is provided for the n⁺ drain layer 474. The structure relating to the p-type layer 472 is the nMOS.

Similarly, the pMOS has a structure such that a p⁺ source layer 481 and a p⁺ drain layer 482 are selectively formed on the surface of the n⁻ layer 471. A gate electrode 484 is, through an insulating film 483, formed on a region from a portion of the p⁺ source layer 481 to reach the p⁺ drain layer 482 through the p-type layer 471. A source electrode 485 is provided for the p⁺ source layer 481. A drain electrode 486 is provided for the p⁺ drain layer 482. The structure relating to the n⁻ layer 471 is the pMOS.

The process for manufacturing the semiconductor apparatus will now be described with reference to FIGS. 89A to 89H. The same elements as those of the above-mentioned structure are provided with appendix a.

As shown in FIG. 89A, the p⁺ emitter layer 438 is formed on either side of the n⁻ base layer 431 which is the n-type substrate. The n⁺ layer 440, the p-type base layer 432 and the p-type guard ring layer 441 are selectively formed on the other side of the n⁻ base layer 431. Then, an oxide film 442a having a thickness of about 1 μm is formed on the overall surface of the n⁻ base layer 431 opposite to the p⁺ emitter layer 438.

Then, as shown in FIG. 89B, an n⁻ layer 443a having a thickness of about 2 μm is formed on the oxide film 442a. The n⁻ layer 443a can easily be formed by a silicon direct joining technique, a polycrystalline silicon deposition technique or a technique for forming polycrystalline silicon from amorphous silicon. An oxide film is formed on the surface of the n⁻ layer 443a, the oxide film being selectively removed by etching.

Figure 89C:
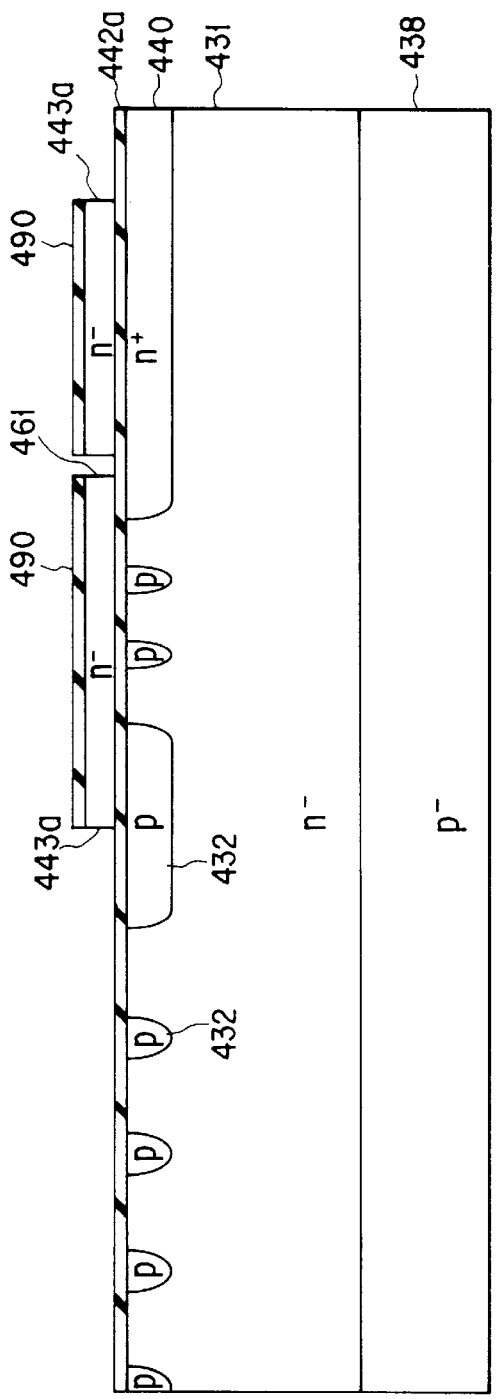

As shown in FIG. 89C, the residual oxide film 490 is used as a mask to remove the n⁻ layer 443a and the oxide film 490 on the region which is formed into the source, gate and the p-type base layer 432 of the IGBT. At this time, the trench 461 in the periphery of the high voltage MOSFET and the high voltage diode is simultaneously formed.

Figure 89D:
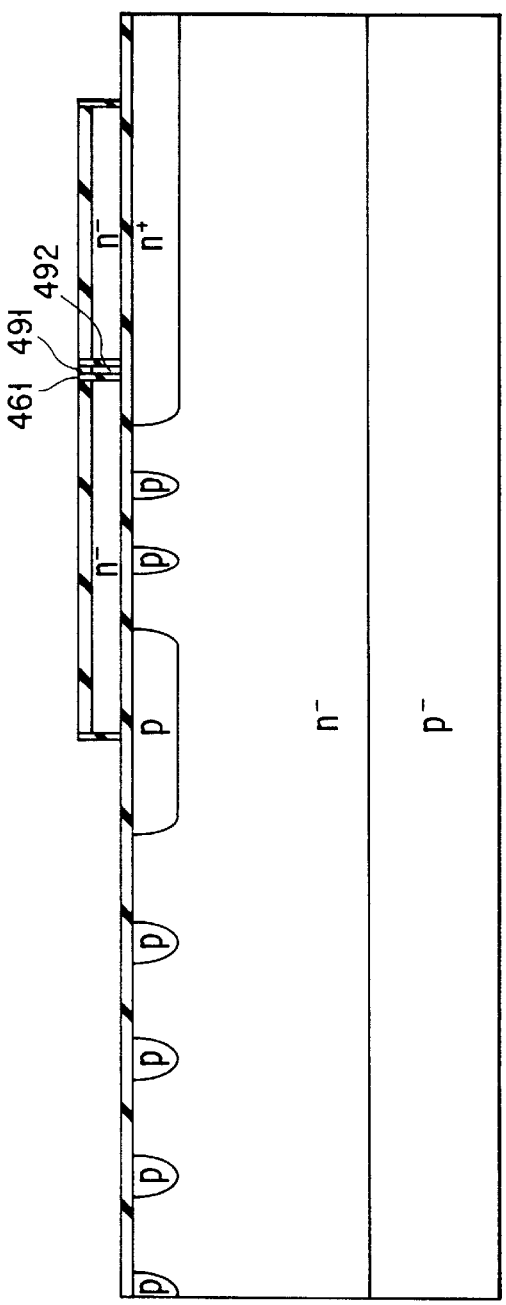

As shown in FIG. 89D, an oxide film 491 is formed on the side wall of the trench 461. The trench is embedded by the deposition of polycrystalline silicon 492. As shown in FIG. 89E, the polycrystalline silicon and the oxide film 490 on the surface are removed so that p-type well layers 433, 452 and 472 for respective devices are formed. Then, as shown in FIG. 89F, the oxide film 434a which is formed into the gate insulating films 434, 456, 475 and 483 and gate electrodes 435, 357, 476 and 484 made of the polycrystalline silicon are sequentially formed.

Then, as shown in FIG. 89G, each n⁺ layer is formed by ion implantation and diffusion. That is, the n⁺ source layer 436 of the IGBT, the n⁺ source layer 436 and the n⁺ drain layer 455 of the high voltage MOSFET, the n⁺ cathode layer 465 of the high voltage diode, the n⁺ source layer 473, the n⁺ drain layer 474 and the outermost n⁺ layer 493 of the nMOS of the CMOS are formed. Moreover, each p⁺ layer is formed by ion implantation and diffusion. That is, the p⁺ base contact layer 494 of the IGBT, the p⁺ layer 464 serving as the anode contact layer of the high voltage diode and p⁺ source layer 481 and the p⁺ drain layer 482 of the pMOS of the CMOS are formed.

As shown in FIG. 89H (or FIG. 87 and FIG. 88), the oxide film 495, a contact hole and each electrode 437, 458 to 460, 466 and 467, 477 and 478 and 485 to 486 are formed so that a semiconductor apparatus is manufactured.

Figure 90:
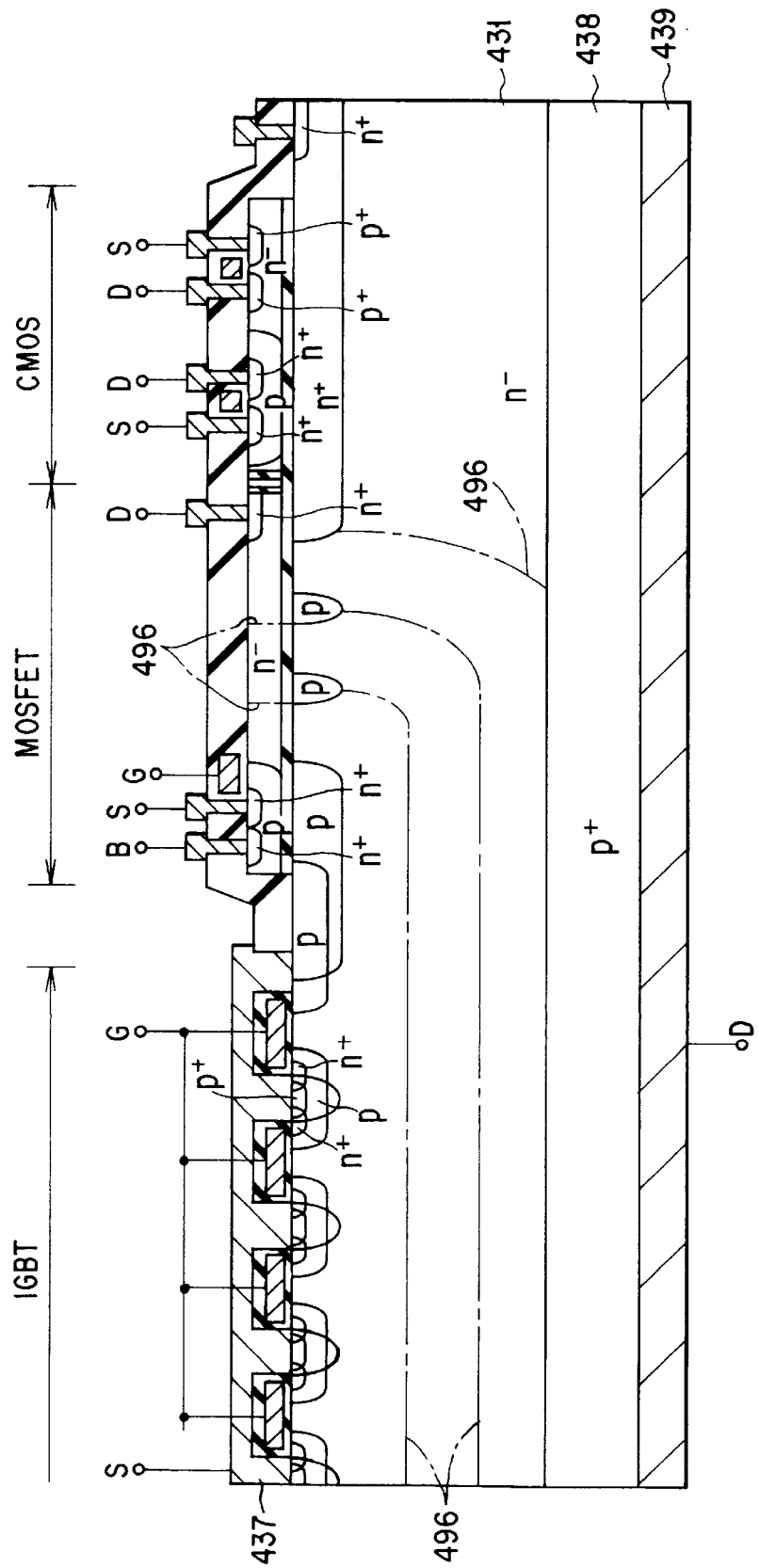
FIGS. 90 and 91 are graphs showing distribution of same potential lines according to the forty-fifth embodiment.
Figure 91:
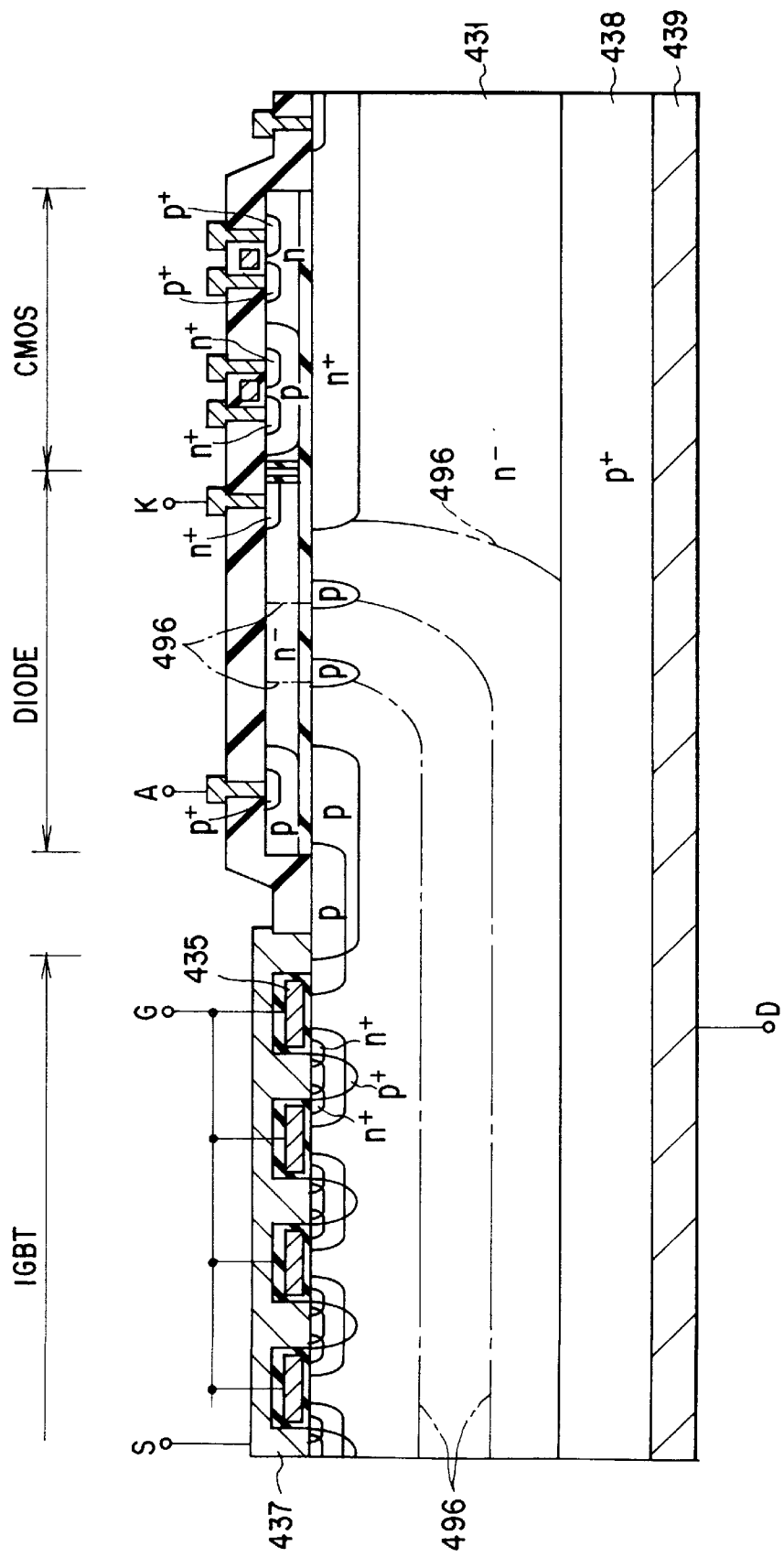

In the thus-manufactured semiconductor apparatus, when positive voltage is applied to the drain electrode 439 and negative voltage is applied to the source electrode 437 of the IGBT, a depletion layer is expanded in the n⁻ base layer 431. A same potential line 496 is uniformly formed in the n⁻ base layer 431 in the periphery of the IGBT by the effect of the p-type guard ring layer 441, as shown in FIGS. 90 and 91. The same potential line 496 is as well as formed in the n⁻ drift layers 451 and 462 of the high voltage MOSFET and the high voltage diode so that uniform potential distribution is realized in the n⁻ drift layers 451 and 462. Thus, concentration of electric fields is prevented in the n⁻ drift layers 451 and 462. Therefore, even if the active layer is thin, high voltage resistance can be realized. As a result, a high voltage MOSFET and a high voltage diode can be formed. Thus, drive circuits for the upper devices can be integrated on the lower IGBT.

Figure 2:
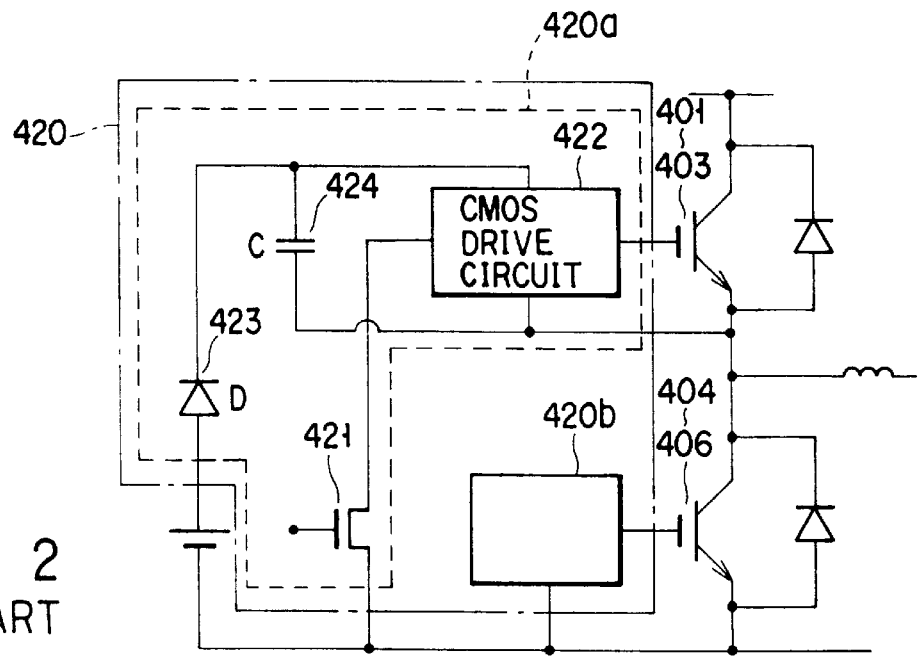
Figure 3:
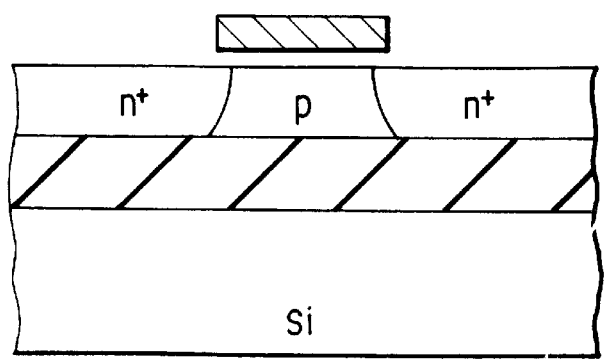
FIG. 3 is a cross sectional view showing a conventional MOSFET using a SOI substrate.
Figure 4A:
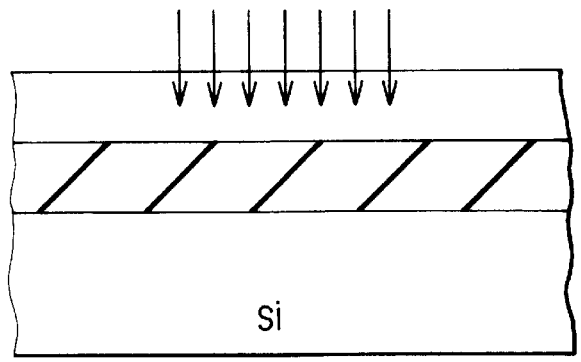
FIG. 4A is a schematic view showing a step for implanting ions into the conventional polycrystalline silicon layer.
Figure 4B:
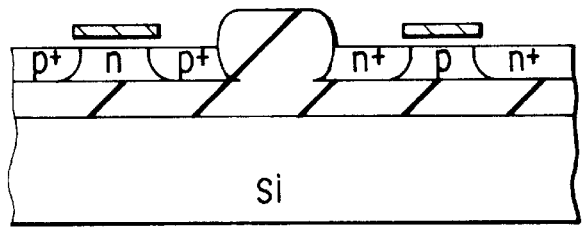
FIG. 4B is a cross sectional view showing a CMOS formed by allowing conventional amorphous silicon to grow to polycrystalline silicon.
Figure 5A:
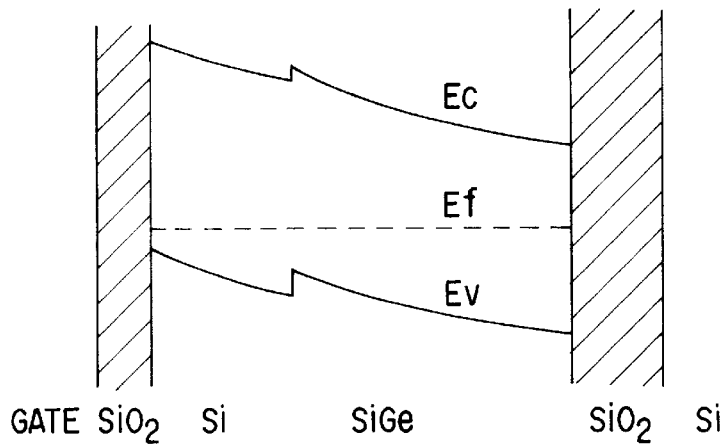
FIG. 5A is a graph showing an energy band of a conventional p-channel thin film transistor.
Figure 5B:
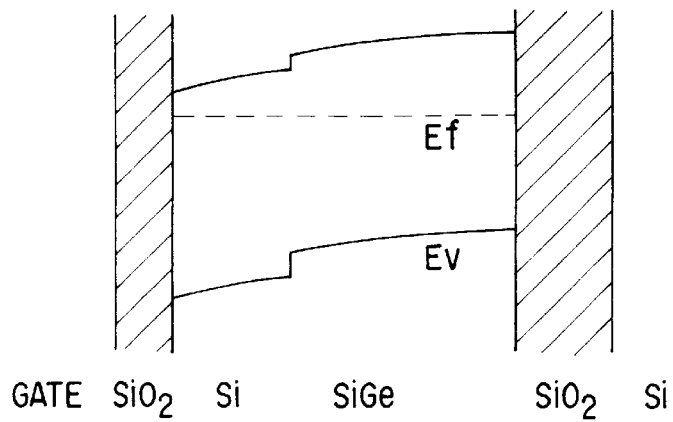
FIG. 5B is a graph showing an energy band of a conventional n-channel thin film transistor.
Figure 6:
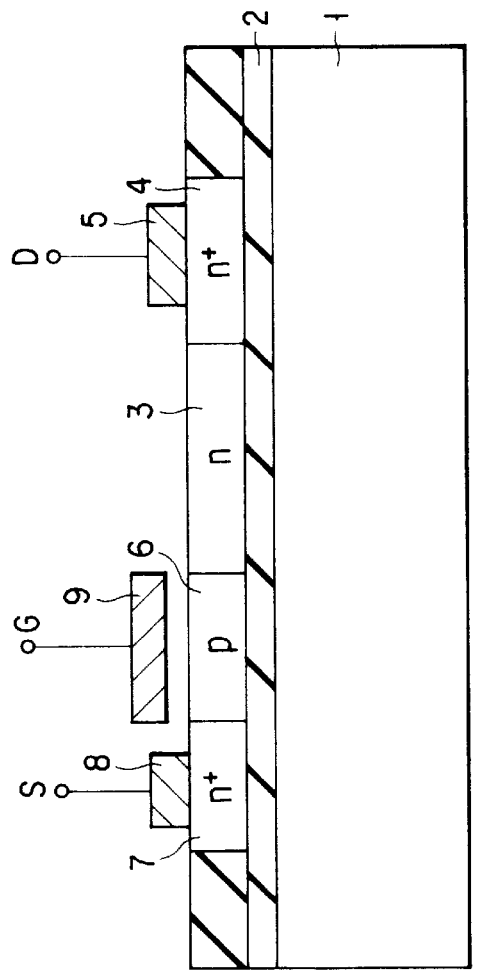
FIG. 6 is a cross sectional view showing a conventional high voltage MOSFET.

That is, the high voltage MOSFET 421, the CMOS drive circuit 422 and the high voltage diode 423 serving as the drive circuits 420a and 420b can be integrated on the IGBT 401 to IGBT 406 (or on the MOSFET) of the inverter unit shown in FIGS. 1 and 2. The number of elements can be decreased so that a low-cost inverter unit is provided.

The forty-fifth embodiment of the present invention has the above-mentioned structure. The present invention is not limited to the foregoing embodiments. For example, the high voltage semiconductor layer which is formed on the surface of the terminal region of the junction through the insulating film may be made of single crystalline silicon. Since this embodiment is characterized by the terminal structure, the vertical device and the lateral device may arbitrarily be changed. For example, the lateral device may be any one of the devices according to the second to forty-first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor apparatus having a vertical type semiconductor device and a lateral type semiconductor device, wherein said method includes, fabricating said vertical type semiconductor device on a first conducting type semiconductor substrate by steps comprising, forming a drain layer on a first surface of said first conductive type semiconductor substrate, selectively forming a second conducting type base layer in a second surface of said semiconductor substrate opposite to said drain layer, forming a first gate insulating film using a thermal process in contact with said second conducting type base layer and a portion of said first conducting type semiconductor substrate, forming a first gate electrode via said first gate insulating film opposite to said second conducting type base layer and said portion of said first conducting type semiconductor substrate by doping an impurity, selectively forming a first conducting type source layer in the surface of said second conducting type base layer, forming a first source electrode over said first conducting type source layer and a portion of said second conducting type base layer, and forming a first drain electrode over an outer surface of said drain layer; and fabricating said lateral type semiconducting device by steps comprising, forming an insulating layer in a region of said second surface of said first conducting type semiconductor substrate, forming a polycrystalline semiconductor layer on said insulating layer, forming a second gate insulating film on said polycrystalline semiconductor layer using the same thermal process as that for said first gate insulating film, and selectively forming a second gate electrode over said second gate insulating film on said polycrystalline semiconductor layer using the same doping steps as that used for doping said first gate electrode.

2. The method according to claim 1, further including forming said first gate insulating film with a thickness of 600 Å or less.

3. The method according to claim 1, further including forming said first gate insulating film with a thickness of 300 Å or less.

4. The method according to claim 1, further comprising the steps of:

forming a second conducting type contact layer in the surface of said second conducting type base layer, which has a carrier density higher than that of said second conducting type base layer using doping of an impurity, and forming a second conducting type region in said polycrystalline semiconductor layer using the same doping process as that for doping said second conducting type contact layer.

5. The method according to claim 1, further comprising the steps of:

forming a second conductivity type base region in said polycrystalline semiconductor layer, selectively forming a first conductivity type drain region in said second conductivity type base region, forming a second drain electrode over said first conductivity type drain region, selectively forming a first conductivity type source region in said polycrystalline semiconductor layer in such a manner that said first conductivity type source region is separated from said first conductivity type drain region by said second conductivity type base region, and forming a second source electrode over said first conductivity type source region.

6. The method according to claim 5, further including forming said first conducting type source layer of said vertical semiconductor device and said first conductivity type source region of said lateral semiconductor device by simultaneously doping an impurity.

* * * * *